(12) United States Patent
Crisp et al.

(10) Patent No.: US 10,643,977 B2
(45) Date of Patent: May 5, 2020

(54) MICROELECTRONIC PACKAGE HAVING STUB MINIMIZATION USING SYMMETRICALLY-POSITIONED DUPLICATE SETS OF TERMINALS FOR WIREBOND ASSEMBLIES WITHOUT WINDOWS

(71) Applicant: Invensas Corporation, San Jose, CA (US)

(72) Inventors: Richard Dewitt Crisp, Hornitos, CA (US); Wael Zohni, Campbell, CA (US); Belgacem Haba, Saratoga, CA (US); Frank Lambrecht, Mountain View, CA (US)

(73) Assignee: Invensas Corporation, San Jose, CA (US)

( * ) Notice: Subject to any disclaimer, the term of this patent is extended or adjusted under 35 U.S.C. 154(b) by 24 days.

(21) Appl. No.: 16/037,453

(22) Filed: Jul. 17, 2018

(65) Prior Publication Data
US 2018/0331074 A1 Nov. 15, 2018

Related U.S. Application Data

(63) Continuation of application No. 15/348,238, filed on Nov. 10, 2016, now Pat. No. 10,032,752, which is a
(Continued)

(51) Int. Cl.
*H01L 25/065* (2006.01)
*G11C 5/04* (2006.01)
(Continued)

(52) U.S. Cl.
CPC .......... *H01L 25/0657* (2013.01); *G11C 5/04* (2013.01); *G11C 5/063* (2013.01); *G11C 5/066* (2013.01);
(Continued)

(58) Field of Classification Search
CPC .......... H01L 25/0657; H01L 25/072; H01L 25/0753; H01L 23/3128; H01L 23/481;
(Continued)

(56) References Cited

U.S. PATENT DOCUMENTS 3,670,208 A  6/1972  Hovnanian et al.
4,599,634 A  7/1986  Culmer et al.
(Continued)

FOREIGN PATENT DOCUMENTS

CN  1477688 A  2/2004
CN  101149964 A  3/2008
(Continued)

OTHER PUBLICATIONS

Chinese Office Action for Application No. 201280044481.5 dated Dec. 25, 2015.
(Continued)

*Primary Examiner* — Michael Jung
(74) *Attorney, Agent, or Firm* — Lerner, David, Littenberg, Krumholz & Mentlik, LLP

(57) ABSTRACT

A microelectronic assembly can include a microelectronic package connected with a circuit panel. The package has a microelectronic element having a front face facing away from a substrate of the package, and electrically connected with the substrate through conductive structure extending above the front face. First terminals provided in first and second parallel grids or in first and second individual columns can be configured to carry address information usable to determine an addressable memory location from among all the available addressable memory locations of the memory storage array. The first terminals in the first grid can have signal assignments which are a mirror image of the signal assignments of the first terminals in the second grid.

20 Claims, 24 Drawing Sheets

Related U.S. Application Data continuation of application No. 15/069,131, filed on Mar. 14, 2016, now Pat. No. 9,496,243, which is a continuation of application No. 14/186,380, filed on Feb. 21, 2014, now Pat. No. 9,287,195, which is a continuation of application No. 13/440,280, filed on Apr. 5, 2012, now Pat. No. 8,659,141.

(60) Provisional application No. 61/600,527, filed on Feb. 17, 2012, provisional application No. 61/542,488, filed on Oct. 3, 2011, provisional application No. 61/542,553, filed on Oct. 3, 2011, provisional application No. 61/542,495, filed on Oct. 3, 2011.

(51) Int. Cl.
*G11C 5/06* (2006.01)
*H01L 23/00* (2006.01)
*H01L 23/13* (2006.01)
*H01L 23/498* (2006.01)
*H01L 23/50* (2006.01)
*H01L 23/48* (2006.01)
*G11C 8/18* (2006.01)
*H01L 23/02* (2006.01)

(52) U.S. Cl.
CPC .............. *G11C 8/18* (2013.01); *H01L 23/02* (2013.01); *H01L 23/13* (2013.01); *H01L 23/48* (2013.01); *H01L 23/49838* (2013.01); *H01L 23/50* (2013.01); *H01L 24/49* (2013.01); *H01L 24/97* (2013.01); *H01L 25/0655* (2013.01); *H01L 24/16* (2013.01); *H01L 24/32* (2013.01); *H01L 24/48* (2013.01); *H01L 24/73* (2013.01); *H01L 2224/16145* (2013.01); *H01L 2224/16225* (2013.01); *H01L 2224/2919* (2013.01); *H01L 2224/32145* (2013.01); *H01L 2224/32225* (2013.01); *H01L 2224/45099* (2013.01); *H01L 2224/4824* (2013.01); *H01L 2224/48145* (2013.01); *H01L 2224/48227* (2013.01); *H01L 2224/49113* (2013.01); *H01L 2224/73204* (2013.01); *H01L 2224/73207* (2013.01); *H01L 2224/73215* (2013.01); *H01L 2224/73265* (2013.01); *H01L 2224/97* (2013.01); *H01L 2225/0651* (2013.01); *H01L 2225/0652* (2013.01); *H01L 2225/06506* (2013.01); *H01L 2225/06513* (2013.01); *H01L 2225/06517* (2013.01); *H01L 2225/06541* (2013.01); *H01L 2225/06548* (2013.01); *H01L 2225/06562* (2013.01); *H01L 2225/06572* (2013.01); *H01L 2225/06589* (2013.01); *H01L 2225/107* (2013.01); *H01L 2924/00014* (2013.01); *H01L 2924/01322* (2013.01); *H01L 2924/15311* (2013.01); *H01L 2924/181* (2013.01); *H01L 2924/18161* (2013.01); *H01L 2924/3011* (2013.01)

(58) Field of Classification Search
CPC ... H01L 23/49816; H01L 23/02; H01L 23/13; H01L 24/49; H01L 23/49838; H01L 23/50; H01L 25/0655; H01L 23/48; G11C 5/066; G11C 8/18
See application file for complete search history.

(56) References Cited

U.S. PATENT DOCUMENTS

| | | |
|---|---|---|
| 4,747,081 A | 5/1988 | Heilveil et al. |
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |
| 5,679,977 A | 10/1997 | Khandros et al. |
| 5,691,570 A | 11/1997 | Kozuka |
| 5,751,553 A | 5/1998 | Clayton |
| 5,777,391 A | 7/1998 | Nakamura et al. |
| 5,821,614 A | 10/1998 | Hashimoto et al. |
| 5,899,705 A | 5/1999 | Akram |
| 5,929,517 A | 7/1999 | Distefano et al. |
| 5,936,305 A | 8/1999 | Akram |
| 5,949,700 A | 9/1999 | Furukawa et al. |
| 5,973,403 A | 10/1999 | Wark |
| 6,086,386 A | 7/2000 | Fjelstad et al. |
| 6,125,419 A | 9/2000 | Umemura et al. |
| 6,130,116 A | 10/2000 | Smith et al. |
| 6,159,837 A | 12/2000 | Yamaji et al. |
| 6,177,636 B1 | 1/2001 | Fjelstad |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,313,532 B1 | 11/2001 | Shimoishizaka et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,414,381 B1 | 7/2002 | Takeda |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,461,895 B1 | 10/2002 | Liang et al. |
| 6,462,423 B1 | 10/2002 | Akram et al. |
| 6,518,794 B2 | 2/2003 | Coteus et al. |
| 6,521,981 B2 | 2/2003 | Miyazaki et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,628,528 B2 | 9/2003 | Schoenborn |
| 6,633,078 B2 | 10/2003 | Hamaguchi et al. |
| 6,658,530 B1 | 12/2003 | Robertson et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,927,992 B1 | 8/2005 | Yen |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,074,696 B1 | 7/2006 | Frankowsky et al. |
| 7,084,515 B2 | 8/2006 | Fuller et al. |
| 7,091,064 B2 | 8/2006 | Jiang |
| 7,122,897 B2 | 10/2006 | Aiba et al. |
| 7,123,497 B2 | 10/2006 | Matsui et al. |
| 7,138,709 B2 | 11/2006 | Kumamoto |
| 7,139,183 B2 | 11/2006 | Taussig et al. |
| 7,141,879 B2 | 11/2006 | Wakamiya et al. |
| 7,145,226 B2 | 12/2006 | Kumamoto |
| 7,151,319 B2 | 12/2006 | Iida et al. |

(56) References Cited

U.S. PATENT DOCUMENTS

| | | |
|---|---|---|
| 7,164,149 B2 | 1/2007 | Matsubara |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,420,284 B2 | 9/2008 | Miyazaki et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,278 B2 | 4/2010 | Periaman et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,793,043 B2 | 9/2010 | Blakely et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 | 3/2012 | Joseph et al. |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,426,983 B2 | 4/2013 | Takeda et al. |
| 8,432,046 B2 | 4/2013 | Miyata et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,654,663 B2 | 2/2014 | Prasad et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,723,329 B1 | 5/2014 | Crisp et al. |
| 8,823,165 B2 | 9/2014 | Haba et al. |
| 8,902,680 B2 | 12/2014 | Yamamoto |
| 8,917,532 B2 | 12/2014 | Crisp et al. |
| 8,981,547 B2 | 3/2015 | Crisp et al. |
| 9,432,298 B1 | 8/2016 | Smith |
| 9,484,080 B1 | 11/2016 | Sun et al. |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0027019 A1 | 10/2001 | Ishii et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0043719 A1 | 4/2002 | Iwaya et al. |
| 2002/0053727 A1 | 5/2002 | Kimura |
| 2002/0053732 A1 | 5/2002 | Iwaya et al. |
| 2002/0062430 A1 | 5/2002 | Brox et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2002/0180025 A1 | 12/2002 | Miyata et al. |
| 2003/0064547 A1 | 4/2003 | Akram et al. |
| 2003/0085465 A1 | 5/2003 | Kajimoto et al. |
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0168748 A1 | 9/2003 | Katagiri et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0084538 A1 | 5/2004 | Nishizawa et al. |
| 2004/0090756 A1 | 5/2004 | Ho et al. |
| 2004/0099938 A1 | 5/2004 | Kang et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0159954 A1 | 8/2004 | Hetzel et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2004/0245617 A1 | 12/2004 | Damberg et al. |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0192282 A1 | 8/2006 | Suwa et al. |
| 2006/0207788 A1 | 9/2006 | Yoon et al. |
| 2006/0290005 A1 | 12/2006 | Thomas |
| 2007/0025131 A1 | 2/2007 | Ruckerbauer et al. |
| 2007/0080456 A1 | 4/2007 | Chang |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0042274 A1 | 2/2008 | Bang et al. |
| 2008/0052462 A1 | 2/2008 | Blakely et al. |
| 2008/0061423 A1 | 3/2008 | Brox et al. |
| 2008/0074930 A1 | 3/2008 | Kanda |
| 2008/0088030 A1 | 4/2008 | Eldridge et al. |
| 2008/0088033 A1 | 4/2008 | Humpston et al. |
| 2008/0098277 A1 | 4/2008 | Hazelzet |
| 2008/0105984 A1 | 5/2008 | Lee |
| 2008/0150155 A1 | 6/2008 | Periaman et al. |
| 2008/0157393 A1 | 7/2008 | Kodama et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2008/0284003 A1 | 11/2008 | Kwang et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0218670 A1 | 9/2009 | Yamamoto et al. |

(56) References Cited

U.S. PATENT DOCUMENTS

| | | |
|---|---|---|
| 2009/0250255 A1 | 10/2009 | Shilling et al. |
| 2009/0250822 A1 | 10/2009 | Chen et al. |
| 2009/0273075 A1 | 11/2009 | Meyer-Berg |
| 2009/0294938 A1 | 12/2009 | Chen |
| 2009/0294942 A1 | 12/2009 | Palmer et al. |
| 2009/0303768 A1* | 12/2009 | Nishio ............... G06F 13/4072 365/51 |
| 2009/0314538 A1 | 12/2009 | Jomaa et al. |
| 2009/0321950 A1 | 12/2009 | Takiar et al. |
| 2010/0005366 A1 | 1/2010 | Dell et al. |
| 2010/0052111 A1 | 3/2010 | Urakawa |
| 2010/0078635 A1 | 4/2010 | Kuroda et al. |
| 2010/0090326 A1 | 4/2010 | Baek et al. |
| 2010/0090333 A1 | 4/2010 | Hayashi |
| 2010/0102428 A1 | 4/2010 | Lee et al. |
| 2010/0148172 A1 | 6/2010 | Watanabe et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0038059 A1 | 2/2012 | Chin et al. |
| 2012/0079176 A1 | 3/2012 | Sun et al. |
| 2012/0086125 A1 | 4/2012 | Kang et al. |
| 2012/0115277 A1 | 5/2012 | Lee et al. |
| 2012/0153435 A1 | 6/2012 | Raba et al. |
| 2012/0155049 A1 | 6/2012 | Raba et al. |
| 2012/0203954 A1 | 8/2012 | Sun et al. |
| 2012/0206181 A1 | 8/2012 | Lin et al. |
| 2012/0217642 A1 | 8/2012 | Sun et al. |
| 2012/0217645 A1 | 8/2012 | Pagaila |
| 2012/0261837 A1 | 10/2012 | Inoue et al. |
| 2012/0267771 A1 | 10/2012 | Zohni et al. |
| 2012/0271990 A1 | 10/2012 | Chen et al. |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0099393 A1 | 4/2013 | Jeong et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |
| 2014/0362629 A1 | 12/2014 | Crisp et al. |
| 2015/0043295 A1 | 2/2015 | Kim et al. |
| 2015/0048521 A1 | 2/2015 | Kwon et al. |
| 2015/0130040 A1 | 5/2015 | Defretin et al. |
| 2016/0035703 A1 | 2/2016 | Sun et al. |

FOREIGN PATENT DOCUMENTS

| | | |
|---|---|---|
| EP | 1205977 A2 | 5/2002 |
| JP | 61093694 | 5/1986 |
| JP | 63232389 | 9/1988 |
| JP | 64001257 A | 1/1989 |
| JP | H8186227 A | 7/1996 |
| JP | H11087640 | 3/1999 |
| JP | 2000196008 A | 7/2000 |
| JP | 2000315776 A | 11/2000 |
| JP | 2002076252 A | 3/2002 |
| JP | 2002083897 A | 3/2002 |
| JP | 2003051545 A | 2/2003 |
| JP | 2003264240 A | 9/2003 |
| JP | 2004063767 A | 2/2004 |
| JP | 2004152131 A | 5/2004 |
| JP | 2005340724 A | 12/2005 |
| JP | 2006310411 A | 11/2006 |
| JP | 2007013146 A | 1/2007 |
| JP | 2007149977 A | 6/2007 |
| JP | 2008016666 A | 1/2008 |
| JP | 2008135597 A | 6/2008 |
| JP | 2008198841 A | 8/2008 |
| JP | 2009182163 A | 8/2009 |
| JP | 2010098098 A | 4/2010 |
| JP | 2010282510 A | 12/2010 |
| JP | 2011096268 A | 5/2011 |
| JP | 2011155203 A | 8/2011 |
| KR | 20010002214 A | 1/2001 |
| KR | 100382035 B1 | 5/2003 |
| KR | 20050119414 A | 12/2005 |
| KR | 20060120365 A | 11/2006 |
| KR | 20070088177 A | 8/2007 |
| KR | 20090008341 A | 1/2009 |
| KR | 20090086314 A | 8/2009 |
| KR | 20100020772 A | 2/2010 |
| TW | 312044 | 8/1997 |
| TW | 428258 | 4/2001 |
| TW | 429561 | 4/2001 |
| TW | 478137 B | 3/2002 |
| TW | 567593 B | 12/2003 |
| TW | M338433 U | 8/2008 |
| TW | 200842998 A | 11/2008 |
| TW | 200901194 A | 1/2009 |
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2009158098 A2 | 12/2009 |
| WO | 2010120310 A1 | 10/2010 |

OTHER PUBLICATIONS

Chinese Office Action for Application No. 201280044482.X dated Jan. 25, 2016.

Chinese Office Action for Application No. CN201280043482.8 dated Jan. 19, 2016.

Elpida User's Manual, "Introduction to GDDR5 SGRAM", Document No. E1600E10 (Ver. 1.0), Published Mar. 2010, Japan, URL: http:'www.elpida.com.

Hynix, "2GB (64Mx32) GDDR5 SGRAM HRGQ2H24AFR", Nov. 2011-Feb. 2012.

International Search Report and Written Opinion dated Mar. 21, 2013 for Application No. PCT/US2012/000425.

International Search Report and Written Opinion dated Mar. 21, 2013 for Application No. PCT/US2012/057911.

International Search Report and Written Opinion for Application No. PCT/US2012/046049 dated Jan. 10, 2013.

International Search Report and Written Opinion for Application No. PCT/US2012/046049 dated Nov. 29, 2012.

International Search Report and Written Opinion for Application No. PCT/US2012/046249 dated Mar. 20, 2013.

International Search Report and Written Opinion for Application No. PCT/US2012/046255 dated Mar. 20, 2013.

International Search Report and Written Opinion for Application No. PCT/US2012/057170 dated Mar. 22, 2013.

International Search Report and Written Opinion for Application No. PCT/US2012/057179 dated Apr. 4, 2013.

International Search Report and Written Opinion for Application No. PCT/US2012/057200 dated Mar. 1, 2013.

(56) References Cited

OTHER PUBLICATIONS

International Search Report and Written Opinion for Application No. PCT/US2012/057204 dated Aug. 30, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/057810 dated Jul. 23, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2013/056773 dated Dec. 4, 2013.
International Search Report and Written Opinion for Application No. PCT/US2013/056777 dated Jan. 21, 2015.
International Search Report and Written Opinion for Application No. PCT/US2014/041709 dated Nov. 4, 2014.
International Search Report and Written Opinion for Application No. PCT/US2015/042726 dated Nov. 12, 2015.
International Search Report and Written Opinion for Application No. PCT/US2016/060841 dated Feb. 15, 2017.
International Search Report and Written Opinion for Application No. PCT/US2012/057895 dated Jun. 10, 2013.
International Search Report and Written Opinion for Application No. PCT/US2012/058229 dated Jul. 3, 2013.
International Search Report and Written Opinion for Application PCT/US2013/056777 dated Jan. 2, 2014.
International Search Report for Application No. PCT/US2012/057173 dated Aug. 5, 2013.
International Search Report for Application No. PCT/US2012/057905 dated Aug. 20, 2013.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 DRAM Using Through-Silicon-Via Technology, IEEE, International Solid-State Circuits Conference, 2009, Samsung Electronics, Hwasung, Korea.
Office Action from Taiwan for Application No. 101125197 dated May 19, 2014.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2011.
Sandforce, "SF-2200 & SF-2100 Client SSD Processors", 2011.
Taiwanese Allowance and Search Report for Application No. 101136592 dated Jun. 27, 2014.
Taiwanese Notice of Allowance for Application No. 102130518 dated Mar. 31, 2015.
Taiwanese Office Action for Application No. 101125193 dated Aug. 4, 2015.
Taiwanese Office Action for Application No. 101136575 dated Oct. 28, 2014.
Taiwanese Office Action for Application No. 101136577 dated May 12, 2015.
Taiwanese Office Action for Application No. 101136578 dated May 12, 2015.
Taiwanese Office Action for Application No. 101136585 dated Jan. 21, 2015.
Taiwanese Office Action for Application No. 101136594 dated Aug. 13, 2014.
Taiwanese Office Action for Application No. 101136595 dated Oct. 27, 2014.
Taiwanese Office Action for Application No. 101136606 dated Mar. 27, 2015.
Taiwanese Office Action for Application No. 102130519 dated May 7, 2015.
U.S. Appl. No. 61/477,877, filed Apr. 21, 2011.
U.S. Amendment for U.S. Appl. No. 13/439,299 dated Jan. 18, 2013.
U.S. Amendment for U.S. Appl. No. 13/440,199 dated Nov. 30, 2012.
U.S. Amendment for U.S. Appl. No. 13/440,280 dated Nov. 30, 2012.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/839,402, filed Mar. 15, 2013.
U.S. Appl. No. 13/840,353, filed Mar. 15, 2013.
U.S. Appl. No. 13/840,542, filed Mar. 15, 2013.
U.S. Appl. No. 13/841,052, filed Mar. 15, 2013.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
U.S. Non Final Office Action dated Oct. 18, 2012 for U.S. Appl. No. 13/439,299.
U.S. Non-Final Office Action for U.S. Appl. No. 13/440,199 dated Aug. 31, 2012.
U.S. Non-Final Office Action for U.S. Appl. No. 13/440,280 dated Aug. 31, 2012.
Witten Opinion of the International Preliminary Examining Authority for Application No. PCT/US2014/041709 dated Jun. 1, 2015.

\* cited by examiner

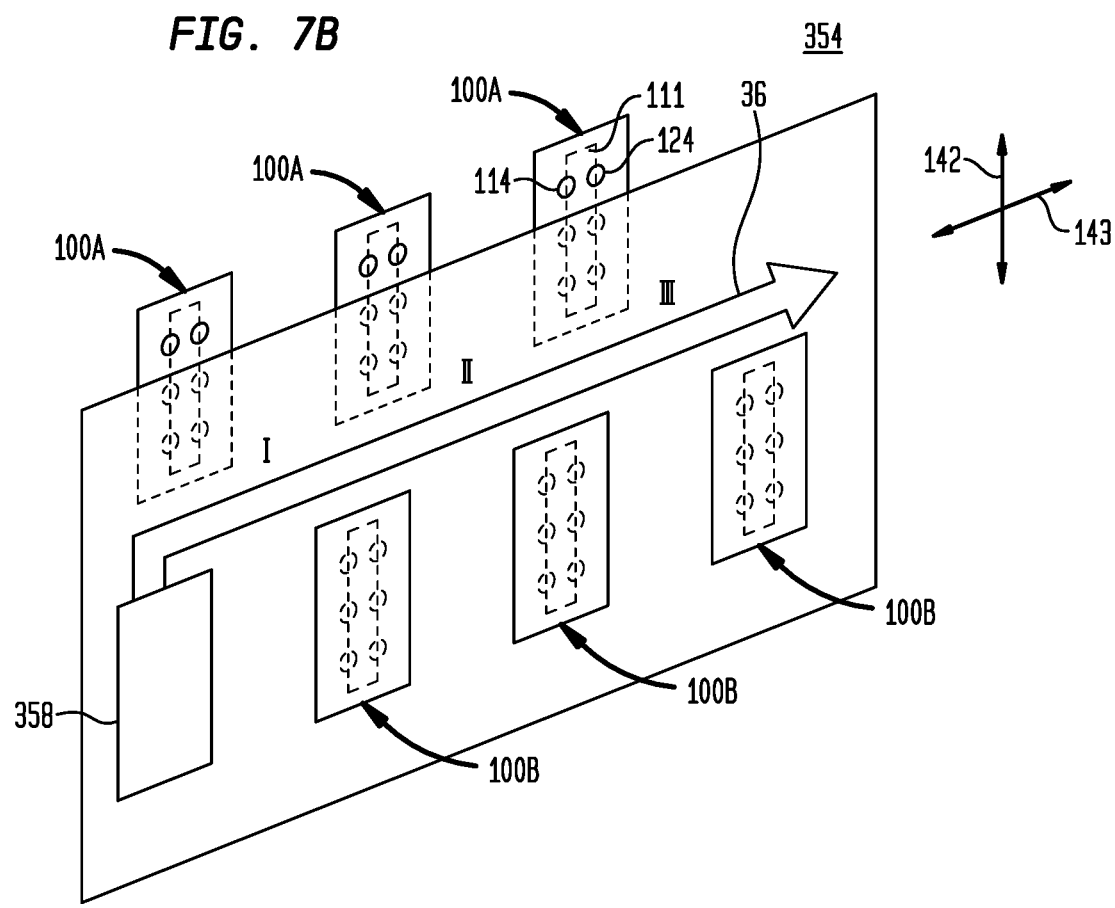

MICROELECTRONIC PACKAGE HAVING STUB MINIMIZATION USING SYMMETRICALLY-POSITIONED DUPLICATE SETS OF TERMINALS FOR WIREBOND ASSEMBLIES WITHOUT WINDOWS

CROSS-REFERENCE TO RELATED APPLICATIONS

This application is a continuation of U.S. patent application Ser. No. 15/348,238, filed Nov. 10, 2016, now U.S. Pat. No. 10,032,752, which is a continuation of U.S. patent application Ser. No. 15/069,131, filed Mar. 14, 2016, now U.S. Pat. No. 9,496,243, which is a continuation of U.S. patent application Ser. No. 14/186,380, filed Feb. 21, 2014, now U.S. Pat. No. 9,287,195, which is a continuation of U.S. patent application Ser. No. 13/440,280, filed Apr. 5, 2012, now U.S. Pat. No. 8,659,141, which claims the benefit of the filing date of U.S. Provisional Application No. 61/600,527, filed Feb. 17, 2012, and the benefit of the filing date of U.S. Provisional Application Nos. 61/542,488, 61/542,495, and 61/542,553, all filed Oct. 3, 2011, all of which are hereby incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

Conventional microelectronic packages can incorporate a microelectronic element which is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted. For example, in one conventional microelectronic package 12 seen in FIG. 1, three columns 14 of terminals can be disposed adjacent a first peripheral edge 16 of the package substrate 20 and three other columns 18 of terminals can be disposed adjacent a second peripheral edge 22 of the package substrate 20. A central region 24 of the package substrate 20 in the conventional package does not have any columns of terminals. FIG. 1 further shows a semiconductor chip 11 within the package having element contacts 26 on a face 28 thereof which are electrically interconnected with the columns 14, 18 of terminals of the package 12 through wire bonds 30 extending through an aperture, e.g., bond window, in the central region 24 of package substrate 20. In some cases, an adhesive layer 32 may be disposed between the face 28 of the microelectronic element 11 and the substrate 20 to reinforce the mechanical connection between the microelectronic element and the substrate, with the wire bonds extending through an opening in the adhesive layer 32.

In light of the foregoing, certain improvements in the positioning of terminals on microelectronic packages can be made in order to improve electrical performance, particularly in assemblies which include such packages and a circuit panel to which such packages can be mounted and electrically interconnected with one another.

SUMMARY OF THE INVENTION

In accordance with an embodiment of the invention, a microelectronic package can include a substrate having a first surface with a plurality of substrate contacts thereon, and a second surface is opposite the first surface. A microelectronic element has a rear face facing the first surface, a front face facing away from the first surface, and first and second opposed edges extending between the front and rear surfaces. Each of the first and second edges may extend in a first direction parallel to the front face. At least one column of element contacts extends in the first direction along the front face. The first and second edges define an axial plane extending in the first direction and also in a third direction normal to the face of the microelectronic element, the axial plane being centered relative to the first and second edges.

In such package, in one example, conductive structure such as wire bonds extends above the front face and beyond at least one of the first or second edges, the conductive structure electrically connecting the element contacts with the substrate contacts.

In one embodiment, terminals of the package include first terminals which are disposed at a central region of the second surface of the substrate. The central region may be such that it is not wider than three and one-half times a minimum pitch between adjacent ones of parallel columns of the terminals. The central region of the surface of the substrate is located such that the axial plane intersects the central region.

In certain embodiments of the invention, these first terminals in the central region are configured to carry address information usable by circuitry within the package to determine an addressable memory location from among all the available addressable memory locations of a memory storage array within the microelectronic element. In a particular embodiment, the first terminals can be configured to carry all of the address information usable to determine such addressable memory location from available addressable memory locations of such memory storage array. In other embodiments, the first terminals can be configured to carry a majority of the address information or in a particular case, at least three quarters of the address information.

In one example, the first terminals can be configured to receive the address information transmitted thereto as a plurality of states or changes in state on respective terminals of the microelectronic package. In another example, the first terminals can be configured to receive the address information encoded as a plurality of states or changes in state on one or on a combination of the first terminals. In a particular embodiment, the first terminals can be configured to carry information that controls an operating mode of the microelectronic element. As in the case of the address information, such information can be encoded as a plurality of states or changes in state on one or on a plurality of terminals.

In a particular embodiment, the first terminals can be configured to carry all of a group of command signals, address signals, bank address signals and clock signals transferred to the microelectronic package on a "command-address bus" of a circuit panel. The command signals in such case may be among or may be restricted to the following: command signals such as write enable, row address strobe, and column address strobe, and the clock signals are sampling clocks used for sampling the address signals. While the clock signals can be of various types, in one embodiment, the clock signals carried by these terminals can be one or more pairs of differential clock signals transmitted as differential clock signals or as true and complement clock signals.

The signals of the command-address bus can be bussed on a circuit panel such as a printed circuit board or module card to multiple microelectronic packages in parallel, particularly to first and second microelectronic packages mounted to opposite surfaces of the circuit panel. For certain embodiments herein, by placing terminals which carry the address information, or in a particular example, command-address bus signals, in the central region of the package surface, rather than in peripheral regions near the edges of the microelectronic package, it is possible to reduce the lengths of stubs used to carry signals from the command-address bus 36 (FIG. 2) on the circuit panel to the individual connection sites on the surfaces of the circuit panel where microelectronic packages are electrically connected. Reducing the lengths of stubs can improve electrical performance in such assembly by reducing one or more of settling time, ringing, jitter, and intersymbol interference, among others of the signals conducted on the stubs to the packages.

In some embodiments, the microelectronic package may have no more than four columns of terminals in the central region configured to carry all of the command signals, address signals, bank address signals and clock signals as described above. In certain embodiments, there may be only two columns of such terminals. In other embodiments there may only be one column of such terminals.

The microelectronic package may have second terminals other than the above-described command-address bus signal terminals, such second terminals being disposed in one or more of the peripheral regions and being configured to carry data signals. For example, the second terminals can include terminals used for carrying uni-directional or bi-directional data signals to and or from the microelectronic element, and data strobe signals, as well as data masks and ODT or "on die termination" signals used to turn on or off parallel terminations to termination resistors. It is possible in some embodiments for some or all terminals which are configured to carry signals other than the command-address bus signals to also be disposed in the central region of the package surface. Signals or reference potentials such as chip select, reset, power supply voltages, e.g., Vdd, Vddq, or ground, e.g., Vss and Vssq, can be carried by the second terminals, or may in some cases be carried by the first terminals.

In some embodiments, a microelectronic element may include a first semiconductor chip mounted adjacent the substrate and electrically connected thereto, and one or more second semiconductor chips overlying the first semiconductor chip and electrically connected therewith, in which the second semiconductor chips embody a greater number of active devices configured to provide memory storage array function than any other function.

A microelectronic assembly according to an aspect of the invention can include a circuit panel having first and second opposed surfaces and first and second panel contacts at the first and second surfaces, respectively, and first and second microelectronic packages each having terminals mounted to the respective panel contacts. In such assembly, each microelectronic package can include a substrate having first and second opposed surfaces, the first surface having substrate contacts thereon; and a microelectronic element embodying a greater number of active devices to provide memory storage array function than any other function. The microelectronic element can have a rear face facing the first surface, a front face opposite the rear face, and contacts on the front face electrically connected with the substrate contacts through conductive structure extending above the front face. A plurality of terminals on the second surface can be configured for connecting the microelectronic package with at least one component external to the package. The terminals can be electrically connected with the substrate contacts and include first terminals disposed at locations within first and second parallel grids. Each of the first and second grids can be configured to carry address information usable by circuitry within the package to determine an addressable memory location from among all the available addressable memory locations of a memory storage array within the microelectronic element. Signal assignments of the first terminals in the first grid can be a mirror image of the signal assignments of the first terminals in the second grid.

In one example, the first terminals of each of the first and second grids of each microelectronic package can be configured to carry all of the address information usable by the circuitry within the respective microelectronic package to determine the addressable memory location.

In one example, the first terminals of each of the first and second grids of each microelectronic package can be configured to carry information that controls an operating mode the microelectronic element of the respective microelectronic package.

In one example, the first terminals of each of the first and second grids of each microelectronic package can be configured to carry all of the command signals transferred to the respective microelectronic package, the command signals being write enable, row address strobe, and column address strobe signals.

In one example, the first terminals of each of the first and second grids of each microelectronic package can be configured to carry clock signals transferred to the respective microelectronic package, the clock signals including clocks used for sampling signals carrying the address information.

In one example, the first terminals of each of the first and second grids of each microelectronic package can be configured to carry all of the bank address signals transferred to the respective microelectronic package.

In one example, the first terminals in the second grid of the first package can be connected through the circuit panel to the first terminals in the first grid of the second package. The first terminals of the second grid of the first package can be aligned within one ball pitch of the corresponding first terminals to which they are connected of the first grid on the second package in x and y orthogonal directions parallel to the first and second circuit panel surfaces.

In one example, the grids can be aligned with one another in the x and y orthogonal directions such that the terminals of the grids can be coincident with one another.

In one example, each position of each grid can be occupied by one of the terminals.

In one example, at least one position of each grid may not be occupied by a terminal.

In one example, the grids of the first and second microelectronic packages can be functionally and mechanically matched.

In one example, a length of a stub of at least one of electrical connections between one of the first terminals of the first microelectronic package and a corresponding one of the first terminals of the second microelectronic package can be less than seven times a minimum pitch of the first terminals of each of the microelectronic packages.

In one example, at least some of the electrical connections through the circuit panel between the first terminals of the first and second microelectronic packages can have an electrical length of approximately a thickness of the circuit panel.

In one example, the total combined length of the conductive elements connecting a pair of electrically coupled first and second panel contacts exposed at the first and second surfaces of the circuit panel can be less than seven times a smallest pitch of the panel contacts.

In one example, the circuit panel can include a bus having a plurality of conductors configured to carry all of the address information transferred to each of the microelectronic packages. The conductors may extend in a first direction parallel to the first and second surfaces.

In one example, the first terminals can be disposed within an individual column in each of the first and second grids. The circuit panel may include no more than one routing layer for global routing of all of the address information between a connection site on the circuit panel at which the first terminals of the first and second packages can be electrically connected and a different connection site on the circuit panel at which the first terminals of at least a third microelectronic package can be electrically connected.

In one example, each of the first and second grids of first terminals of each microelectronic package can have two parallel columns, and wherein the circuit panel includes no more than two routing layers for global routing of all of the address information between respective connection sites on the circuit panel at which the terminals of one or more of the microelectronic packages can be electrically connected.

In one example, there may be no more than one routing layer for global routing of all of the address information between a connection site on the circuit panel at which the first terminals of the first and second packages can be electrically connected and a different connection site on the circuit panel at which the first terminals of at least a third microelectronic package can be electrically connected.

In one example, each microelectronic package can include a buffer element electrically connected to at least some of the respective terminals and the microelectronic element in the respective microelectronic package. Each buffer element can be configured to at least one of: regenerate, or at least partially decode at least one signal received at one or more of the terminals of the respective microelectronic package for transfer to the microelectronic element.

In one example, the microelectronic element of each microelectronic package can be a first microelectronic element, and each of the microelectronic packages may further include a second microelectronic element having a rear face facing the substrate and a front facing opposite the rear face, a plurality of element contacts on the front face being electrically connected with the substrate contacts through conductive structure extending above the front face. The second microelectronic element can embody a greater number of active devices to provide memory storage array function than any other function. In such example, the first terminals of each of the first and second grids of each microelectronic package can be configured to carry address information usable by circuitry within the respective microelectronic package to determine an addressable memory location from among all the available addressable memory locations of a memory storage array within the first and second microelectronic elements of the respective microelectronic package.

According to an aspect of the invention, a microelectronic assembly can include a microelectronic package and a circuit panel electrically connected with the microelectronic package. In such example, microelectronic package can include: a substrate having first and second opposed surfaces, the first surface having substrate contacts thereon; and a microelectronic element embodying a greater number of active devices to provide memory storage array function than any other function. The microelectronic element can have a rear face facing the first surface, a front face opposite the rear face, and contacts on the front face electrically connected with the substrate contacts through conductive structure extending above the front face. A plurality of terminals on the second surface can be configured for connecting the microelectronic package with the circuit panel. The terminals can be electrically connected with the substrate contacts and include first terminals disposed at locations within first and second parallel grids. Each of the first and second grids may be configured to carry address information usable by circuitry within the package to determine an addressable memory location from among all the available addressable memory locations of a memory storage array within the microelectronic element. Signal assignments of the first terminals in the first grid can be a mirror image of the signal assignments of the first terminals in the second grid.

In one example, the system may further include a housing, the microelectronic assembly and the one or more other electronic components being assembled with the housing.

In one example, the microelectronic assembly can be a first microelectronic assembly, and the system may further include a second such microelectronic assembly.

In one example, each microelectronic assembly can be mounted to, and electrically connected with a second circuit panel for transport of signals to and from each microelectronic assembly.

A microelectronic assembly according to an aspect of the invention can include a circuit panel having first and second opposed surfaces and first and second panel contacts at the first and second surfaces, respectively, and first and second microelectronic packages each having terminals mounted to the respective panel contacts. In such assembly, each microelectronic package can include a substrate having first and second opposed surfaces, the first surface having substrate contacts thereon; and a microelectronic element embodying a greater number of active devices to provide memory storage array function than any other function. The microelectronic element can have a rear face facing the first surface, a front face opposite the rear face, and contacts on the front face electrically connected with the substrate contacts through conductive structure extending above the front face. A plurality of terminals on the second surface can be configured for connecting the microelectronic package with at least one component external to the package. The terminals can be electrically connected with the substrate contacts and include first terminals disposed at locations within first and second parallel grids. The first terminals in each of the first and second grids can be configured to carry a majority of address information usable by circuitry within the package to determine an addressable memory location from among all the available addressable memory locations of a memory storage array within the microelectronic element. Signal assignments of the first terminals in the first grid can be a mirror image of the signal assignments of the first terminals in the second grid.

In one example, the first terminals of each of the first and second grids of each microelectronic package can be configured to carry at least three-quarters of the address information usable by the circuitry within the respective microelectronic package to determine the addressable memory location.

A microelectronic assembly according to another aspect of the invention can include a circuit panel having first and second opposed surfaces and first and second panel contacts at the first and second surfaces, respectively, and first and second microelectronic packages each having terminals mounted to the respective panel contacts. In such assembly, each microelectronic package can include a substrate having first and second opposed surfaces, the first surface having substrate contacts thereon; and a microelectronic element embodying a greater number of active devices to provide memory storage array function than any other function. The microelectronic element can have a rear face facing the first surface, a front face opposite the rear face, and contacts on the front face electrically connected with the substrate contacts through conductive structure extending above the front face. A plurality of terminals on the second surface can be configured for connecting the microelectronic package with at least one component external to the package. The terminals can be electrically connected with the substrate contacts and include a first set of first terminals arranged in a first individual column and second set of the first terminals arranged in a second individual column. The first terminals of each of the first and second individual columns can be configured to carry address information usable by circuitry within the microelectronic package to determine an addressable memory location from among all the available addressable memory locations of a memory storage array within the microelectronic element. Signal assignments of the first terminals in the first column can be symmetric about an axis extending between the first and second columns with respect to the signal assignments of the first terminals in the second column.

BRIEF DESCRIPTION OF THE DRAWINGS

FIG. 7B is a schematic perspective view illustrating a microelectronic assembly according to an embodiment of the invention.

DETAILED DESCRIPTION

Figure 1:
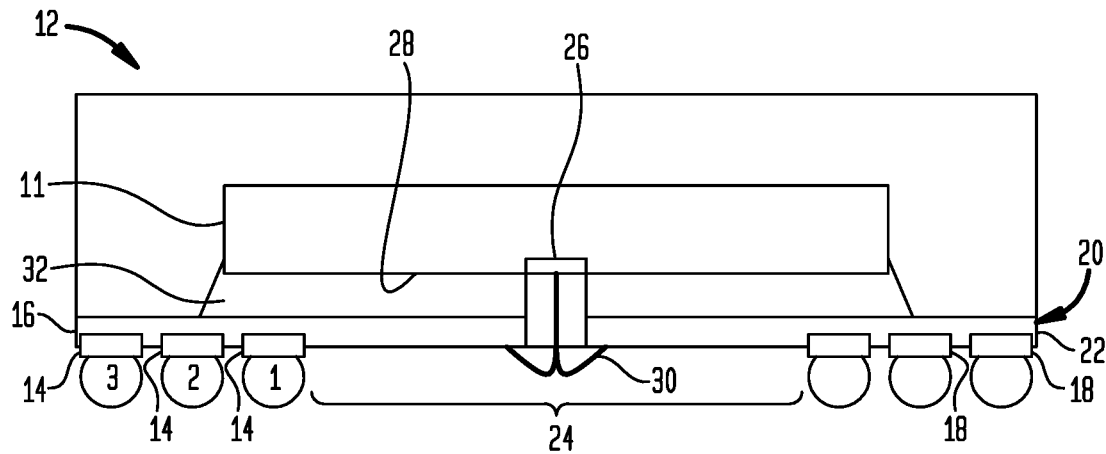
FIG. 1 is a sectional view illustrating a conventional microelectronic package.

In view of the illustrative conventional microelectronic package 12 described relative to FIG. 1, the inventors have recognized improvements which can be made that may help improve the electrical performance of a package incorporating a memory storage array chip, and an assembly which incorporates such package.

Figure 2:
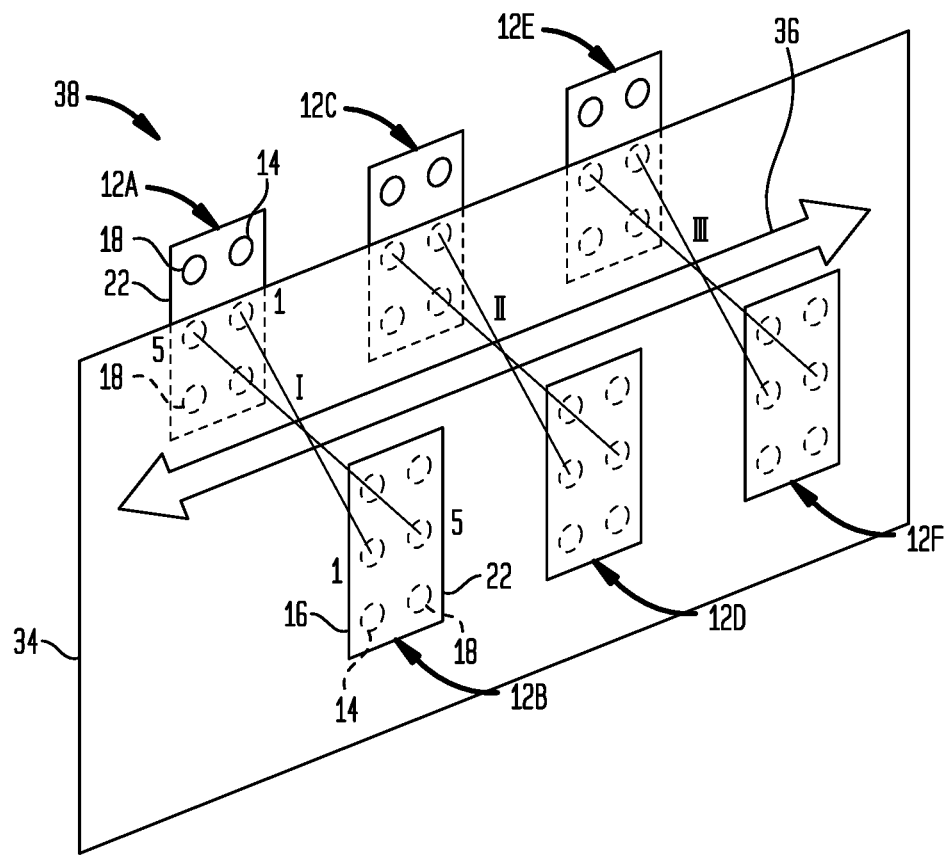
FIG. 2 is a schematic perspective view illustrating a microelectronic assembly referred to herein.
Figure 3:
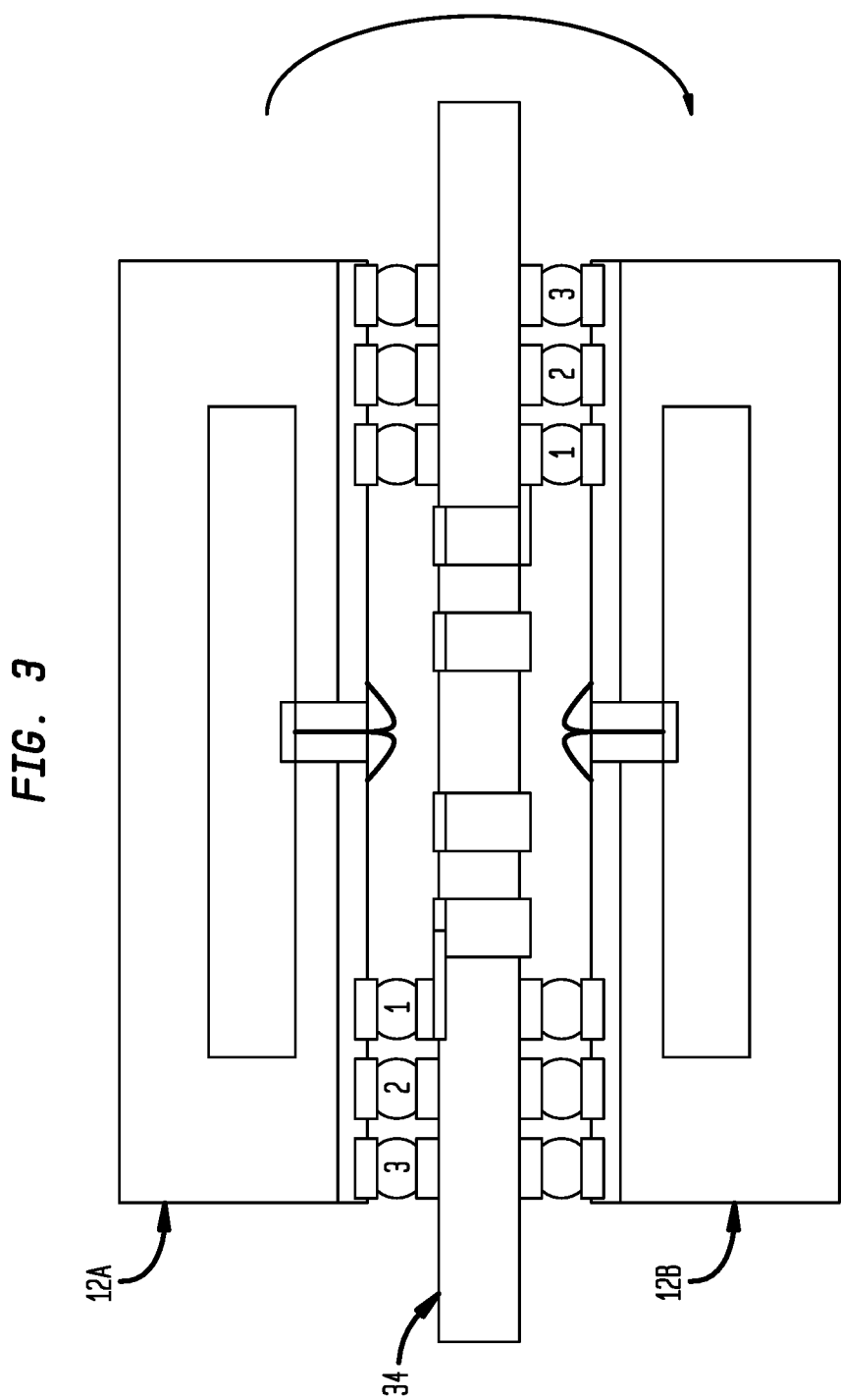
FIG. 3 is a sectional view illustrating a microelectronic assembly referred to herein.
Figure 4:
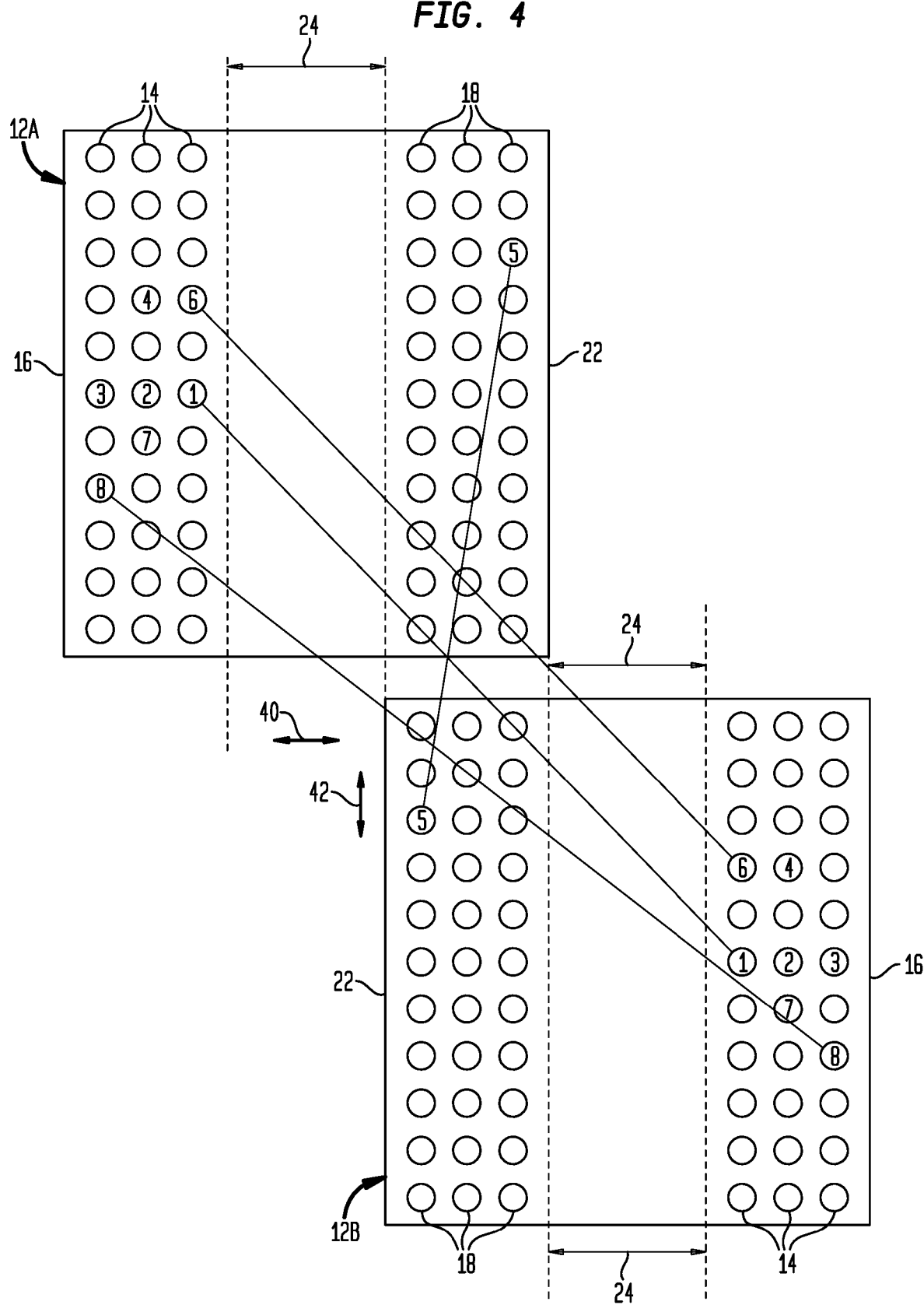
FIG. 4 is a schematic diagram illustrating an electrical interconnection between a pair of microelectronic packages in an assembly as seen in FIG. 3.

Improvements can be made particularly for use of a microelectronic package when provided in an assembly such as shown in FIGS. 2-4, in which a package 12A is mounted to a surface of a circuit panel with another like package 12B mounted opposite thereto on an opposite surface of the circuit panel. The packages 12A, 12B typically are functionally and mechanically equivalent to one another. Other pairs 12C and 12D; and 12E and 12F, of functionally and mechanically equivalent packages typically can also be mounted to the same circuit panel 34. The circuit panel and the packages assembled thereto may form a portion of an assembly commonly referred to as a dual in-line memory module ("DIMM"). The packages in each oppositely mounted pair of packages, e.g., packages 12A, 12B, connect to contacts on opposite surfaces of the circuit panel so that the packages in each pair overlie one another typically by more than 90% of their respective areas. Local wiring within the circuit panel 34 connects terminals, e.g., the terminals labeled "1" and "5" on each package to global wiring on the circuit panel. The global wiring includes the signal conductors of a bus 36 used to conduct some signals to connection sites on the circuit panel 34 such as connection sites I, II and III. For example, packages 12A, 12B are electrically connected to the bus 36 by local wiring coupled to a connection site I, packages 12C, 12D are electrically connected to the bus by local wiring coupled to connection site II, and packages 12E, 12F are electrically connected to the bus by local wiring coupled to connection site III.

The circuit panel 34 electrically interconnects the terminals of the respective packages 12A, 12B using local interconnect wiring that appears similar to a crisscross or "shoelace" pattern in which a terminal labeled "1" near one edge 16 of package 12A connects through the circuit panel 34 to a terminal labeled "1" of package 12B near the same edge 16 of package 12B. However, the edge 16 of package 12B as assembled to circuit panel 34 is far from the edge 16 of package 12A. FIGS. 2-4 further shows that a terminal labeled "5" near an edge 22 of package 12A is connected through the circuit panel 34 to a terminal labeled "5" of package 12B near the same edge 22 of package 12B. In assembly 38 the edge 22 of package 12A is far from the edge 22 of package 12B.

Connections through the circuit panel between terminals on each package, e.g., package 12A, to the corresponding terminals on the package mounted opposite thereto, i.e., package 12B, are fairly long. As further seen in FIG. 3, in such assembly of like microelectronic packages 12A, 12B, the circuit panel 34 may electrically interconnect a signal conductor of the bus 36 with the terminal of package 12A marked "1" and the corresponding terminal of package 12B marked "1", when the same signal from the bus is to be transmitted to each package. Similarly, the circuit panel 34 may electrically interconnect another signal conductor of the bus 36 with the terminal of package 12A marked "2" and the corresponding terminal of package 12B marked "2". The same can be true of the electrical connection through circuit panel 34 of the terminals marked "3" of each package 12A, 12B. The same connection arrangement may also apply to other signal conductors of the bus and corresponding terminals of each package. Local wiring between the bus 36 on the circuit panel 34 and each package of the respective pair of packages, e.g., packages 12A, 12B (FIG. 2) at a connection site I of the board can be in form of unterminated stubs. Such local wiring when relatively long may in some cases impact the performance of the assembly 38 as discussed below. Moreover, the circuit panel 34 also requires local wiring to electrically interconnect certain terminals of other packages: the pair of packages 12C and 12D, and the pair of packages 12E and 12F to the global wiring of the bus 36, and such wiring can also impact the performance of the assembly in the same way.

FIG. 4 further illustrates the interconnection between microelectronic packages 12A, 12B of respective pairs of terminals assigned to carry signals "1", "2", "3", "4", "5", "6", "7", and "8". As seen in FIG. 4, because the columns 14, 18 of terminals are near the edges 16, 22, respectively, of each package 12A, 12B, the wiring needed to traverse the circuit panel 34 in a direction 40 transverse to the direction 42 in which the columns 14, 18 of terminals extend can be quite long. In recognition that the length of a DRAM chip can be in the range of ten millimeters on each side, the length of the local wiring in a circuit panel 34 in an assembly 38 seen in FIGS. 2-4 that is required to route the same signal to the corresponding terminals of two oppositely mounted packages 12A, 12B can range up to five to ten millimeters in some cases, and may typically be about seven millimeters.

In some cases, the lengths of the circuit panel wiring required to connect the terminals of such oppositely mounted microelectronic packages may not severely impact the electrical performance of the assembly. However, when the signal carried by the connected pair of terminals on the packages 12A, 12B is a signal from a bus 36 used to carry address information or other information such as clock information usable to sample address information which is common to operation of the memory storage array function of a plurality of packages connected to the circuit panel, the inventors recognize that the wiring length of the stubs extending from the bus 36 to the terminals on each package may significantly affect performance. When the interconnecting wiring is relatively long, a more severe impact occurs, which can increase settling time, ringing, jitter, or intersymbol interference for a transmitted signal to an unacceptable degree.

In a particular embodiment, the bus 36 used to carry address information can be a command-address bus 36 configured to carry command information, address information, bank address information and clock information. In a specific implementation, the command information can be transmitted as command signals on respective signal conductors on the circuit panel. It is also possible for the address information to be transmitted as address signals on respective signal conductors, as it is also possible for the bank address information to be transmitted as bank address signals on respective signal conductors, and it is also possible for the clock information to be transmitted as clock signals on respective signal conductors. In a specific implementation of a microelectronic element which has a memory storage array such as a DRAM chip, the command signals which can be carried by the bus 36 can be write enable, row address strobe and column address strobe, and the clock signals which can be carried by the bus 36 can be clock signals used at least for sampling address signals carried by the bus 36.

Accordingly, certain embodiments of the invention described herein provide a microelectronic package configured so as to permit the lengths of stubs on a circuit panel to be reduced when first and second such packages are mounted opposite one another on opposite surfaces of a circuit panel, e.g., a circuit board, module board or card, or flexible circuit panel. Assemblies which incorporate first and second microelectronic packages mounted opposite one another on a circuit panel can have significantly reduced stub lengths between the respective packages. Reducing the stub lengths within such assemblies can improve electrical performance, such as by reducing one or more of settling time, ringing, jitter, or intersymbol interference, among others. Moreover, it may be possible to obtain other benefits as well, such as simplifying the structure of the circuit panel or reducing the complexity and cost of designing or manufacturing the circuit panel, or for both designing and manufacturing the circuit panel.

Figure 5A:
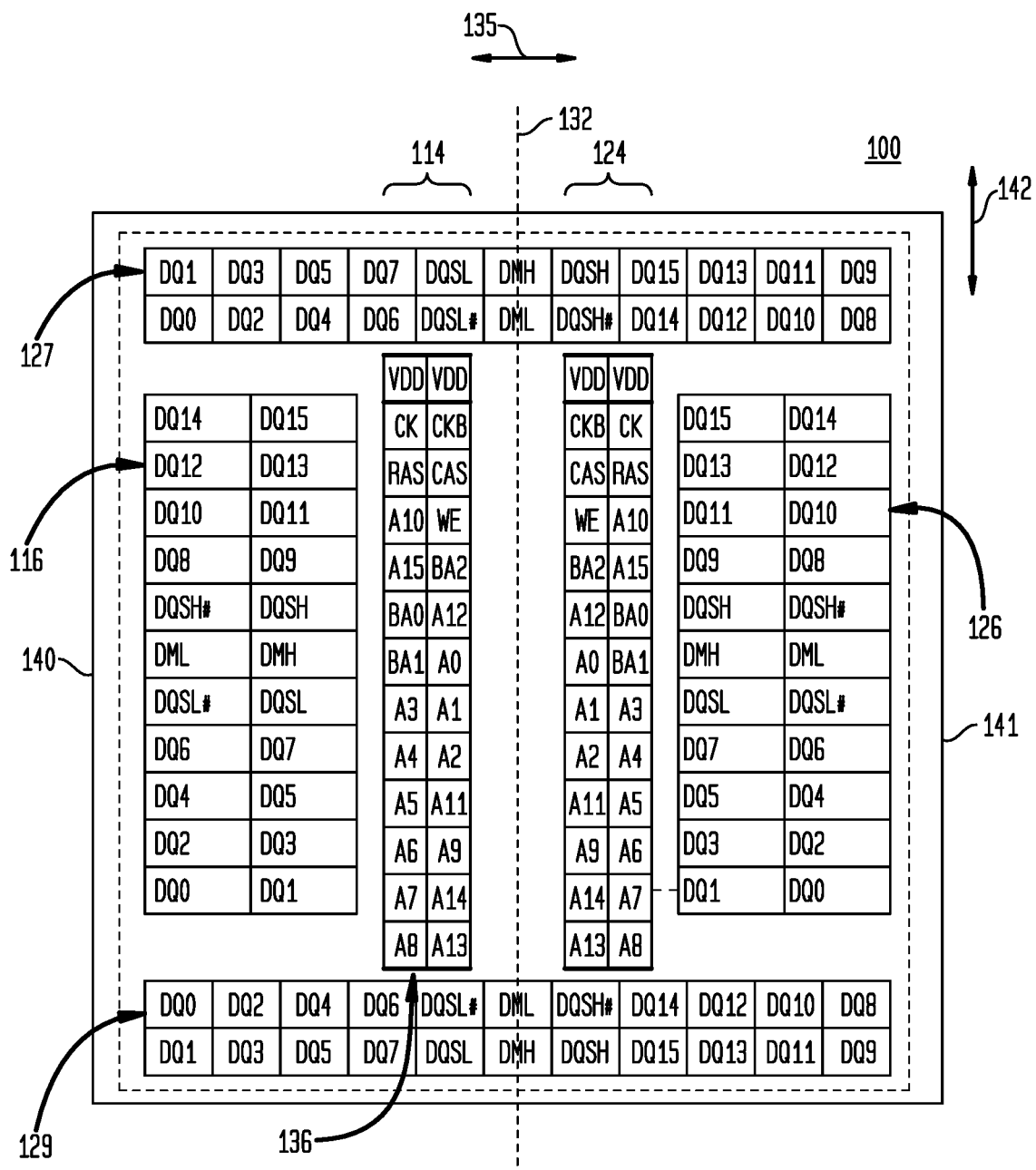
FIG. 5A is a plan view illustrating an arrangement of terminals on a microelectronic package according to an embodiment of the invention.
Figure 5B:
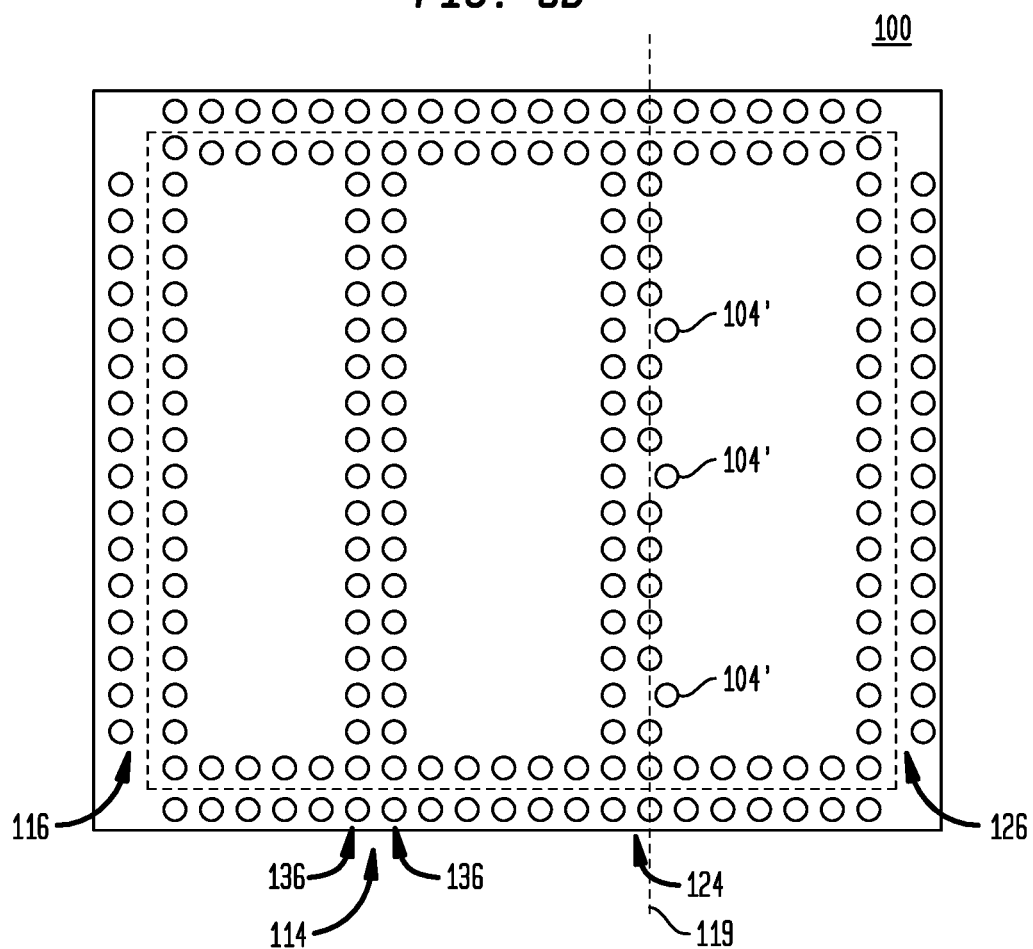
FIG. 5B is a further plan view illustrating a possible arrangement of terminals on a package such as seen in FIG. 5A.
Figure 5C:
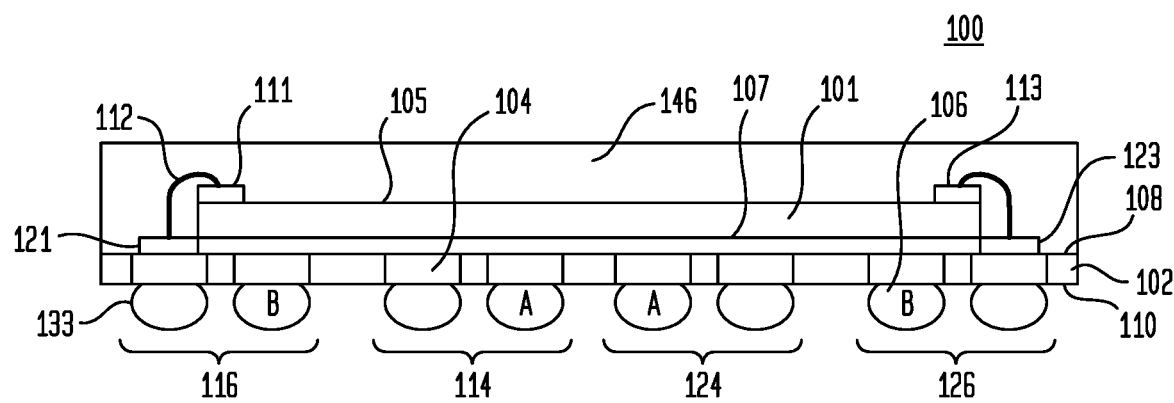
FIG. 5C is a sectional view illustrating a microelectronic package according to an embodiment of the invention.

Thus, a microelectronic package 100 according to an embodiment of the invention is illustrated in FIGS. 5A-C. As seen therein, the package 100 can include a microelectronic element 101 configured to predominantly provide memory storage array function, in that the microelectronic element has a greater number of active devices, e.g., transistors, configured to provide memory storage array function than any other function, as indicated above.

The microelectronic element has element contacts 111, 113 at a front face 105 thereof which are electrically connected to respective substrate contacts 121, 123 at a first surface 108 of the substrate 102. For example, wirebonds 112 may electrically connect the element contacts 111, 113 with the substrate contacts 121, 123. Alternatively, other types of conductors, e.g., portions of a lead frame, flexible ribbon bonds, etc., may be used to electrically connect the element contacts 111, 113 with the respective substrate contacts 121, 123, which in some cases may connect the element contacts 111, 113 with other conductive elements disposed at a greater height from the substrate surface 108 than the front face 105 of the microelectronic element 101. In one type of such microelectronic element 101, each one of some contacts of the element contacts 111, 113 may be configured to receive particular address information of the address information supplied to the microelectronic element. In a particular embodiment, each of such contacts 111, 113 may be configured to receive a respective address signal of a plurality of address signals supplied to the microelectronic element 101 from the outside the microelectronic element, i.e., through wiring of the package such as wire bonds 112, and through terminals 104, 106.

In one particular example of this type of microelectronic element 101, the address information present at the element contacts 111, 113 can be sampled relative to an edge of a clock used by the respective microelectronic element, i.e., upon on a transition of the clock between first and second different voltage states. That is, each address signal can be sampled upon a rising transition between a lower voltage state and a higher voltage state of the clock, or upon a falling transition between a higher voltage state and a lower voltage state of the clock. Thus, the plurality of address signals may all be sampled upon the rising transition of the clock, or such address signals may all be sampled upon the falling transition of the clock, or in another example, the address signal at one of the element contacts 111, 113 can be sampled upon the rising transition of the clock and the address signal at one other external contact can be sampled upon the falling transition of the clock.

In another type of microelectronic element 101 configured to predominantly provide memory storage array function, one or more of the address contacts thereon can be used in a multiplexed manner. In this example, a particular element contact 111, 113 of the respective microelectronic element 101 can receive two or more different signals supplied to the microelectronic element from the outside. Thus, a first address signal can be sampled at the particular contact 111, 113 upon a first transition of the clock between the first and second different voltage states (e.g., a rising transition), and a signal other than the first address signal can be sampled at the particular contact upon a second transition of the clock (e.g., a falling transition) between the first and second voltage states that is opposite the first transition.

In such a multiplexed manner, two different signals can be received within the same cycle of the clock on the same element contact 111, 113 of the respective microelectronic element 101. In a particular case, multiplexing in this manner can allow a first address signal and a different signal to be received in the same clock cycle on the same element contact 111, 113 of the respective microelectronic element 101. In yet another example, multiplexing in this manner can allow a first address signal and a second different address signal to be received in the same clock cycle on the same element contact 111, 113 of the respective microelectronic element 101.

In some embodiments, the substrate 102 can include a sheet-like or board-like dielectric element, which may consist essentially of polymeric material, e.g., a resin or polyimide, among others. Alternatively, the substrate can include a dielectric element having a composite construction such as glass-reinforced epoxy, e.g., of BT resin or FR-4 construction. In some examples, the dielectric element has a coefficient of thermal expansion in the plane of the dielectric element, i.e., in a direction parallel to a first surface 108 thereof, of up to 30 parts per million per degree Celsius (hereinafter, "ppm/° C."). In another example, the substrate can include a supporting element of material having a coefficient of thermal expansion ("CTE") of less than 12 parts per million per degree Celsius, on which the terminals and other conductive structure are disposed. For example, such low CTE element can consist essentially of glass, ceramic or semiconductor material or liquid crystal polymer material, or a combination of such materials.

As seen in FIG. 5C, a first set 121 and a second set 123 of substrate contacts can be exposed at a first surface 108 of the substrate. The first set 121 of substrate contacts can be electrically connected with a column 111 (FIG. 6A) of element contacts 132 of the microelectronic element, such as through electrically conductive structure extending above the face 105 of the microelectronic element. For example, the conductive structure can be wire bonds 112. In some cases, a die attach adhesive may be disposed between a rear face 107 of the microelectronic element and the surface 108 of the substrate 102, which may mechanically reinforce the connection between the microelectronic element and the substrate. The second set 123 of the substrate contacts can be electrically connected with a column 113 (FIG. 6A) of element contacts 132.

Figure 6A:
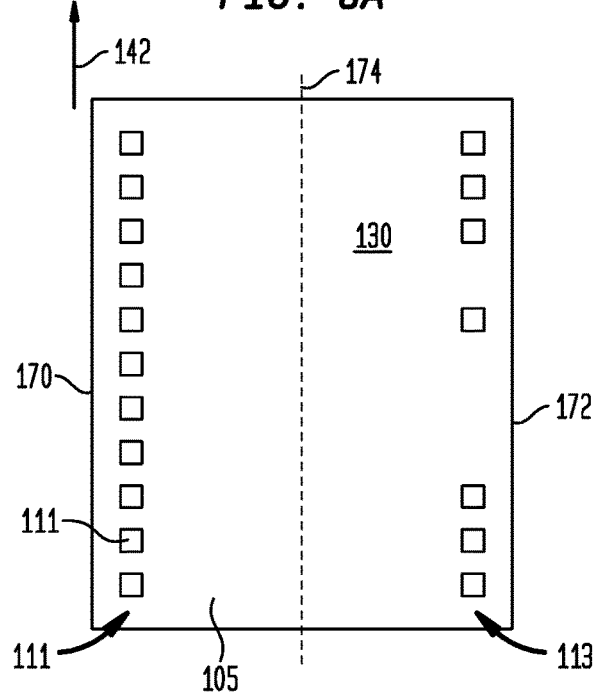
FIGS. 6A, 6B and 6C are plan views illustrating various arrangements of element contacts on microelectronic elements incorporated in a package according to an embodiment of the invention.

As further seen in FIG. 6A, an edge 170 of microelectronic element 130 can extend in the first direction 142 and a column 111 of contacts 132 adjacent to edge 170 can extend in the same first direction 142 along the face 105. Another edge 172 of microelectronic element 130, parallel to edge 170, extends in the first direction 142 and a second column 113 of contacts 132 may extend in the same first direction 142 along the face 105 adjacent to edge 172. As further shown in FIG. 6A, a column of contacts on the microelectronic element can be fully populated as in the case of column 111, or a column of contacts may have only have contacts at some of the positions within the column, as in the case of column 113. Conductive structure such as wire bonds 112 (FIG. 5C) may electrically connect the contacts 111, 113 with corresponding contacts 121, 123 on a first surface 108 of the substrate.

Figure 6B:
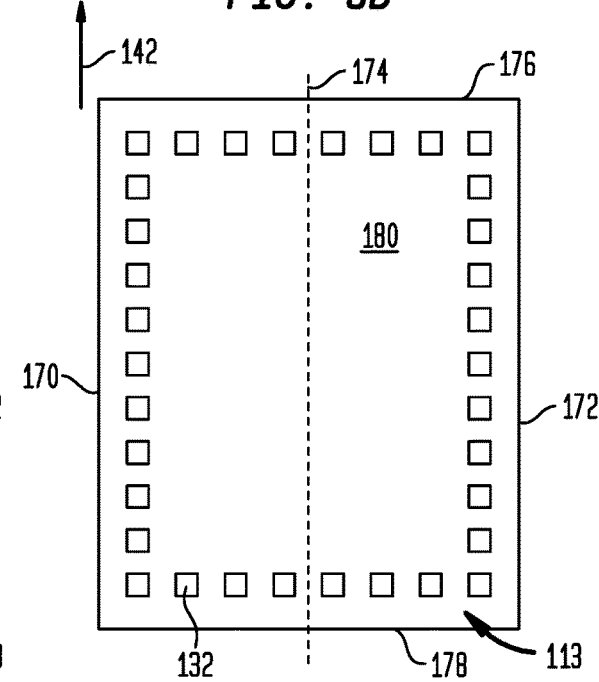

FIG. 6B illustrates a variation of the embodiment shown in FIG. 6A in which contacts 132 of a microelectronic element 180 can disposed in columns and rows adjacent to and aligned with respective peripheral edges 170, 172, 176, 178 of the microelectronic element 180. Edges 170, 172 are parallel and extend in a first direction 142.

Figure 6C:
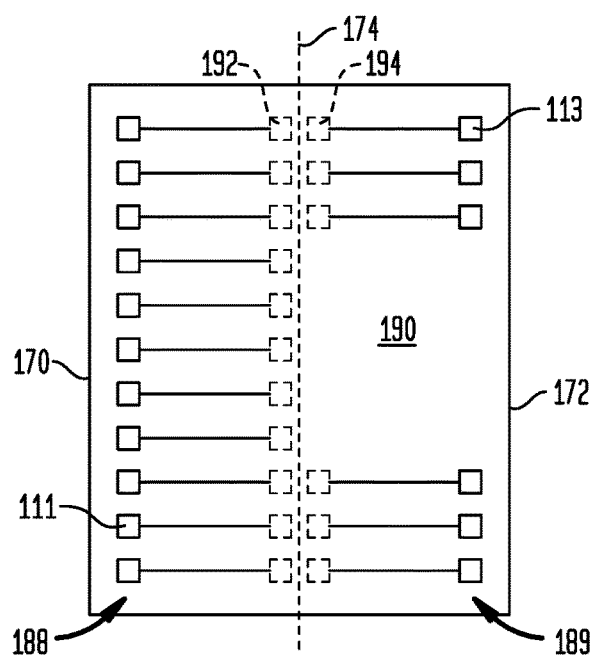

FIG. 6C illustrates another variation of the embodiment shown in FIG. 6A in which the contacts of a microelectronic element 190 are disposed in columns 188 and 189 adjacent to edges 170, 172 of the microelectronic element. However, in this case, the microelectronic element 190 includes a semiconductor chip having a conductive redistribution layer thereon, and the contacts 132 can include columns 188, 189 of redistribution contacts which are connected to the contacts 192, 194 of the semiconductor chip by conductive traces, or metalized vias formed in contact with the contacts 192, 194 of the semiconductor chip (or which can be connected to the contacts 192 194 of the chip by both metalized vias and traces). In this case, contacts 192, 194 may in some cases be connected with active devices of the semiconductor chip through back end of line ("BEOL") wiring of the semiconductor which may include vias or other electrically conductive structure and which may in some cases be disposed underneath the contacts 192, 194.

As particularly shown in FIGS. 6A-C, in some embodiments, the contacts of the microelectronic element may be arranged in a single column as shown for contacts 192, or the contacts may be arranged in a plurality of columns as shown for contacts 111, 113. Each column may contain a contact at each vertical layout position of the column along direction 142, or a contact may be missing from one or more positions of a column, as in the case of one of the columns of contacts 113. In a particular embodiment, the contacts may be arranged in an area array over the face 105 of the microelectronic element. In another example, the contacts of a microelectronic element can be arranged in one or more sets of contacts adjacent one or more peripheral edges of the microelectronic element indicated by the dashed lines marking the boundaries of the microelectronic element in FIG. 5B. In a particular example, the microelectronic element can be a single semiconductor chip and the contacts 111, or 113 thereon may be "chip contacts" which are the contacts of the semiconductor chip. In another example, as seen in FIG. 6C, a particular microelectronic element 190 can include one or more semiconductor chips each having chip contacts, and the contacts 111, or 113 may include redistribution contacts which are formed on a face 105 thereof, and which are electrically connected to the chip contacts by conductive elements such as traces and vias, for example. Unless otherwise noted, the "contacts" of the microelectronic elements in each of the examples herein can be arranged in any of these described ways.

The microelectronic element may also include additional contacts that may not be disposed within a column of the element contacts. These additional contacts may be used for connection to power, ground, or as contacts available for contact with a probing device, such as may be used for testing.

As seen in FIG. 5C, the package 100 can have first terminals 104 and second terminals 106 for electrically and mechanically connecting the package 100 with a component external to the package 100, such as a circuit panel, for example. The terminals 104, 106 can be electrically conductive pads, posts, or other electrically conductive structure. In the example seen in FIG. 5C, the terminals in some cases may include joining elements 133, such as may include a bond metal such as solder, tin, indium, gold, or a eutectic material, among others, or other conductive bond material, and may in some cases also include additional structure such as a conductive bump attached to conductive structure of the substrate such as conductive pads or posts. The first terminals 104 and the second terminals 106 can be electrically connected with the substrate contacts 121, 123 through electrically conductive structure on the substrate, such as traces and vias, for example.

A first set of the first terminals 104 can be arranged at positions within a first grid 114 at a second surface 110 of the substrate 102 opposite from the first surface 108. A second set of the first terminals 104 can be arranged at positions within a second grid 124 at the second surface 110 of the substrate. Although, in some of the figures, the first and second grids are shown extending beyond the outer boundaries of the front surface of the microelectronic elements, that need not be the case. In certain embodiments of the invention, each of the first and second grids 114, 124 of first terminals can be configured to carry the above-noted address information or, in a particular embodiment, certain signals of the command-address bus.

For example, when the microelectronic element 101 includes or is a DRAM semiconductor chip, each of the first and second grids 114, 124 is configured to carry address information transferred to the microelectronic package 100 which is usable by circuitry within the package, e.g., row address and column address decoders, and bank selection circuitry, if present, to determine an addressable memory location from among all the available addressable memory locations of a memory storage array within a microelectronic element in the package. In a particular embodiment, each of the first and second grids 114, 124 can be configured to carry all the address information used by such circuitry within the microelectronic package 100 to determine an addressable memory location within such memory storage array.

In a variation of such embodiment, the first terminals of each of the first and second grids 114, 124 can be configured to carry a majority of the address information that is used by such circuitry within the microelectronic package 100 to determine an addressable memory location within such memory storage array, and then other terminals such as at least some of the above-referenced second terminals 106 on the microelectronic package would then be configured to carry the remaining part of the address information. In such variation, in a particular embodiment, the first terminals in each of the first and second grids 114, 124 are configured to carry three-quarters or more of the address information that is used by such circuitry within the microelectronic package 100 to determine an addressable memory location within such memory storage array.

In a particular embodiment, each of the first and second grids 114, 124 may not be configured to carry chip select information, e.g., information usable to select a particular chip within the microelectronic package 100 for access to a memory storage location within the chip. In another embodiment, at least one of the first and second grids 114, 124 may indeed carry chip select information.

Typically, when the microelectronic element 101 in the microelectronic package 100 is or includes a DRAM chip, the address information in one embodiment can include all address information transferred to the package from a component external to the package, e.g., a circuit panel such as the circuit panel 154 (FIG. 7A) described below, which is used for determining a random access addressable memory location within the microelectronic package for read access thereto, or for either read or write access thereto.

At least some of the second terminals 106 can be configured to carry signals other than the address signals that are carried by the first terminals 104 of the first and second grids 114, 124. In particular examples, the second terminals 106 may carry one or more of data, data strobe signals, or other signals or reference potentials such as chip select, reset, power supply voltages, e.g., Vdd, Vddq, and ground, e.g., Vss and Vssq. Some or all second terminals can be disposed at locations within the first and second grids 114, 124. In such case, some terminals disposed at locations within the first and second grids 114, 124 can be configured to carry one or more of data, data strobe signals, or other signals or reference potentials such as chip select, reset, power supply voltages, e.g., Vdd, Vddq, and ground, e.g., Vss and Vssq. Some terminals disposed at locations within the third and fourth grids 116, 126 can be configured to carry one or more of data, data strobe signals, or other signals or reference potentials such as chip select, reset, power supply voltages, e.g., Vdd, Vddq, and ground, e.g., Vss and Vssq.

In a particular embodiment, the first terminals of each of the first and second grids 114, 124 of each microelectronic package can be configured to carry information that controls an operating mode of the microelectronic element 101. More specifically, each of the first and second grids 114, 124 can be configured to carry all of a particular set of command signals and/or clock signals transferred to the microelectronic package 100. In one embodiment, the first terminals 104 can be configured to carry all of the command signals, address signals, bank address signals, and clock signals transferred to the microelectronic package 100 from an external component, e.g., circuit panel or other device, wherein the command signals include row address strobe, column address strobe and write enable.

In an embodiment in which one or more of the microelectronic elements are configured to provide dynamic memory storage array function, such as provided by a dynamic random access memory ("DRAM") semiconductor chip, or an assembly of DRAM chips, the command signals can be write enable, row address strobe, and column address strobe signals. Other signals such as ODT (on die termination), chip select, clock enable, may or may not be carried by terminals disposed within the first and second grids 114, 124. The clock signals can be clocks used by one or more of the microelectronic elements for sampling the address signals. For example, in the microelectronic package of FIG. 7 and as further shown in FIG. 5A, the first terminals 104 can be configured to carry clock signals CK and CKB, row address strobe RAS, column address strobe CAS and write enable signals WE, as well as address signals A0 through A15 inclusive, and bank address signals BA0, BA1 and BA2.

In the embodiment illustrated in FIGS. 5A-5C, at least some of the second terminals 106, which can be disposed at positions within third and fourth grids 116, 126, can be configured to carry signals other than the command signals, address signals, and clock signals that are carried by the first terminals 104 of the first and second grids 114, 124. Signals or reference potentials such as chip select, reset, power supply voltages, e.g., Vdd, Vddq, and ground, e.g., Vss and Vssq, may or may not be carried by the second terminals 106 in any of the embodiments referred to herein, unless otherwise noted.

In one embodiment, at least some of the second terminals 106 that are configured to carry signals other than the address signals can be arranged at positions within the first and second grids 114, 124. In one example, at least some of the second terminals 106 that are configured to carry signals other than the command signals, address signals, and clock signals can be arranged at positions within the first and second grids 114, 124. Although particular configurations of second terminals 106 are shown in the figures, the particular configurations shown are for illustrative purposes and are not meant to be limiting. For example, the second terminals 106 can also include terminals that are configured to be connected to power or ground signals.

An arrangement of the first terminals in the first and second grids 114, 124 of the package is particularly shown in FIGS. 5A-C. In one example, each grid 114, 124 may include first and second parallel columns 136 of terminals. The columns 136 of terminals in each grid can be adjacent to one other. Alternatively, although not shown in FIGS. 5A-C, at least one terminal may be disposed between the first and second columns of terminals. In another example, such as seen in FIG. 5B, the grids may include a column of terminals for which a column axis 119 extends through a majority of the terminals 104 of such column, i.e., is centered relative thereto. However, in such column, one or more of the terminals might not be centered relative to the column axis 119, as in the case of terminals 104'. In this case, these one or more terminals are considered part of a particular column, even though such terminal(s) might not be centered relative to axis 119 because they are closer to the axis 119 of that particular column than to the axis of any other column. The column axis 119 may extend through these one or more terminals which are not centered relative to the column axis, or, in some cases, the non-centered terminals may be farther from the column axis such that the column axis 119 may not even pass through these non-centered terminals of the column. There may be one, several or many terminals in one column or even in more than one column which are not centered with respect to a column axis of the respective column in a grid.

Moreover, it is possible for the grids of terminals to contain arrangements of terminals in groupings other than columns, such as in arrangements shaped like rings, polygons or even scattered distributions of terminals. As shown in FIG. 5C, an encapsulant 146 may overlie the first surface 108 of the substrate and may contact the microelectronic element 101 therein. In some cases, the encapsulant may overlie a front surface 105 of the microelectronic element which faces away from the substrate 102.

As seen in FIG. 5A, the signal assignments of the first terminals in the second grid 124 are a mirror image of the signal assignments 124 of the first terminals in the first grid 114. Stated another way, the signal assignments of the first terminals in the first and second grids are symmetric about an axis 131 between the first and second grids 114, 124, the axis 131 in this case extending in a direction 142 in which columns 136 of the first terminals extend. With the signal assignments in the second grid 124 being a mirror image of those in the first grid 114, a first terminal 104 of the first grid 114 which is assigned to carry the signal A3 is in the same relative vertical position (in direction 142) within the grid as the corresponding first terminal 104 of the second grid 114 which is assigned to carry the signal A3. However, since the first grid 114 contains two columns 136 and the terminal of the first grid 114 assigned to carry the signal A3 is in the left column among the two columns 136 of the first grid 114, the mirror image arrangement requires that the corresponding terminal of the second grid 124 assigned to carry the signal A3 is in the right column among the two columns of the second grid 124. Another result of this arrangement is that the terminal assigned to carry the signal A9 is also in the same relative vertical position within the grid in each of the first and second grids 114, 124. However, in the first grid 114, the terminal assigned to carry A9 is in the right column among the two columns 136 of the first grid, and the mirror image arrangement requires that the corresponding terminal of the second grid 124 assigned to carry the signal A9 is in the left column among the two columns of the second grid 124. As can be seen in FIG. 5A, the same relationship applies for each first terminal in each of the first and second grids, at least for each first terminal assigned to carry a command-address bus signal as discussed above.

The axis 131 about which the signal assignments of the first terminals are symmetric can be located at various positions on the substrate. In a particular embodiment, the axis can be a central axis of the package that is located equidistant from first and second opposed edges 140, 141 of the substrate particularly when the columns 136 of the first terminals extend in a direction parallel to the edges 140, 141 and the first and second grids are disposed at locations which are symmetric about this central axis. In one example, the axis 131 may be located within a distance no greater than three and one-half times a minimum pitch between any two adjacent columns of terminals from a line which is parallel to and equidistant from the first and second edges 140, 141 of the substrate. Alternatively, this axis of symmetry 131 can be offset in a horizontal direction 135 from the central axis that is equidistant between edges 140, 141.

In a particular example, terminals in the first and second grids can be located in a central region of the package. In one example, at least one column 136 of terminals in each of the first and second grids 114, 124 can be disposed within a distance not greater than three and one-half times the minimum pitch between any two adjacent parallel columns 136 of the terminals from a line which is equidistant from and parallel to the first and second edges 140, 141 of the substrate.

As mentioned above, the second terminals 106 can be configured to carry information other than the above-noted address information or other than signals of the above-noted command-address bus. In one example, the second terminals 106 can include terminals used for carrying uni-directional or bi-directional data signals to and or from the microelectronic element, and data strobe signals, as well as data masks and ODT or "on die termination" signals used to turn on or off parallel terminations to termination resistors. In particular examples, the second terminals may carry signals such as chip select, reset, clock enable, as well as reference potentials such as power supply voltages, e.g., Vdd, Vddq, or ground, e.g., Vss and Vssq. In some embodiments it is possible for some or all terminals that are configured to carry signals other than the command-address bus signals to be disposed as second terminals 106 on the package, wherever they can be suitably placed. For example, some or all of the second terminals 106 can be arranged in the same grids 114, 124 on the substrate 102 in which the first terminals 104 are arranged. Some or all of the second terminals 106 may be disposed in the same column or in different columns as some or all of the first terminals 104. In some cases, one or more second terminals can be interspersed with the first terminals in the same grids or column thereof.

In a particular example, some or all of the second terminals 106 can be disposed in a third grid 116 on the second surface 110 of the substrate, and another set of the second terminals can be disposed in a fourth grid 126 on the package surface 110. In a particular case, the signal assignments of the second terminals in the third grid 116 can be a mirror image of the signal assignments of the second terminals in the fourth grid 126, in like manner to that described above for the first and second grids. The third and fourth grids 116, 126 may in some cases extend in the direction 134 in which the first and second grids extend and can be parallel to one another. The third and fourth grids may also be parallel to the first and second grids 114, 124. Alternatively, referring to FIG. 5A, grids 127, 129 in which second terminals are disposed can extend in another direction 135 which is transverse to or even orthogonal to direction 142. In another example, some second terminals can be disposed within each of the grids 116, 126, 127 and 129 shown in FIG. 5A. Some second terminals may or may not also be disposed at positions within the first and second grids 114, 124.

Also, as shown in FIG. 5A, the signal class assignments of the second terminals in grid 127 can be symmetric about the vertical axis 132, and the signal class assignments of the second terminals in grid 129 can be symmetric about the vertical axis 132. As used herein, two signal class assignments can be symmetric with respect to one another if the signal assignments are in the same class of assignments, even if the numerical index within the class differs. Exemplary signal class assignments can include data signals, data strobe signals, data strobe complement signals, and data mask signals. In a particular example, in grid 127, the second terminals having signal assignments DQSH and DQSL are symmetric about the vertical axis 132 with respect to their signal class assignment, which is data strobe, even though those second terminals have different signal assignments.

Figure 7A:
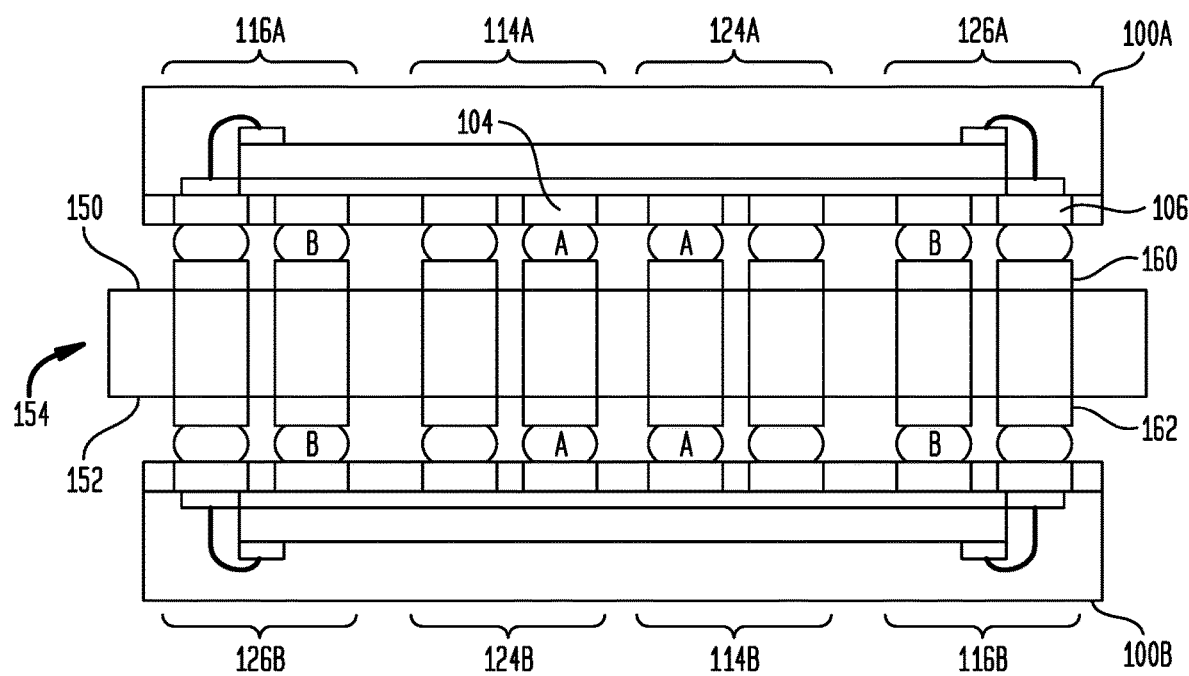
FIG. 7A is a sectional view illustrating a microelectronic assembly according to an embodiment of the invention.

As further shown in FIG. 5A, the assignments of the data signals to the spatial positions of the second terminals on the microelectronic package, such as for data signals DQ0, DQ1, . . . , for example, can have modulo-X symmetry about the vertical axis 132. The modulo-X symmetry can help preserve signal integrity in an assembly 200 or 354 such as seen in FIGS. 7A and 7B, in which one or more pairs of first and second packages are mounted opposite one another to a circuit panel, and the circuit panel electrically connects corresponding pairs of second terminals of those first and second packages in each oppositely mounted package pair. When the signal assignments of terminals have "modulo-X symmetry" about an axis, terminals that carry signals which have the same number "modulo-X" are disposed at positions which are symmetric about the axis. Thus, in such assembly 200 or 354 such as in FIGS. 7A-7B, modulo-X symmetry can permit electrical connections to be made through the circuit panel so that a terminal DQ0 of a first package can be electrically connected through the circuit panel to a terminal DQ8 of the second package which has the same number modulo X (X being 8 in this case), so that the connection can be made in a direction essentially straight through, i.e., normal to, the thickness of the circuit panel. Thus, a number such as 8 modulo 8 is 0, and a number such as 9 modulo 8 is 1. Therefore, when the signal assignments have modulo-8 symmetry, a terminal which is configured to carry a signal such as DQ1, for which the modulo 1 operation yields a result of "1", is disposed at a position on the substrate which is symmetric about an axis with another terminal configured to carry a signal such as DQ9 or DQ17 for which the modulo 8 operation yields the same result, i.e., "1".

In one example, "X" can be a number $2^n$ (2 to the power of n), wherein n is greater than or equal to 2, or X can be 8×N, N being two or more. Thus, in one example, X may be equal to the number of bits in a half-byte (4 bits), byte (8 bits), multiple bytes (8×N, N being two or more), a word (32 bits) or multiple words. In such way, in one example, when there is modulo-8 symmetry as shown in FIG. 5A, the signal assignment of a package terminal DQ0 in grid 127 is configured to carry data signal DQ0 is symmetric about the vertical axis 132 with the signal assignment of another package terminal DQ8 configured to carry data signal DQ8. Moreover, the same is true for the signal assignments of package terminals DQ0 and DQ8 in grid 129. As further seen in FIG. 5A, the signal assignments of package terminals DQ2 and DQ10 in grid 127 have modulo-8 symmetry about the vertical axis, and the same is also true for grid 129. Modulo-8 symmetry such as described herein can be seen in grids 127, 129 with respect to each of the signal assignments of package terminals DQ0 through DQ15.

It is important to note that, although not shown, the modulo number "X" can be a number other than $2^n$ (2 to the power of n) and can be any number greater than two. Thus, the modulo number X upon which the symmetry is based can depend upon how many bits are present in a data size for which the package is constructed or configured. For example, when the data size is 10 bits instead of 8, then the signal assignments may have modulo-10 symmetry. It may even be the case that when the data size has an odd number of bits, the modulo number X can have such number.

FIG. 7A illustrates an assembly 200 of first and second microelectronic packages 100A, 100B, each being a microelectronic package 100 as described with reference to FIGS. 5A-C above, as mounted to opposite first and second surfaces 150, 152 of a circuit panel 154. The circuit panel can be of various types, such as a printed circuit board used in a dual-inline memory module ("DIMM") module, a circuit board or panel to be connected with other components in a system, or a motherboard, among others. The first and second microelectronic packages 100A, 100B can be mounted to corresponding contacts 160, 162 exposed at the first and second surfaces 150, 152 of the circuit panel 154, respectively.

As particularly shown in FIG. 7A, because the signal assignments of the first terminals in the second grid of each package are a mirror image of the signal assignments of the first terminals in the first grid of each package, when the packages 100A, 100B are mounted to the circuit panel opposite one another, each first terminal in the first grid 114A of the first package 100A can be aligned with the corresponding first terminal in the second grid 124B of the second package 100B which has the same signal assignment and to which it is electrically connected. Moreover, each first terminal in the second grid 124A of the first package 100A can be aligned with the corresponding first terminal in the first grid 114B which has the same signal assignment and to which it is electrically connected.

To be sure, the alignment of each pair of connected terminals can be within a tolerance, such that each pair of connected terminals can be aligned within one ball pitch of one another in orthogonal x and y directions along the first surface 150 of the circuit panel 154. As evident from FIG. 7A, the first terminals of each grid can be aligned within one ball pitch of one another in x and y orthogonal directions parallel to the surface 350 of the circuit panel, the ball pitch being no greater than a minimum pitch between any two adjacent parallel columns of the terminals on either package. In a particular example, the grids may be aligned with one another in the x and y directions such that at least some of the first terminals on the first and second microelectronic packages are coincident with one another. As used herein, when the first terminals of packages at opposite surfaces of a circuit panel are "coincident" with one another, the alignment can be within customary manufacturing tolerances or can be within a tolerance of less than one-half of one ball pitch of one another in x and y orthogonal directions parallel to the first and second circuit panel surfaces, the ball pitch being as described above.

In a particular example, at least half of the positions of the aligned grids of the respective first and second packages 100A, 100B (e.g., the first grid 114A of the first package and the second grid 124B of the second package) can be aligned with one another in orthogonal x and y directions along the first surface 150 of the circuit panel 154.

Thus, as further shown in FIG. 7A, a particular first terminal that carries a signal marked "A" in grid 114A of the first package 100A is aligned with the corresponding first terminal of grid 124B of the second package 100B that carries the same signal "A". The same is also true regarding a particular first terminal that carries a signal marked "A" in grid 124A of the first package 100A that is aligned with the corresponding first terminal of grid 114B of the second package 100B that carries the same signal "A".

In this way, as further seen in FIG. 7A, the lengths of the electrical connections through the circuit panel between each pair of electrically connected first terminals of the first and second packages 100A, 100B can be significantly reduced, in that the terminals in each of these pairs of electrically connected second terminals may overlie one another, or at least be aligned within one ball pitch of one another. The reductions in the lengths of these electrical connections can reduce stub lengths in the circuit panel and the assembly, which can help improve the electrical performance, such as reducing settling time, ringing, jitter, or intersymbol interference, among others, for the above-noted signals which are carried by the first terminals and which are transferred to microelectronic elements in both the first and second packages. Moreover, it may be possible to obtain other benefits as well, such as simplifying the structure of the circuit panel or reducing the complexity and cost of designing or manufacturing the circuit panel.

Therefore, referring to FIG. 7B, the electrical lengths of stubs on the circuit panel 354 which electrically connect a first terminal 104 of the first package 100A with the corresponding first terminal 104 on the second package 100B can be less than seven times a minimum pitch of the first terminals on each package, for example, less than seven times the pitch 151 between columns 104A, 104B of first terminals in FIG. 5B. Stated another way, referring to FIG. 7A, the total combined length of the conductive elements connecting a pair of electrically coupled first and second panel contacts 160, 162 exposed at the first and second surfaces of the circuit panel 150, 152 for electrically interconnecting the first and second panel contacts with one of the command signals, address signals, bank address signals or clock signals can be less than seven times a smallest pitch of the panel contacts.

As further shown in FIG. 7A, when the second terminals of each package 100A, 100B are arranged in third and fourth grids having the specific mirror image arrangement described above with respect to FIGS. 5A-C, each terminal of each package's third grid can be aligned with the corresponding second terminal of the other package's fourth grid which has the same signal assignment and to which it is electrically connected. Thus, as seen in FIG. 7A, each terminal in the third grid 116A of the first package 100A can be aligned within one ball pitch of the corresponding terminal in the fourth grid 126B of the second package 100B which has the same signal assignment and to which it is electrically connected. Moreover, each terminal in the grid 126A of the first package 100A can be aligned within one ball pitch of the corresponding terminal in the third grid 116B which has the same signal assignment and to which it is electrically connected. Again, the alignment of each pair of connected terminals is within a tolerance, such that each pair of connected terminals can be aligned within one ball pitch of one another in orthogonal x and y directions along the first surface 150 of the circuit panel 154. In a particular embodiment, the alignment can be such that the corresponding connected terminals of the packages 100A, 100B are coincident with one another.

Thus, as further shown in FIG. 7A, a particular first terminal that carries a signal marked "B" in grid 116A of the first package 100A can be aligned within one ball pitch of the corresponding first terminal of grid 126B of the second package 100B that carries the same signal "B" and to which it is electrically connected. The same is also true regarding a particular first terminal that carries a signal marked "B" in grid 126A of the first package 100A that can be aligned within one ball pitch of the corresponding first terminal of grid 116B of the second package 100B that carries the same signal "B" and to which it is electrically connected.

Similar to the connections between corresponding first terminals 104 of first and second packages as described above, in this embodiment, the lengths of the electrical connections through the circuit panel between pairs of electrically connected second terminals 106 of the first and second packages can be significantly reduced, in that the terminals in each of these pairs of electrically connected second terminals may be coincident with one another, or at least be aligned within one ball pitch of one another in orthogonal x and y directions parallel to the circuit panel surface. Moreover, benefits similar to those described above for reducing stub lengths and simplifying the construction of a circuit panel for the connections between the first and second packages may be obtained when the second terminals of a microelectronic package are arranged in this way, i.e., terminals which can be assigned to carry signals other than the above-noted signals of the command-address bus.

FIG. 7B further illustrates that two pairs 100A-100B, or a greater number of pairs of microelectronic packages each having a construction either as described above or hereinafter can be electrically interconnected with respective panel contacts on a circuit panel 354, e.g., a board of a dual-inline memory module ("DIMM"), in similar orientations as packages 100A, 100B. Thus, FIG. 7B shows three pairs of packages 100A-100B, each pair electrically interconnected with circuit panel 354 in opposite orientations facing one another as described above.

FIG. 7B illustrates a microelectronic assembly such as, for example, a DIMM, among others, incorporating a circuit panel and a plurality of microelectronic packages mounted opposite one another to first and second opposite surfaces thereof. As seen in FIG. 7B, the above-noted address information or in some cases, command-address bus signals can be routed on a bus 36, e.g., an address bus or command-address bus on the circuit panel or circuit board 354, in at least one direction 143 between connection sites I, II or III at which respective pairs of microelectronic packages 100A-100B are connected to opposite sides of the circuit panel. Signals of such bus 36 reach each pair of packages at the respective connection sites I, II or III at slightly different times. The at least one direction 143 can be transverse to or orthogonal to a direction 142 in which at least one column 111 of a plurality of contacts on at least one microelectronic element within each package 100A or 100B extends. In such way, the signal conductors of the bus 36 on (i.e., on or within) the circuit panel 354 can in some cases be spaced apart from one another in a direction 142 which is parallel to the at least one column 111 of contacts on a microelectronic element within a package 100A, or 100B connected to the circuit panel.

Such a configuration, particularly when the terminals of the first grid 104 of each microelectronic package are arranged in one or more columns extending in such direction 142, may help simplify the routing of signal conductors of one or more global routing layers on the circuit panel used to route the signals of the bus 36. For example, it may be possible to simplify routing of the command-address bus signals on a circuit panel when relatively few first terminals are disposed at the same vertical layout position on each package. Thus, in the example shown in FIG. 5C, the first and second grids 114, 124 of each package have only four terminals disposed at the same vertical layout position, such as, for example, the terminals of the first and second grids 114, 124 configured to receive address signals A3 and A1, as further shown in FIG. 5A.

In one embodiment, the microelectronic assembly 354 can have a microelectronic element 358 that can include a semiconductor chip configured to perform buffering of at least some signals transferred to the microelectronic packages 100A, 100B of the assembly 354. Such a microelectronic element 358 having a buffering function can be configured to help provide impedance isolation for each of the microelectronic elements in the microelectronic packages 100A and 100B with respect to components external to the microelectronic assembly 354.

In an exemplary embodiment, the microelectronic assembly 354 can have a microelectronic element 358 that can include a semiconductor chip configured predominantly to perform a logic function, such as a solid state drive controller, and one or more of the microelectronic elements in the microelectronic packages 100A and 100B can each include memory storage elements such as nonvolatile flash memory. The microelectronic element 358 can include a special purpose processor that is configured to relieve a central processing unit of a system such as the system 2500 (FIG. 31) from supervision of transfers of data to and from the memory storage elements included in the microelectronic elements. Such a microelectronic element 354 including a solid state drive controller can provide direct memory access to and from a data bus on a motherboard (e.g., the circuit panel 2502 shown in FIG. 31) of a system such as the system 2500.

In such an embodiment of the microelectronic assembly 354 having a microelectronic element 358 that includes a controller function and/or a buffering function, the command-address bus signals can be routed between the microelectronic element 358 and each pair of packages 100A and 100B at respective connection sites I, II or III. In the particular example shown in FIG. 7B, a portion of the command-address bus 36 that extends past the connection sites I, II or III can extend in the direction 143 or in another direction transverse to the direction 143 to reach contacts of the microelectronic element 358. In one embodiment, the command-address bus 36 can extend in the direction 143 to reach contacts of the microelectronic element 358.

Figure 8:
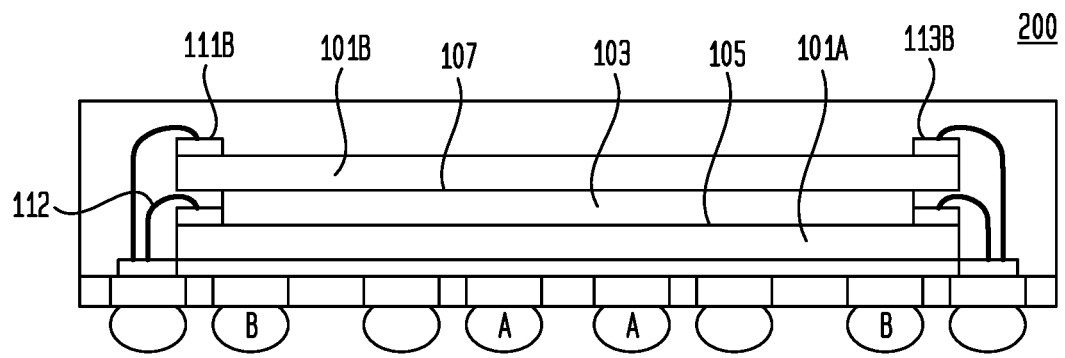
FIG. 8 is a sectional view illustrating a microelectronic package according to an embodiment of the invention.

FIG. 8 illustrates a microelectronic package 200 according to a variation of the embodiment described above relative to FIGS. 5A-7A in which a microelectronic element has a composite structure which includes first and second semiconductor chips 101A, 101B. The second semiconductor chip 101B, like the first semiconductor chip, also has element contacts 111B, 113B on its front face 105 which are electrically connected with the substrate contacts 121, 123. In a particular embodiment, a spacer element 103 can be disposed between the front face 105 of the first semiconductor chip and the rear face 107 of the second semiconductor chip, which can facilitate forming wire bonds 112 connected to the first semiconductor chip 101A at a stage of processing after the second semiconductor chip 101B has been stacked with the spacer element 103 atop the first semiconductor chip.

Figure 9:
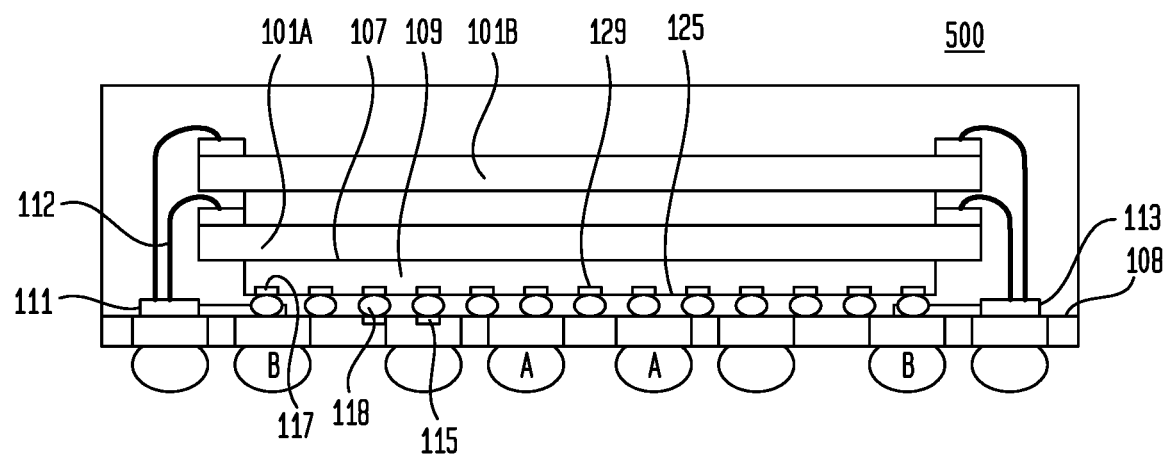
FIG. 9 is a sectional view illustrating a microelectronic package according to an embodiment of the invention.

FIG. 9 illustrates another variation of the embodiment shown in FIG. 8 in which the microelectronic element further includes another semiconductor chip 109 disposed between the first surface 108 of the substrate and the rear face 107 of the first semiconductor chip 101A. Semiconductor chip 109 can have contacts 129 on a front face 125 thereof which face corresponding contacts 115, 117 and are joined thereto. The joints between the chip 109 and the corresponding substrate contacts 115, 117 can be made using electrically conductive joining elements 118, which can include a bond metal, a deposited electrically conductive material, posts or pillars of a metal, e.g., a rigid metal such as copper, nickel or combination thereof. In a particular example, the semiconductor chip 109 can be a bare chip, i.e., unpackaged chip. Alternatively, the semiconductor chip 109 may include conductive structure such as leads, traces, or vias thereon, among others, or may be a packaged semiconductor element.

When the microelectronic package includes a vertically stacked arrangement of semiconductor chips such as seen in FIG. 8 or FIG. 9, or as seen in examples described in the following, one or more of the chips within the package can be configured, e.g., designed, constructed, or set up, to buffer signals or otherwise regenerate information received at the terminals 104 or 106 of the package, or both such terminals, for transfer to another semiconductor chip within the package. For example, in a configuration as shown in FIG. 8, a first semiconductor chip 101A adjacent the substrate can buffer or otherwise regenerate one or more signals or information for transfer to the second semiconductor chip. In a configuration as seen in FIG. 9, a semiconductor chip 109 can buffer signals or otherwise regenerate information for transfer to one or more of semiconductor chips 101A, 101B. Alternatively or in addition thereto, semiconductor chip 109 can regenerate signals received from one or more of the semiconductor chips 101A, 101B for transfer to the terminals 104, 106 or both 104, 106, or can regenerate signals being transferred in both directions from the terminals to the semiconductor chips 101A, 101B; or signals being transferred from the semiconductor chips 101A, 101B to the terminals of the microelectronic package.

Alternatively or in addition to regenerating signals as described above, in one example, the first chip in such a composite microelectronic element can be configured to partially or fully decode information that controls an operating mode of the microelectronic element. In a particular example, the first semiconductor chip in such composite microelectronic element can be configured to partially or fully decode at least one of address information or command information received at the terminals, such as at the first terminals of the microelectronic package. The first chip can then output the result of such partial or full decoding for transfer to the one or more second semiconductor chips 101A, 101B.

Signals or information received at the terminals of the package can be routed to substrate contacts 115 and through joining elements 118 to semiconductor chip 109. Semiconductor chip 109 can then regenerate and transfer the received signals or information to substrate contacts 117. From the substrate contacts 117, the signals or information may be routed by the substrate, such as through conductive traces thereon to substrate contacts 111, 113 where they are then routed to the semiconductor chips 101A, 101B such as through wirebonds 112. In a particular example, the semiconductor chip 109 can be configured to buffer the above-noted command signals, address signals and clock signals transferred to the semiconductor chips 101A, 101B.

Figure 10:
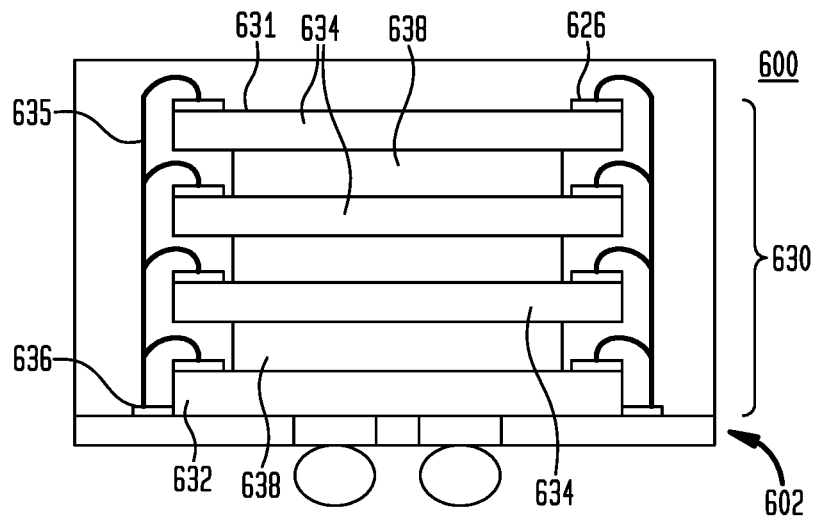
FIG. 10 is a sectional view illustrating a microelectronic package according to an embodiment of the invention.

FIG. 10 illustrates a microelectronic package 600 according to a particular example in which the microelectronic element includes a vertical stack 630 of an electrically interconnected first semiconductor chip 632 and a plurality of second semiconductor chips 634, each having a contact-bearing face 631 that faces away from the substrate 602. Wire bonds 635 electrically interconnect the contacts 626 on the semiconductor chips 632, 634 with corresponding contacts 636 on the substrate. Spacers 638 can be disposed between adjacent faces of the semiconductor chips 634, and a spacer 638 can be disposed between the contact-bearing face 631 of the semiconductor chip 632 and a rear face of semiconductor chip 634. In some cases, adhesive layers (not shown) can be provided between each spacer and the faces of the semiconductor chips adjacent to such spacer. As shown in FIG. 10, the one or more second semiconductor chips 634 are electrically interconnected with the first semiconductor chip 632. For example, as seen in FIG. 10, there are three vertically stacked second semiconductor chips 634 in which the faces 631 thereof are parallel to one another.

In the microelectronic package 600 seen in FIG. 10, each of the first and second semiconductor chips 632, 634 can be configured such that each such semiconductor chip embodies a greater number of active devices to provide memory storage array function than any other function. For example, each of the first and second semiconductor chips may include a memory storage array and all circuitry required for inputting data to and outputting data from the memory storage array. For example, when the memory storage array in each semiconductor chip is writable, each of the semiconductor chips may include circuitry configured to receive external data input from terminals of the package, as well as circuitry configured to transfer data output from such semiconductor chip to terminals of the package. Thus, each first and each second semiconductor chip 632, 634 can be a dynamic random access memory ("DRAM") chip or other memory chip which is capable of inputting and outputting data from the memory storage array within such semiconductor chip and receiving and transmitting such data to a component external to the microelectronic package. Stated another way, in such case, signals to and from the memory storage array within each DRAM chip or other memory chip does not require buffering by an additional semiconductor chip within the microelectronic package.

Alternatively, in another example, the one or more second semiconductor chips 634 may embody a greater number of active devices to provide memory storage array function than any other function, but the first semiconductor chip 632 may be a different type of chip. In this case, the first semiconductor chip 632 can be configured, e.g., designed, constructed, or set up, to buffer signals, i.e., regenerate signals received at the terminals for transfer to the one or more second semiconductor chips 634, or to regenerate signals received from one or more of the second semiconductor chips 634 for transfer to the terminals, or to regenerate signals being transferred in both directions from the terminals to the one or more second semiconductor chips 634; and from the one or more semiconductor chips to the terminals of the microelectronic package.

In a particular example, the first semiconductor chip can be configured to buffer address information or may be configured to buffer command signals, address signals and clock signals which are transferred to the one or more second semiconductor chips. For example, the first semiconductor chip 632 can be a buffer chip which embodies a greater number of active devices to provide a buffering function in transferring signals to other devices, e.g., to the one or more second semiconductor chips 634, than for any other function. Then, the one or more second semiconductor chips may be reduced function chips which have memory storage arrays but which can omit circuitry common to DRAM chips, such as buffer circuitry, decoders or predecoders or wordline drivers, among others. In that case, the first chip 632 may function as a "master" chip in the stack and to control operations in each of the second semiconductor chips 634. In a particular example, the second semiconductor chips may be configured such that they are not capable of performing the buffering function, and so the stacked arrangement of the first and second semiconductor chips is configured such that the buffering function required in the microelectronic package can be performed by the first semiconductor chip, and cannot be performed by any of the second semiconductor chips in the stacked arrangement. Similar to that described above, the first semiconductor chip may be configured to partially or fully decode information received at the first terminals that controls an operating mode of the microelectronic element made up of the first and second semiconductor chips. Alternatively, or in addition thereto, the first semiconductor chip may be configured to partially or fully decode at least one of address or command information received at the first terminals. In a particular example, one or more of the second semiconductor chips may not be configured to fully decode information received at the first terminals of the microelectronic package, such as address information, command information or information that controls an operating mode of the microelectronic element.

In any of the embodiments described herein, the one or more second semiconductor chips can be implemented in one or more of the following technologies: DRAM, NAND flash memory, RRAM ("resistive RAM" or "resistive random access memory"), phase-change memory ("PCM"), magnetoresistive random access memory, e.g. such as may embodiment tunnel junction devices, spin-torque RAM, or content-addressable memory, among others.

Figure 11:
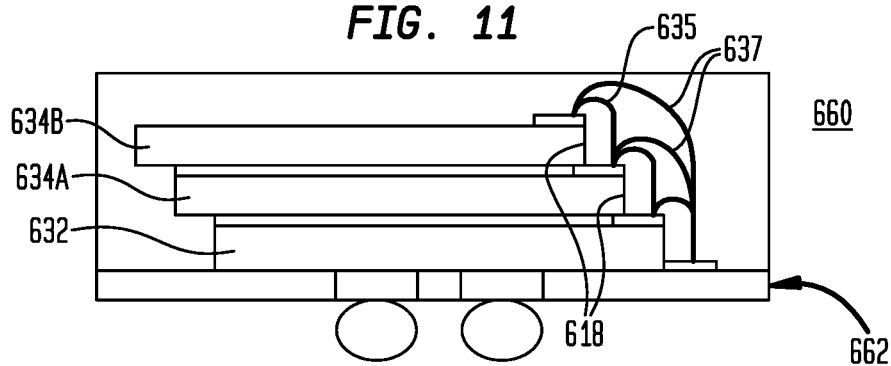
FIG. 11 is a sectional view illustrating a microelectronic package according to an embodiment of the invention.
Figure 12:
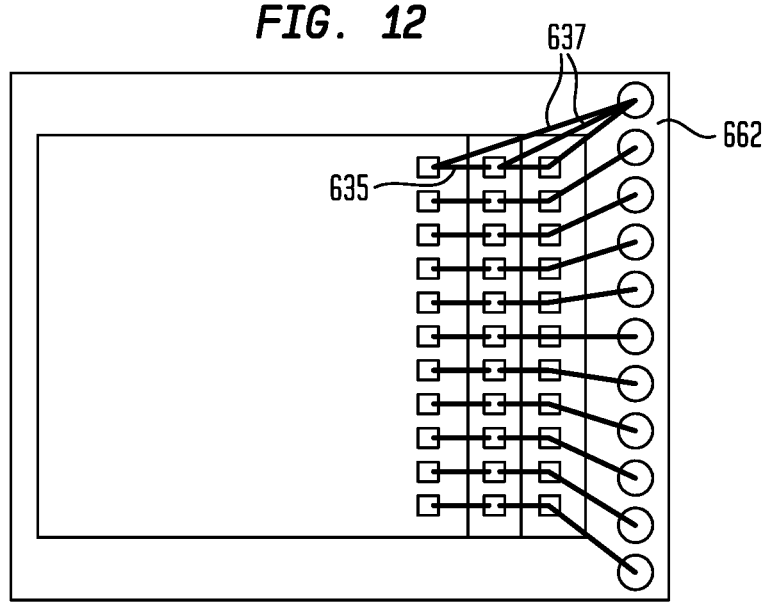
FIG. 12 is a plan view illustrating a microelectronic package according to an embodiment of the invention.

FIG. 11 is a sectional view and FIG. 12 is a corresponding plan view illustrating a microelectronic package 660 according to a further variation in which the second semiconductor chips 634 are mounted in stair-step manner relative to one another such that the contacts of the first semiconductor chip 632 are exposed beyond an edge 618 of the second semiconductor chip 634A immediately above the first semiconductor chip 632, and the contacts of that semiconductor chip 634A are exposed beyond an edge 618 of the second semiconductor chip 634B immediately above that second semiconductor chip. Electrical connections between the first and second chips and the substrate and among the chips can be provided by wire bonds 635 which electrically connect adjacent chips within the stack of semiconductor chips, or wire bonds 637 which electrically connect the chips directly to the package substrate 662.

Figure 13:
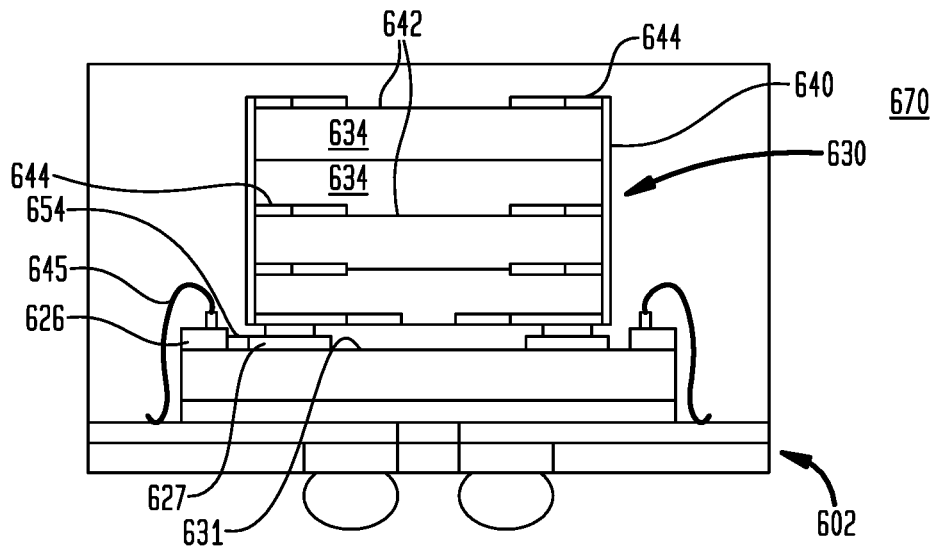
FIG. 13 is a sectional view illustrating a microelectronic package according to an embodiment of the invention.

FIG. 13 illustrates a microelectronic package 670 according to a further variation of the embodiment described above relative to FIG. 10, in which connections between contacts of the one or more second semiconductor chips 634 can include traces or leads 640 which extend along one or more edges of a unit of stacked semiconductor chips 630, i.e., along edges of the semiconductor chips 634 within such unit 630. Unit 630 is mounted and electrically interconnected with contacts 627 of the first semiconductor chip 632, such as with a bond metal, e.g., solder, tin, gold, indium, a eutectic, or electrically conductive bumps, or both, which may in some cases include conductive posts, e.g., micropillars. Traces 654 may extend along a face 631 of the first semiconductor chip from the contacts 627 to second contacts 626, which in turn can be electrically connected with the substrate, such as through wire bonds 645.

The electrical connections between the second semiconductor chips 634 may further include traces 644 which extend along front faces of the second semiconductor chips 634. As further shown in FIG. 13, the front faces 642 of the second semiconductor chips may face upwardly away from the substrate 602 or downwardly towards the substrate 602.

Figure 14:
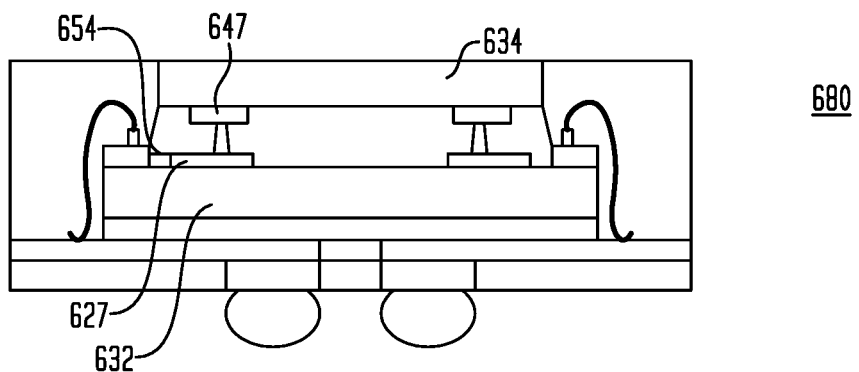
FIG. 14 is a sectional view illustrating a microelectronic package according to an embodiment of the invention.

FIG. 14 further illustrates a microelectronic package 680 in which a second semiconductor chip 634 has contacts 647 facing contacts 627 of the first chip and joined thereto in flip-chip manner, such as through a bond metal, e.g., solder, tin, gold, indium, a eutectic, or electrically conductive bumps, or both. Traces 654 may electrically connect the contacts 627 with other contacts 626 on the first chip which are electrically connected to the substrate, such as through wire bonds.

Figure 15A:
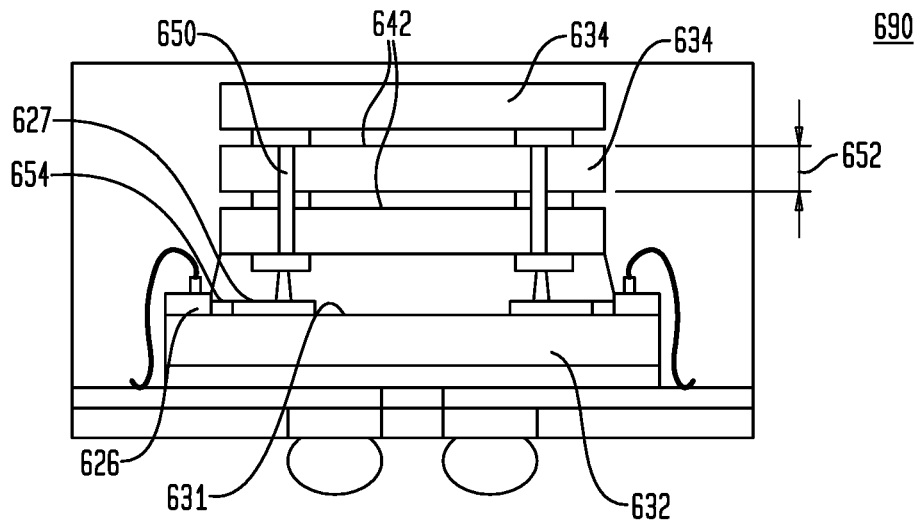
FIG. 15A is a sectional view illustrating a microelectronic package according to an embodiment of the invention.

FIG. 15A further illustrates a microelectronic package 690 according to a particular example in which the one or more second semiconductor chips 634 are electrically connected with one another by through-silicon-vias ("TSVs") 650 which extend in a direction of the thicknesses 652 of at least some of the second semiconductor chips 634, i.e., in a direction normal to the faces 642 of the chips 634. As seen in FIG. 15A, in one example, the TSVs 650 can be electrically connected with contacts 627 of the first semiconductor chip 632, such as through a bond metal, e.g., solder, tin, gold, indium, a eutectic, or electrically conductive bumps, or both, which may in some cases include conductive posts, e.g., micropillars. Traces 654 may extend along a face 631 of the first semiconductor chip from the contacts 627 to second contacts 626, which in turn can be wire-bonded to the substrate.

In one example, information or signals received at terminals of the package 690, such as at the first terminals, the second terminals, or both, can be received by the first semiconductor chip 632 through wire bonds 645 which are joined to substrate contacts 636, which in turn are joined to such terminals of the microelectronic package. The first semiconductor chip 632, operating as a buffer element, can then regenerate the received information or signals and then transfer the regenerated information or signals to the one or more second semiconductor chips, e.g., through the connections between the first and second chips 632, 634 and through the TSVs 650 within the stack of second chips 634.

Figure 15B:
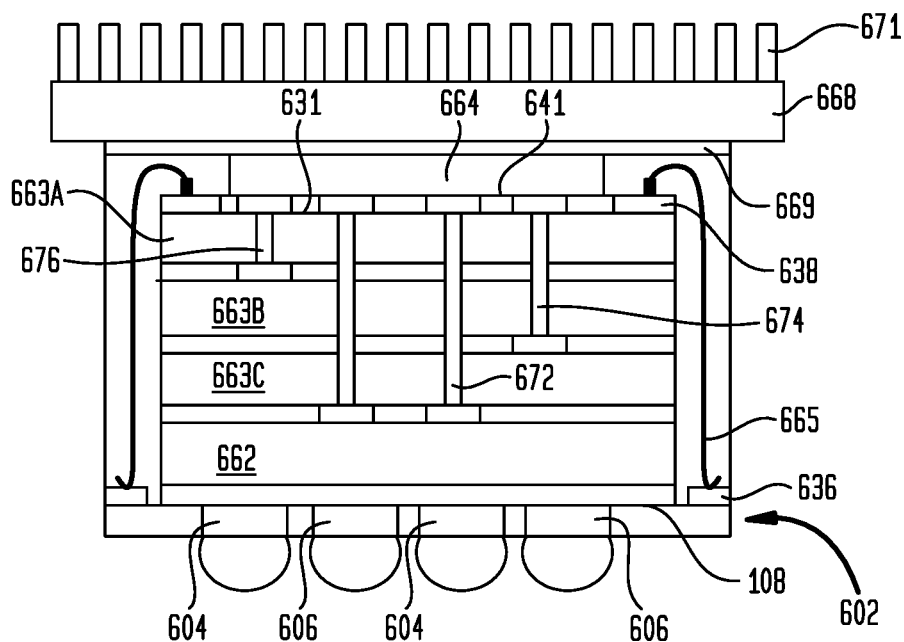
FIG. 15B is a sectional view illustrating a microelectronic package according to an embodiment of the invention.

FIG. 15B illustrates a variation of the microelectronic package shown in FIG. 15A. Unlike the package shown in FIG. 15A, semiconductor chip 664, which is configured to regenerate or at least partially decode address information or other information, e.g., regenerate signals for transfer to other semiconductor chips in the package, is not located adjacent to the first surface 108 of the substrate 602. Rather, in this case, the semiconductor chip 664 can be disposed at a position within the package that overlies one or more other semiconductor chips. For example, as shown in FIG. 15B, chip 664 at least partially overlies semiconductor chip 662 that is disposed adjacent to the first surface 108 of the substrate 602 and chip 664 at least partially overlies semiconductor chips 663A, 663B and 663C which are disposed atop semiconductor chip 662. In one example, semiconductor chips 662 and 663A, 663B and 663C may include memory storage arrays. As in the examples described above, such chips 662, and 663A, 663B and 663C may each incorporate circuits configured to buffer, e.g., temporarily store, data that is to be written to such chip, or data that is being read from such chip, or both. Alternatively, the chips 662, and 663A, 663B and 663C may be more limited in function and may need to be used together with at least one other chip which is configured to temporarily store data that is to be written to such chip or data that is being read from such chip, or both.

Semiconductor chip 664 can be electrically connected to terminals of the microelectronic package, e.g., to grids in which the first terminals 604 and the second terminals 606 are disposed, through electrically conductive structure, e.g., wire bonds 665, which partially overlies a front face 631 of semiconductor chip 663A and which connects to contacts 636 exposed at the first surface 108 of the substrate. The electrically conductive structure, e.g., wire bonds 665, can electrically connect to semiconductor chip 664 through contacts 638 on a chip 663A and through conductors (not shown) which extend along the face 631 of chip 663A or along confronting face 641 of chip 664, or which conductors extend along the faces 631, 641 of both of the chips 663A, 664. As indicated above, semiconductor chip 664 may be configured to regenerate or at least partially decode signals or information that it receives through the conductive structure, e.g., wire bonds 665, and be configured to transfer the regenerated or at least partially decoded signals or information to other chips within the package such as to chips 662, and 663A, 663B and 663C.

As further seen in FIG. 15B, semiconductor chips 662, 663A, 663B and 663C can be electrically connected to semiconductor chip 664 and to one another by a plurality of through silicon vias 672, 674 and 676 which can extend through one, two or three or more of such chips. Each such through silicon via may electrically connect with wiring, e.g., conductive pads or traces of two or more of the semiconductor chips 662, 663A, 663B and 663C and 664 within the package. In a particular example (not shown), through silicon vias may extend through the thicknesses of all semiconductor chips 662, 663A, 663B and 663C, even though each through silicon via may not electrically connect with each such semiconductor chip through which it extends.

As further seen in FIG. 15B, a heat sink or heat spreader 668, which may include a plurality of fins 671, can be thermally coupled to a face of semiconductor chip 664, e.g., a rear face 633 thereof, such as through a thermally conductive material 669 such as thermal adhesive, thermally conductive grease, or solder, among others.

The microelectronic assembly 695 shown in FIG. 15B may be configured to operate as a memory module capable of transferring a designated number of data bits per cycle onto or off of the microelectronic package through the first and second terminals provided therefor on the substrate. For example, the microelectronic assembly may be configured to transfer a number of data bits such as thirty-two data bits, sixty-four data bits, or ninety-six data bits, among other possible configurations, to or from an external component such as a circuit panel which can be electrically connected with terminals 604, 606. In another example, when the bits transferred to and from the package include error correction code bits, the number of bits transferred per cycle to or from the package may be thirty-six bits, seventy-two bits or one hundred eight bits. Other data widths are possible than those which are specifically described here.

Figure 16:
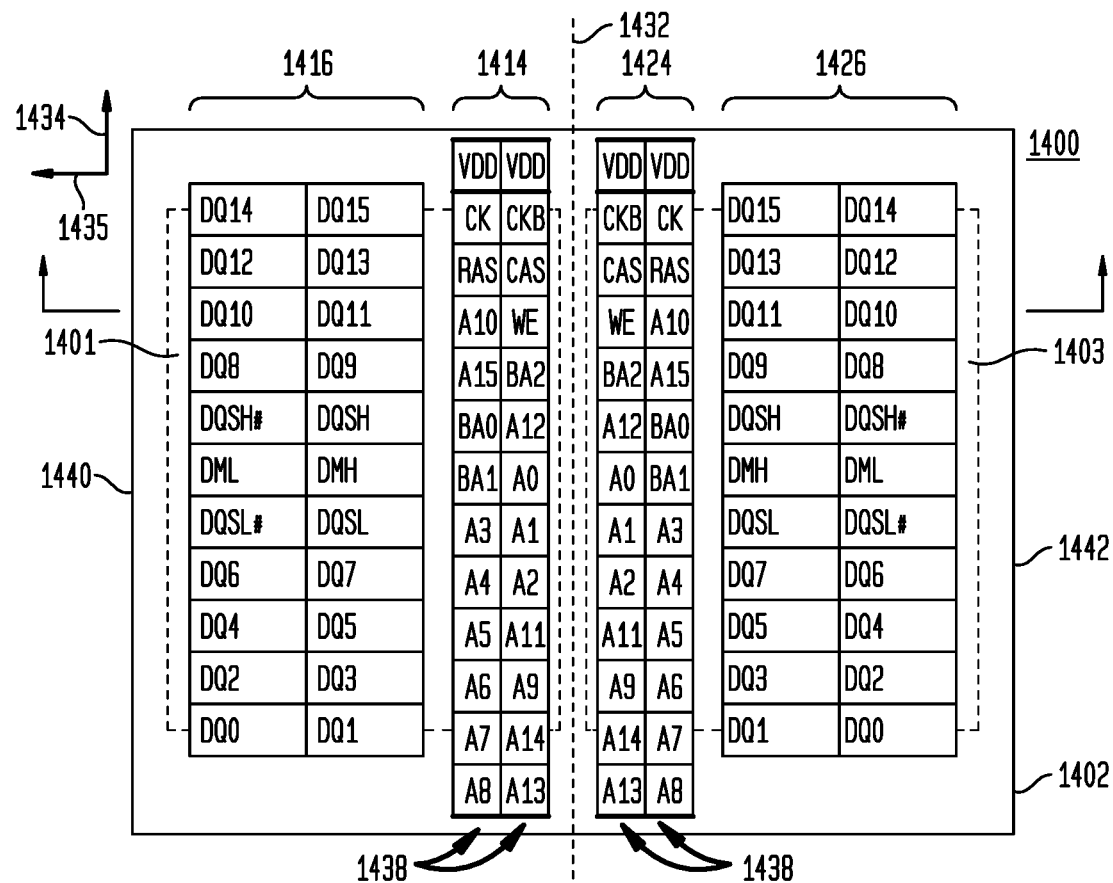
FIG. 16 is a plan view illustrating a microelectronic package according to an embodiment of the invention.
Figure 17:
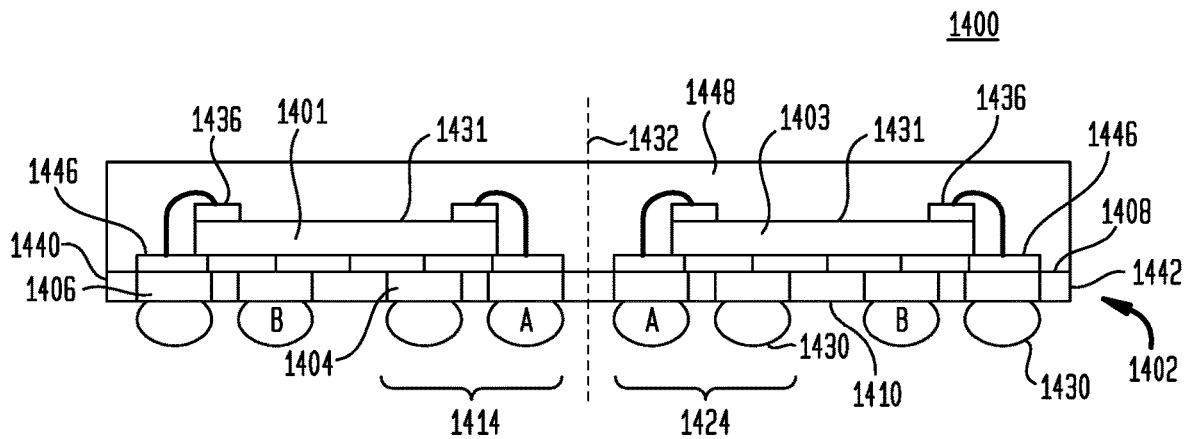
FIG. 17 is a sectional view further illustrating a microelectronic package as seen in FIG. 16.
Figure 18:
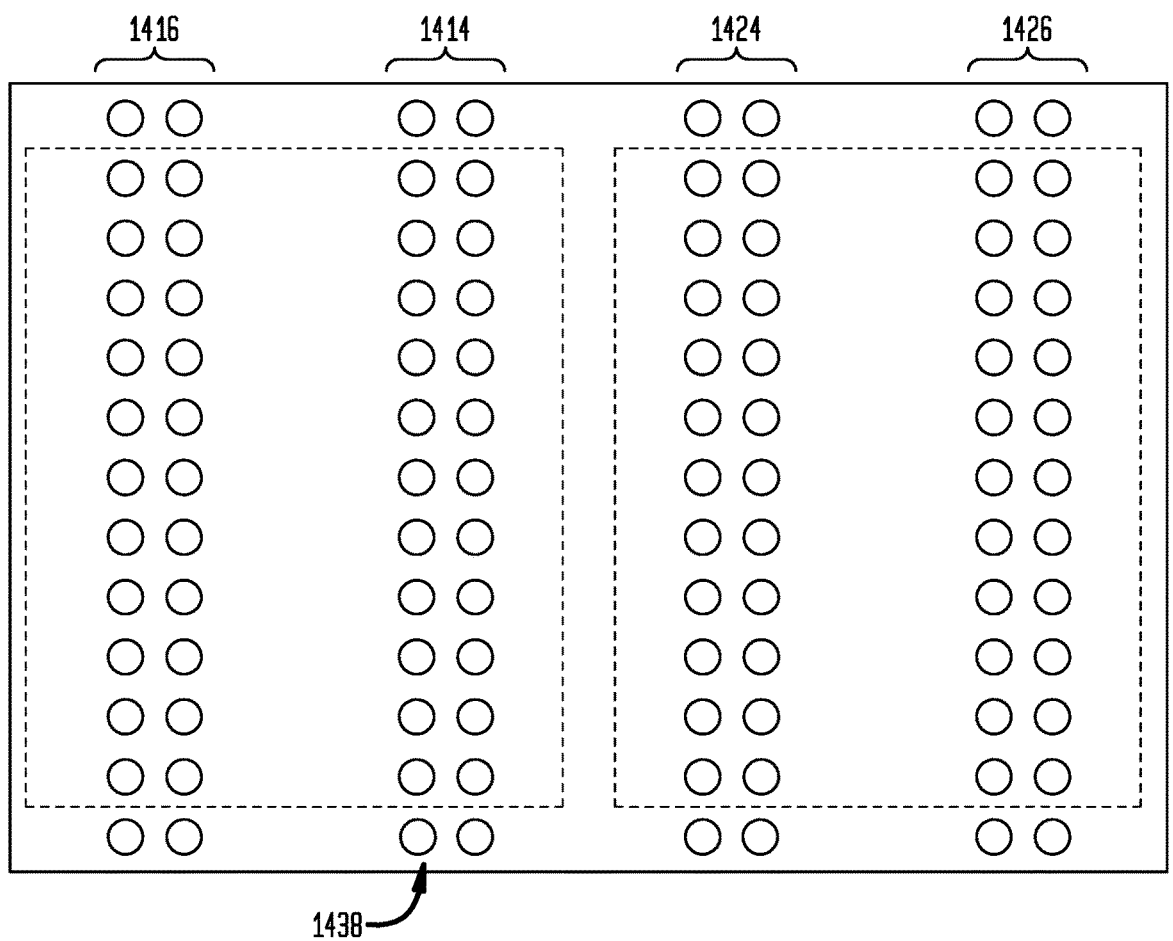
FIG. 18 is a plan view further illustrating a microelectronic package according to an embodiment of the invention as seen in FIG. 16.

FIGS. 16-18 illustrate a microelectronic package 1400 according to another embodiment of the invention in which the first terminals on the package are disposed at locations within first and second parallel grids 1414, 1424, each grid 1414, 1424 being configured to carry the above-noted address information. In a particular embodiment, the first terminals in each grid can be configured to carry all of a group of the command-address bus signals: i.e., command signals, address signals, bank address signals and clock signals which are transferred to the microelectronic package, wherein the command signals include write enable, row address strobe, and column address strobe signals, and the clock signals can be used for sampling the address signals. The terminals in the grids 1414, 1424 are electrically connected with corresponding contacts of the microelectronic elements 1401, 1403 within the package 1400 and each grid is constructed to conduct all of the above-noted signals of the command-address bus to a microelectronic element within the package. In addition, as specifically shown in FIG. 16, and as further described below, the signal assignments of the terminals in the first grid 1414 are a mirror image of the signal assignments of the terminals in the second grid 1424.

Providing duplicate sets of first terminals in first and second parallel grids in which the signal assignments in one grid are a mirror image of the signal assignments in the other grid can help reduce the lengths of stubs in an assembly of first and second microelectronic packages mounted opposite one another to a circuit panel. When first and second microelectronic packages are connected to opposite mounting surfaces of a circuit panel with the circuit panel electrically interconnecting the packages, each of the first terminals of the first grid of the first package can be aligned within one ball pitch of the corresponding first terminal of the second, mirror image grid of the second package to which it is electrically connected. In addition, each of the first terminals of the first grid of the second package can be so aligned within one ball pitch of the corresponding first terminals of the second, mirror image grid of the first package to which they connect. As a result, each first terminal of the first package can be electrically connected with a corresponding first terminal of the second package, with the mounting locations of each pair of terminals on the opposite circuit panel surfaces being within one ball pitch of each other in orthogonal x and y directions parallel to one of the surfaces of the circuit panel. In some cases, the mounting locations of each pair of connected terminals on the opposite circuit panel surfaces may even be coincident with one another. Accordingly, the lengths of the electrical connections through the circuit panel between pairs of electrically connected first terminals of the first and second packages can be significantly reduced, in that the terminals in each of these pairs of electrically connected first terminals may be coincident with one another, or otherwise aligned within one ball pitch of one another in x and y orthogonal directions along the first circuit panel surface.

The circuit panel construction may also be simplified in an assembly having this construction because the routing between each electrically connected pair of first terminals can be mostly in a vertical direction, i.e., in a direction through the thickness of the circuit panel. That is, via connections on the circuit panel may be all that is needed to electrically connect each pair of corresponding first terminals of the packages mounted to the opposite surfaces of the circuit panel.

Moreover, the number of global routing layers of wiring on the circuit panel required to route the above-noted address information on a bus 36 (FIG. 7B) along the circuit panel between connection sites where respective pairs of microelectronic packages are connected can also be reduced when the microelectronic packages attached thereto are constructed according to the principles herein. Specifically, the number of global routing layers required to route such signals along the circuit panel may in some cases be reduced to two or fewer routing layers. However, on the circuit panel, there may be a greater number of global routing layers which carry signals other than the above-noted information or signals on a bus 36.

The microelectronic package may also have second terminals other than the first terminals, such terminals typically being configured to carry signals other than the above-noted command-address bus signals. In one example, the second terminals can include terminals used for carrying uni-directional or bi-directional data signals to and or from the microelectronic element, and data strobe signals, as well as data masks and ODT or "on die termination" signals used to turn on or off parallel terminations to termination resistors. Signals or reference potentials such as chip select, reset, power supply voltages, e.g., Vdd, Vddq, and ground, e.g., Vss and Vssq, may also be carried by the second terminals; none of the signals or reference potentials needs to be carried by the first terminals. In some embodiments it is possible for some or all terminals configured to carry signals other than the command-address bus signals to be disposed as second terminals in any locations on the package.

Alternatively, in some embodiments it is possible for some or all terminals which are configured to carry signals other than the command-address bus signals to also be disposed in the first grid and within the second, mirror image grid of first terminals on the package. In this way, it may be possible to reduce the stub lengths in the electrical connections provided on a circuit panel between these corresponding first terminals, as described above.

In other embodiments, some or all of the terminals which are configured to carry signals other than the command-address bus signals can be arranged as a set of second terminals in a third grid on the package surface, and another set of the second terminals can be arranged in a fourth grid on the same package surface, in which the signal assignments of the second terminals in the third grid are a mirror image of the signal assignments of the second terminals in the fourth grid. In this way, similar to the connections between corresponding first terminals of first and second packages as described above, the lengths of the electrical connections through the circuit panel between pairs of electrically connected second terminals of the first and second packages can be significantly reduced, in that the terminals in each of these pairs of electrically connected second terminals may be coincident with one another, or otherwise aligned within one ball pitch of one another. Moreover, benefits similar to those described above for reducing stub lengths and simplifying the construction of a circuit panel for the connections between the first and second packages may be obtained when second terminals of a microelectronic package are arranged in this way.

Referring to FIG. 17, the package 1400 can include first and second microelectronic elements 1401, 1403 each being configured, i.e., constructed to predominantly provide memory storage array function, in that each of the first and second microelectronic elements 1401, 1403 has a greater number of active devices, such as transistors which are configured to provide memory storage array function than any other function, as indicated above. The first and second microelectronic elements have element contacts 1436 at faces 1431 of the microelectronic elements which face away from the substrate 1402 and are electrically connected with corresponding substrate contacts 1446 exposed at the first surface 1408 of the substrate, as seen in FIG. 17.

As seen in FIGS. 16-17, the package 1400 can have first terminals 1414, 1424 and second terminals 106 for electrically and mechanically connecting the package 1400 with a component external to the package 1400, such as a circuit panel, for example. The terminals can be electrically conductive pads, posts, or other electrically conductive structure. In the example seen in FIG. 17, joining units 1430, which may include a bond metal such as solder, tin, indium, gold, or a eutectic material, among others, or other conductive bond material, may be attached to the first and second grids 1404, 1406 of terminals. The first terminals 1404 and the second terminals 1406 can be electrically connected with the substrate contacts 1446 through electrically conductive structure on the substrate, such as traces and vias, for example.

An arrangement of the first terminals in the first and second grids 1414, 1424 of the package can be as particularly shown in FIG. 16. In one example, each grid 1414, 1424 may include first and second parallel columns 1438 of terminals. The columns 1438 of terminals in each grid can be adjacent to one other. Alternatively, although not shown in FIG. 16, at least one terminal may be disposed between the first and second columns of terminals. As seen in FIG. 16, the signal assignments of the first terminals in the second grid 1424 are a mirror image of the signal assignments 1424 of the first terminals in the first grid 1414. Stated another way, the signal assignments of the first terminals in the first and second grids are symmetric about an axial plane 1432 which extends in a direction orthogonal to the surface 1410 of the substrate and intersects the surface 1410 along a line centered between the first and second grids 1414, 1424, the axial plane 1432 in this case extending in a direction 1434 in which columns 1438 of the first terminals extend. With the signal assignments in the second grid 1424 being a mirror image of those in the first grid 1414, a first terminal 1404 of the first grid 1414 which is assigned to carry the signal CK (clock) is in the same relative vertical position (in direction 1434) within the grid as the corresponding first terminal 1404 of the second grid 1414 which is assigned to carry the signal CK. However, since the first grid 1414 contains two columns 1438 and the terminal of the first grid 1414 assigned to carry the signal CK is in the left column thereof among the two columns 1438 of the first grid. The mirror image signal assignment requires that the corresponding terminal of the second grid 1424 assigned to carry the signal CK is in the right column 1438 among the two columns of the second grid. Another result of this arrangement is that the terminal assigned to carry the signal WE (write enable) is also in the same relative vertical position within the grid in each of the first and second grids 1414, 1424. However, in the first grid 1414, the terminal assigned to carry WE is in the right column among the two columns 1438 of the first grid, and the mirror image arrangement requires that the corresponding terminal of the second grid 1424 assigned to carry the signal WE is in the left column 1438 among the two columns of the second grid 1424. As can be seen in FIG. 16, the same relationship applies for each first terminal in each of the first and second grids, at least for each first terminal assigned to carry a command-address bus signal as discussed above.

The axial plane 1432 about which the signal assignments of the first terminals are symmetric can be located at various positions on the substrate. In a particular embodiment, the axial plane can intersect the surface 1410 of the substrate along a line on the surface that is located equidistant from first and second opposed edges 1440, 1442 of the substrate, particularly when the columns 1438 of the first terminals extend in a direction parallel to the edges 1440, 1442 and the first and second grids are disposed at locations which are symmetric about this central axis.

In a particular example, the first terminals 1404 of the first grid 1414 can be electrically connected with the first microelectronic element 1401, and the first terminals 1404 of the second grid 1424 can be electrically connected with the second microelectronic element 1403. In such case, the first terminals 1404 of the first grid 1414 may also be not electrically connected with the second microelectronic element 1403, and the first terminals 1404 of the second grid 1424 of the package 1400 may also be not electrically connected with the first microelectronic element 1401. In yet another example, the first terminals 1404 of each of the first and second grids 1414 can be electrically connected with each of the first and second microelectronic elements 1401, 1403.

As mentioned above, the second terminals 1406 can be configured to carry information or signals other than the above-noted address information or signals of the command-address bus. In one example, the second terminals 1406 can include terminals used for carrying uni-directional or bi-directional data signals to and or from the microelectronic element, and data strobe signals, as well as data masks and ODT or "on die termination" signals used by the chip to turn on or off parallel terminations to termination resistors. Signals such as chip select, reset, clock enable, as well as reference potentials such as power supply voltages, e.g., Vdd, Vddq, or ground, e.g., Vss and Vssq, can be among the signals carried by either the first terminals 1404 or the second terminals 1406. However, none of these signals or reference potentials needs to be carried by the first terminals 1404. As further shown in FIGS. 16-18, second terminals 1406 can be disposed in a third grid 1416 on the second surface 1410 of the substrate, and another set of the second terminals can be disposed in a fourth grid 1426 on the package surface 1410. In a particular case, the signal assignments of the second terminals in the third grid 1416 can be a mirror image of the signal assignments of the second terminals in the fourth grid 1426, in like manner to that described above for the first and second grids. The third and fourth grids 1416, 1426 can extend in the direction 1434 in which the first and second grids extend and can be parallel to one another. The third and fourth grids may also be parallel to the first and second grids 1414, 1424. Alternatively, each of the third and fourth grids 1416, 1426 can extend in another direction 1435 which is orthogonal to direction 1434.

As shown in FIG. 17, an encapsulant 1448 may overlie the first surface 1408 of the substrate and may contact the microelectronic elements 1401, 1403 therein. In some cases, the encapsulant may overlie surfaces 1431 of the microelectronic elements which face away from the substrate 1402.

Figure 19:
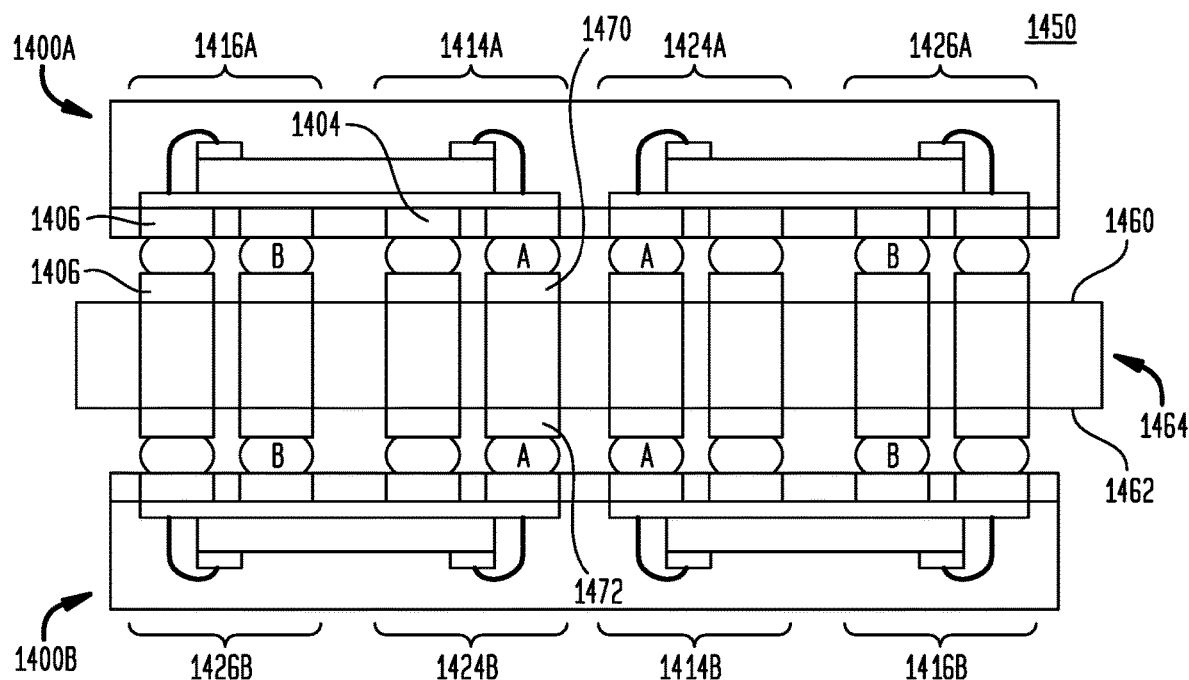
FIG. 19 is a sectional view illustrating a microelectronic assembly incorporating first and second microelectronic packages such as seen in FIG. 16.

FIG. 19 illustrates an assembly 1450 of first and second microelectronic packages 1400A, 1400B, each being a microelectronic package 1400 as described with reference to FIGS. 16-18 above, as mounted to opposite first and second surfaces 1460, 1462 of a circuit panel 1464. The circuit panel can be of various types, such as a printed circuit board used in a dual inline memory module ("DIMM") module, a circuit board or panel to be connected with other components in a system, or a motherboard, among others. The first and second microelectronic packages 1400A, 1400B can be mounted to corresponding contacts 1470, 1472 exposed at the first and second surfaces 1460, 1462 of the circuit panel 1464.

As particularly shown in FIG. 16, because the signal assignments of the first terminals in the second grid 1424 of each package are a mirror image of the signal assignments of the first terminals in the first grid 1414 of each package, when the packages 1400A, 1400B are mounted to the circuit panel opposite one another as in FIG. 19, each first terminal in the first grid 1414A of the first package 1400A is aligned with the corresponding first terminal in the second grid 1424B of the second package 1400B which has the same signal assignment and to which it is electrically connected. Moreover, each first terminal in the second grid 1424A of the first package 1400A is aligned with the corresponding first terminal in the first grid 1414B which has the same signal assignment and to which it is electrically connected. To be sure, the alignment of each pair of connected terminals is within a tolerance, such that each pair of connected terminals can be aligned within one ball pitch of one another in orthogonal x and y directions along the first surface 1460 of the circuit panel 1464.

Thus, as further shown in FIG. 19, a particular first terminal that carries a signal marked "A" in grid 1414A of the first package 1400A is aligned with the corresponding first terminal of grid 1424B of the second package 1400B that carries the same signal "A". The same is also true regarding a particular first terminal that carries a signal marked "A" in grid 1424A of the first package 1400A that is aligned with the corresponding first terminal of grid 1414B of the second package 1400B that carries the same signal "A".

In this way, as further seen in FIG. 19, the lengths of the electrical connections through the circuit panel between each pair of electrically connected first terminals of the first and second packages 1400A, 1400B can be significantly reduced, in that the terminals in each of these pairs of electrically connected second terminals may overlie one another, or at least be aligned within one ball pitch of one another. The reductions in the lengths of these electrical connections can reduce stub lengths in the circuit panel and the assembly, which can help improve the electrical performance, such as reducing settling time, ringing, jitter, or intersymbol interference, among others, for the above-noted signals which are carried by the first terminals and which are transferred to microelectronic elements in both the first and second packages. Moreover, it may be possible to obtain other benefits as well, such as simplifying the structure of the circuit panel or reducing the complexity and cost of designing or manufacturing the circuit panel.

As further shown in FIG. 19, when the second terminals of each package 1400A, 1400B are arranged in third and fourth grids having the specific mirror image arrangement described above with respect to FIGS. 16-18, each second terminal of each package's first grid can be aligned with the corresponding second terminal of the other package's second grid which has the same signal assignment and to which it is electrically connected. Thus, as seen in FIG. 19, each second terminal 1406 in the third grid 1416A of the first package 1400A is aligned with the corresponding second terminal in the fourth grid 1426B of the second package 1400B which has the same signal assignment and to which it is electrically connected. Moreover, each second terminal in the fourth grid 1426A of the first package 1400A is aligned with the corresponding second terminal in the third grid 1416B which has the same signal assignment and to which it is electrically connected. Again, the alignment of each pair of connected terminals is within a tolerance, such that each pair of connected terminals can be aligned within one ball pitch of one another in orthogonal x and y directions along the first surface 1460 of the circuit panel 1464.

Thus, as further shown in FIG. 19, a particular first terminal that carries a signal marked "B" in grid 1416A of the first package 1400A is aligned with the corresponding first terminal of grid 1426B of the second package 1400B that carries the same signal "B" and to which it is electrically connected. The same is also true regarding a particular first terminal that carries a signal marked "B" in grid 1426A of the first package 1400A that is aligned with the corresponding first terminal of grid 1416B of the second package 1400B that carries the same signal "B" and to which it is electrically connected.

Similar to the connections between corresponding first terminals 1404 of first and second packages as described above, in this embodiment, the lengths of the electrical connections through the circuit panel between pairs of electrically connected second terminals 1406 of the first and second packages can be significantly reduced, in that the terminals in each of these pairs of electrically connected second terminals may overlie one another, or at least be aligned within one ball pitch of one another in orthogonal x and y directions parallel to the circuit panel surface. Moreover, benefits similar to those described above for reducing stub lengths and simplifying the construction of a circuit panel for the connections between the first and second packages may be obtained when the second terminals of a microelectronic package are arranged in this way, i.e., terminals which can be assigned to carry signals other than the above-noted signals of the command-address bus.

Figure 20:
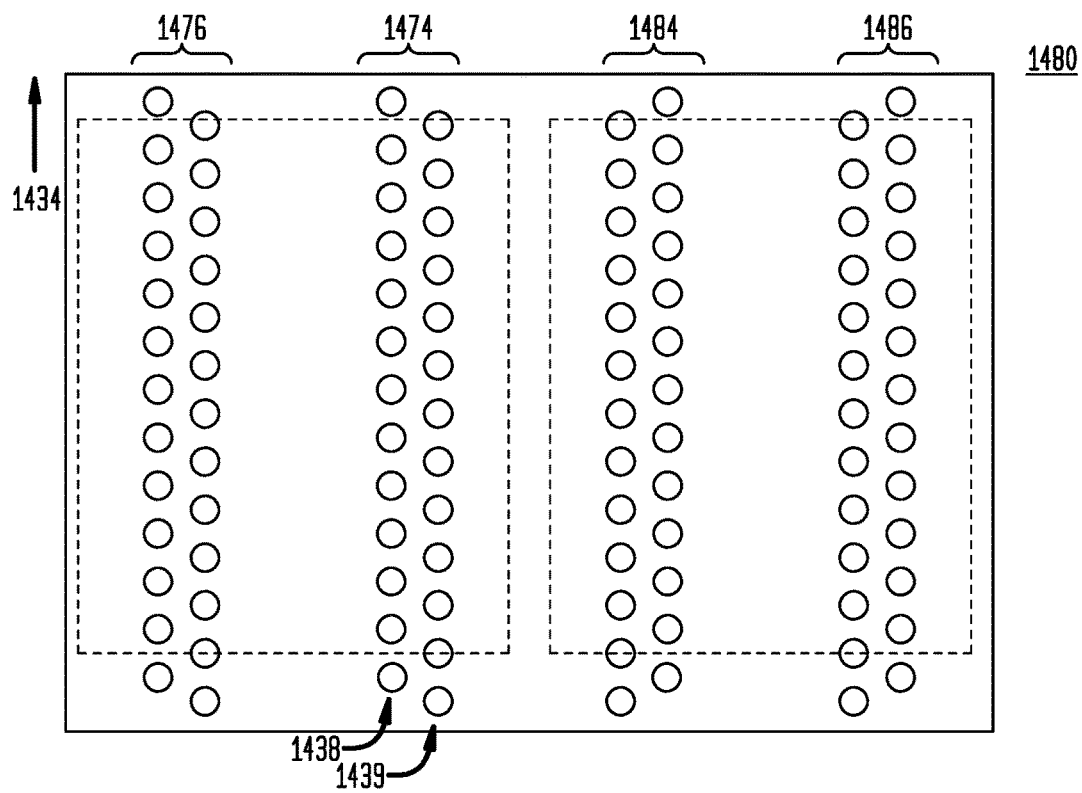
FIGS. 20 and 21 illustrate alternative terminal arrangements in a microelectronic package according to an embodiment of the invention as seen in FIG. 16.

FIG. 20 illustrates a particular arrangement of terminals within respective first grids 1474, 1484, and second grids 1476, 1486 of the package 1480, illustrating a staggered arrangement in which terminals at the same relative vertical position in adjacent columns 1438, 1439 in each grid may be disposed at positions which are offset from one another in the vertical layout direction 1434 of the package.

Figure 21:
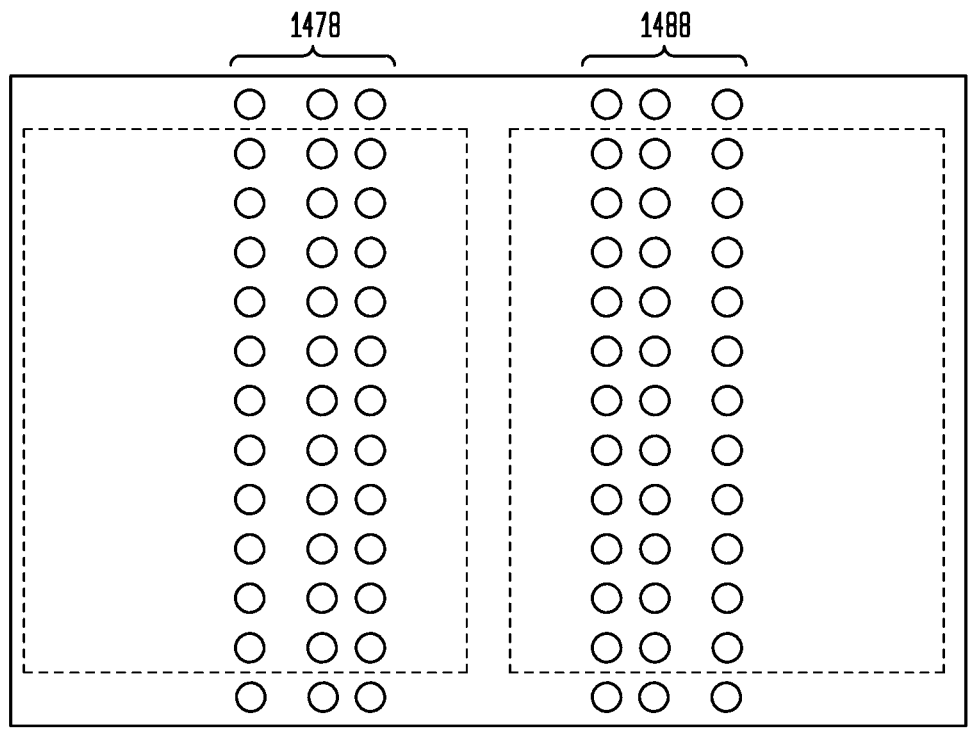

FIG. 21 illustrates a particular arrangement of first terminals in first and second parallel grids 1478, 1488 on a microelectronic package, in which each grid includes three adjacent columns of terminals. As mentioned above, in some embodiments, it may be possible for signals other than the above-noted command-address bus signals to be assigned to terminals within the same grids which also carry the above-noted command-address bus signals. Other arrangements may also be provided in which each of a pair of grids 1478, 1488 having mirror image signal assignments as described above has four columns of terminals rather than two or three.

In a further variation of the embodiment shown in FIGS. 16-18, it is possible for the first terminals arranged to carry the above-noted command-address bus signals to be provided in first and second individual columns of terminals, wherein each respective individual column contains a set of first terminals configured to carry all of the above-noted command address bus signals. The first terminals can further be arranged such that the signal assignments in the first and second columns are a mirror image of each other, in that the signal assignments are symmetric about an axis extending in the same direction in which the first and second columns extend. In this way, the signal assignments of the first terminals in the first column are the same as the signal assignments of the first terminals at the same relative vertical positions in the second column on the package.

Figure 22:
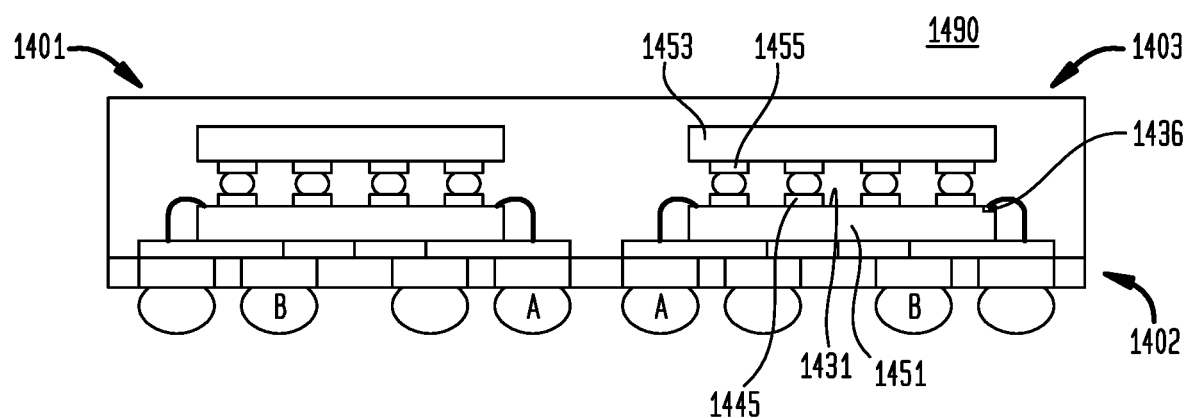
FIG. 22 is a sectional view illustrating a microelectronic package according to a variation of the embodiment of the invention seen in FIG. 16.

FIG. 22 illustrates a microelectronic package 1490 according to yet another variation in which microelectronic elements 1401, 1403 are vertically stacked assemblies of semiconductor chips. Thus, as seen in FIG. 22, one or more of the microelectronic elements 1401, 1403 can include a first semiconductor chip 1451 having a contact-bearing face 1431 facing away from the substrate 1402, and contacts 1436 on the face 1431 wire-bonded to substrate contacts on the substrate 1402 as described relative to FIGS. 16-18 above. In one example, a second semiconductor chip 1453 of such microelectronic element can have contacts 1455 facing corresponding contacts 1445 of the first semiconductor chip 1451 and be joined thereto, such as through electrically conductive bumps, e.g., a bond metal, as described above.

In other variations, one or more of the microelectronic elements 1401, 1403 in the package 1490 can be constructed as described above with reference to FIG. 10, 11-12, 13, 14 or 15.

Figure 23:
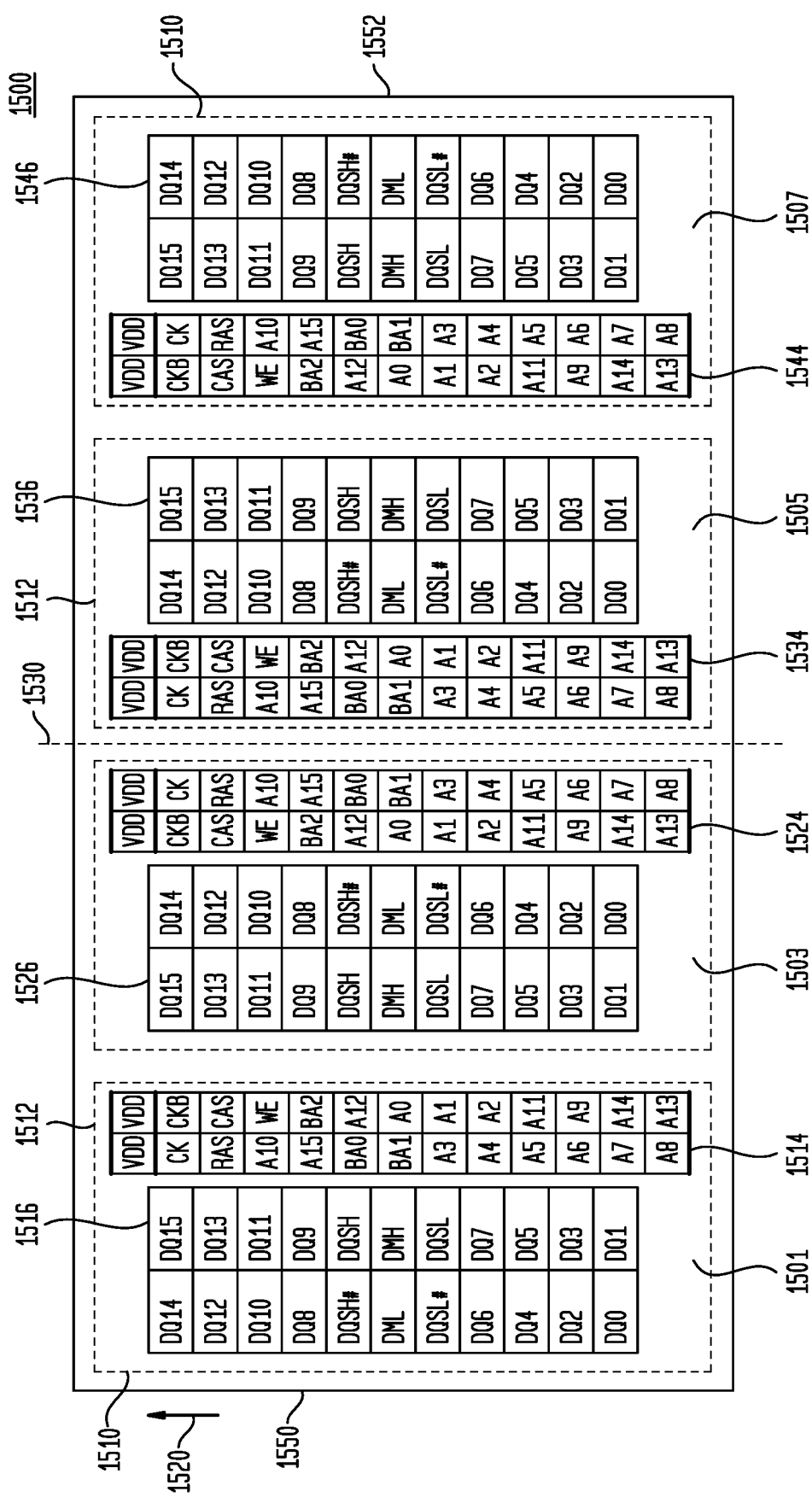
FIG. 23 is a plan view illustrating a microelectronic package according to an embodiment of the invention.

FIG. 23 illustrates a microelectronic package 1500 according to a variation of the above-described embodiment of FIGS. 16-18 in which first, second, third and fourth microelectronic elements 1501, 1503, 1505 and 1507 are incorporated therein. The package further depicts four grids 1514, 1524, 1534, 1544 of first terminals assigned to carry the above-noted signals of the command-address bus. As in the above-described example, each grid of first terminals can be electrically connected with just one of the microelectronic elements, or can be connected to two or more of the microelectronic elements. FIG. 23 illustrates one possible arrangement of the package 1500 showing the grids 1514, 1524, 1534, and 1544 of first terminals and one possible arrangement of grids 1516, 1526, 1536, and 1546 of second terminals.

As shown in FIG. 23, each of the microelectronic elements typically has two "long" parallel edges 1510, which extend in the same direction as the direction in which the one or more columns of contacts on the microelectronic element extend, as described above relative to FIGS. 6B, 6C, 6D, and 7A. In one example, these "long" edges may each be longer than two short parallel edges 1512 of each microelectronic element. In another example, these "long" edges 1510 may merely extend in the same direction as the one or more columns of contacts, while in fact being shorter than the "short" edges 1512 of the same microelectronic element. References to the "long" and "short" edges of microelectronic elements in each of the packages described below incorporate these definitions.

As further seen in FIG. 23, in this particular variation, two of the grids 1524, 1534 can be disposed close to a centerline 1530 of the package separating microelectronic elements 1503, 1505, while the other grids 1514, 1544 can be disposed near peripheral edges 1550, 1552 of the package.

Figure 24:
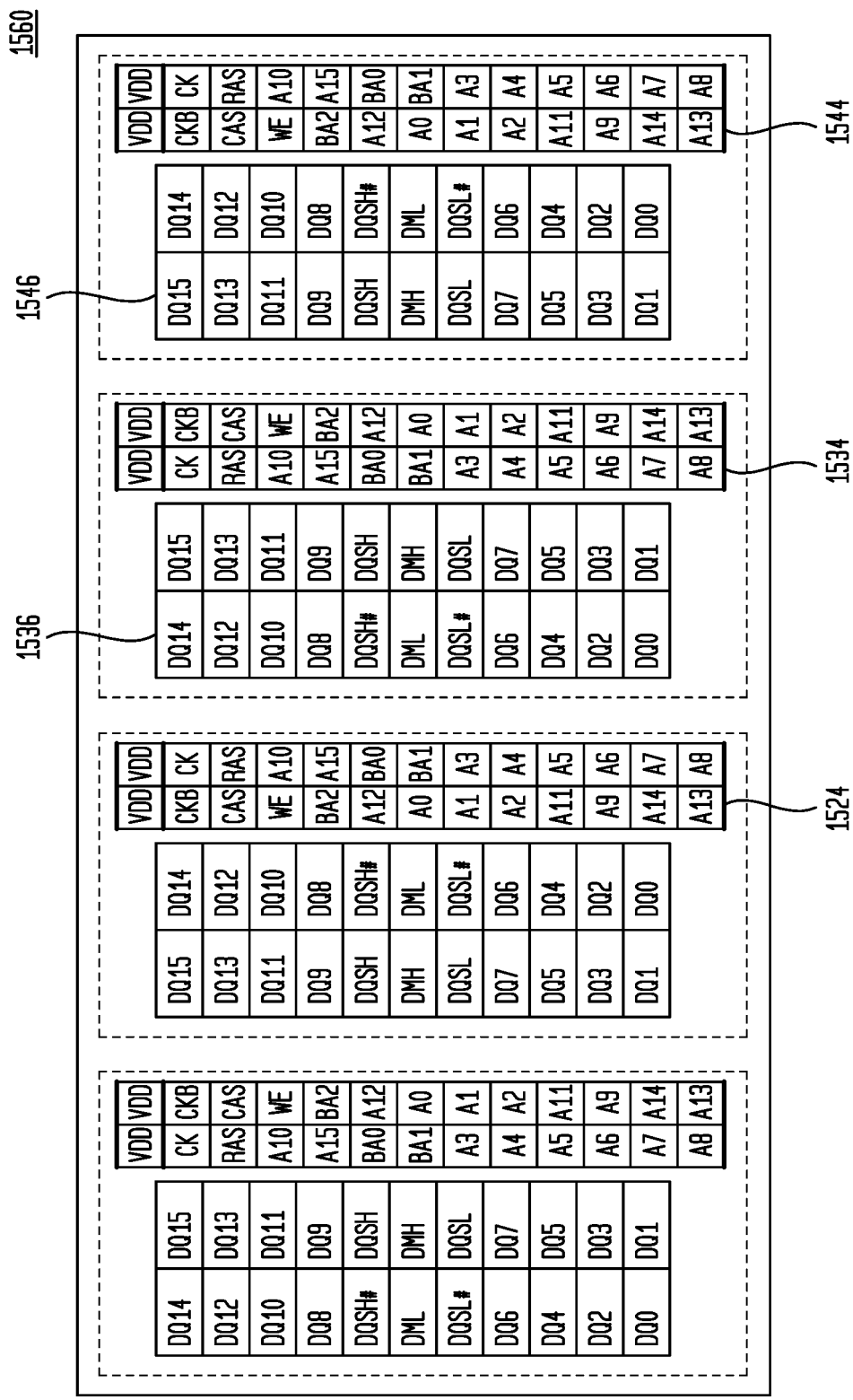
FIG. 24 is a plan view illustrating a microelectronic package according to an embodiment of the invention.

FIG. 24 is a plan view illustrating a package 1560 according to a variation of that shown in FIG. 23, in which the positions of the grids of the first terminals on the package are varied. In this case, viewing the differences between package 1560 and package 1500 of FIG. 23, the position of the grid 1534 within package 1560 is exchanged with the position of the grid 1536 of second terminals, such that the grid 1536 is now disposed between the grids 1524, 1534 of the first terminals. In addition, the position of the grid 1544 within the package 1560 is exchanged with the position of the grid 1546 of second terminals, such that the grid 1546 is now disposed between the grids 1534, 1544 of the first terminals.

Figure 25:
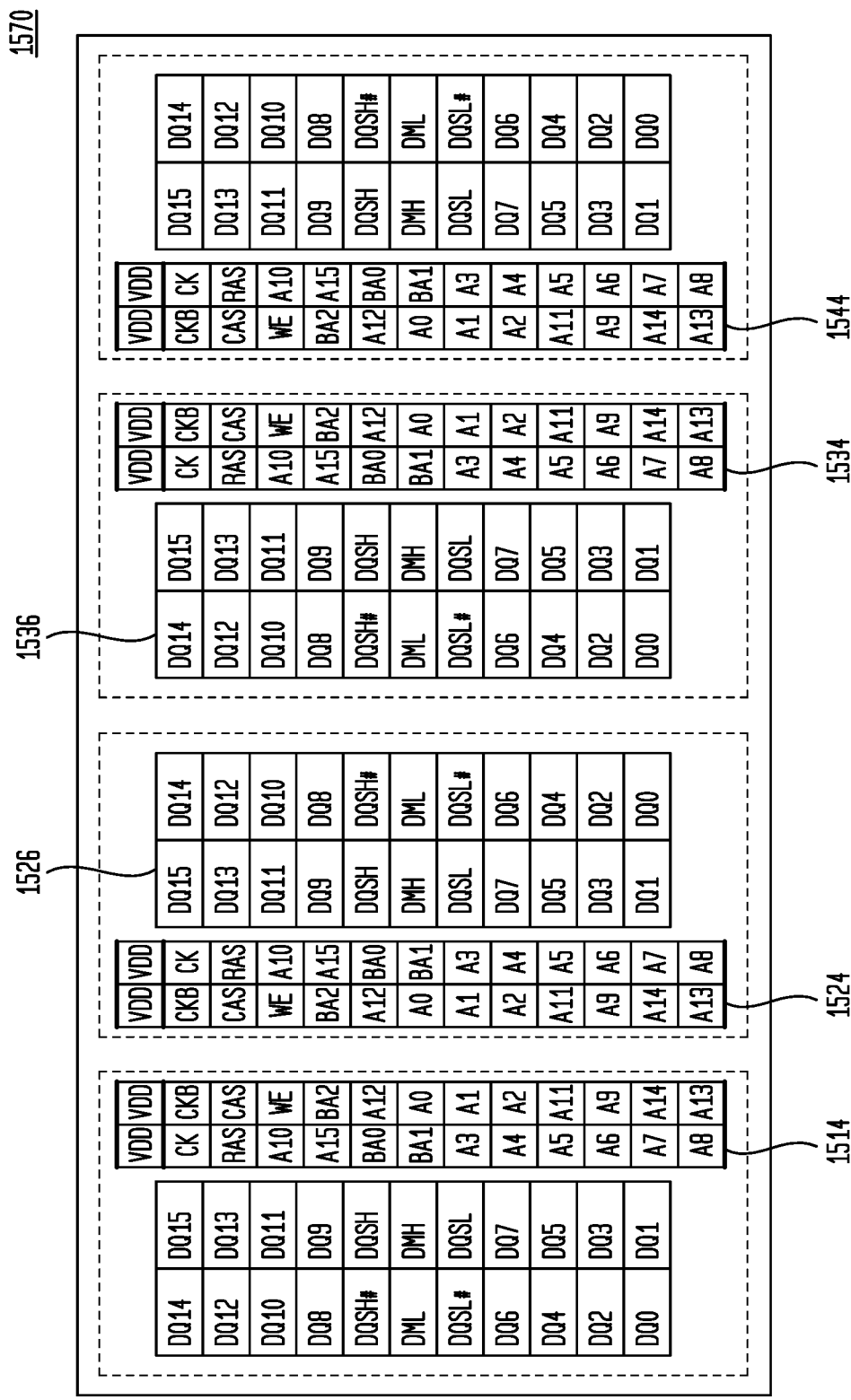
FIG. 25 is a plan view illustrating a microelectronic package according to an embodiment of the invention.

FIG. 25 is a plan view illustrating a package 1570 according to another variation of that shown in FIG. 23, in which the positions of the grids of the first terminals are varied. In this case, viewing the differences between package 1570 and package 1500 of FIG. 23, the position of the grid 1524 of first terminals within the package 1570 is exchanged with the position of the grid 1526 of second terminals, such that the grid 1524 is now disposed between and adjacent to grids 1514, 1526. In addition, the position of the grid 1534 within the package 1570 is exchanged with the position of the grid 1536 of second terminals relative to that shown in FIG. 23, such that the grid 1534 is now disposed between and adjacent to grids 1536, 1544.

Figure 26:
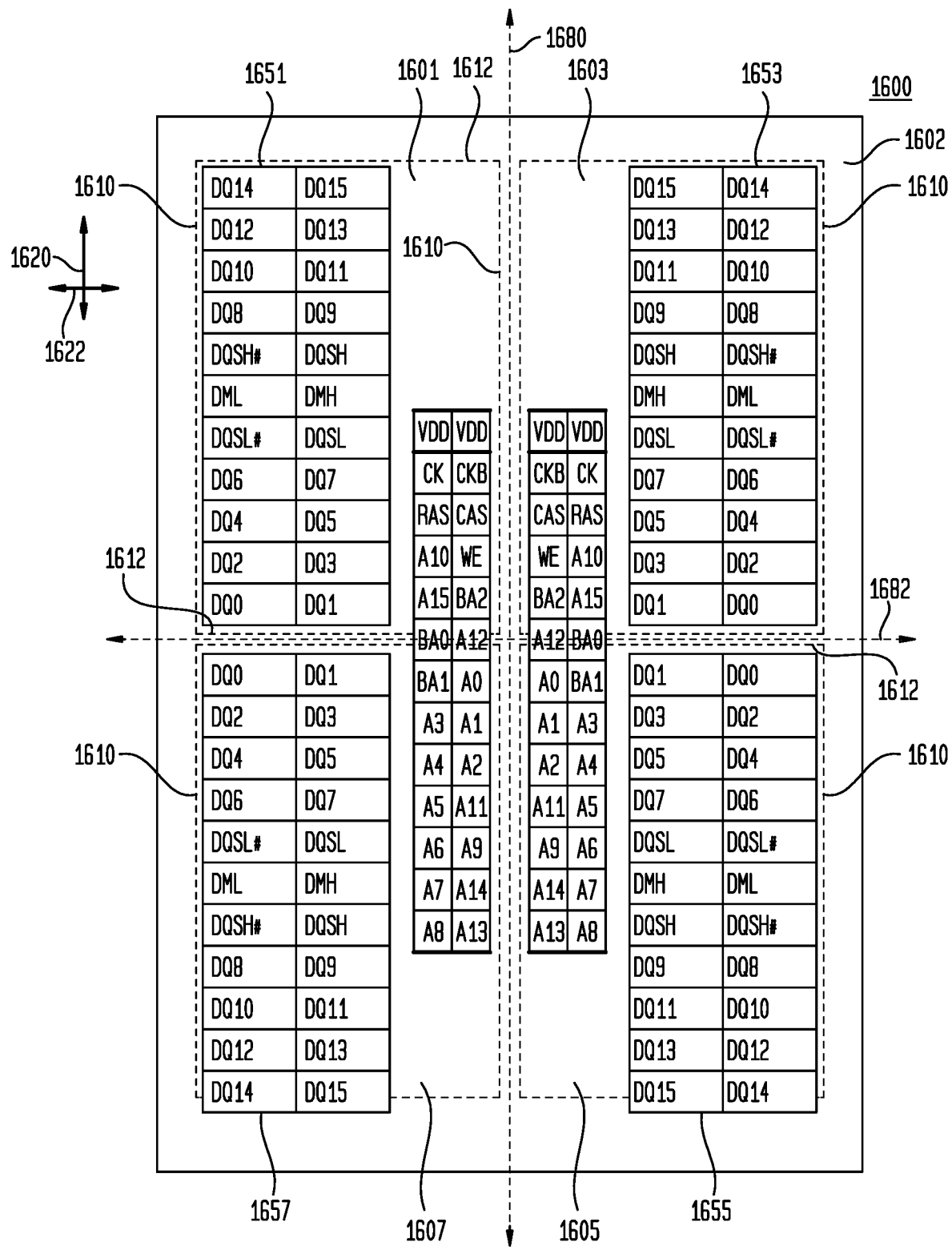
FIG. 26 is a plan view illustrating a microelectronic package according to an embodiment of the invention.

FIG. 26 is a plan view illustrating a package 1600 according to a further variation of the above-described embodiment of FIGS. 16-18 in which first, second, third and fourth microelectronic elements 1601, 1603, 1605, 1607 are arranged in a matrix on the substrate, wherein each microelectronic element has parallel first edges 1610 which extend in a first direction 1620, and parallel second edges 1612 which extend in a second direction 1622 parallel to the first surface 1408 (FIG. 17) of the substrate and transverse to the first direction, such as orthogonal to the first direction 1620. The first edges 1610 may be "long edges" when such edges represent a dimension of a length of the respective microelectronic element, and the second edges 1612 may be "short edges" when such edges represent a dimension of the respective microelectronic element which is shorter than the length. Alternatively, the second edges 1612 may be "long edges" when such edges represent a dimension of a length of the respective microelectronic element, and the first edges 1610 may be "short edges" when such edges represent a dimension of the respective microelectronic element which is shorter than the length.

As seen in FIG. 26, the microelectronic elements can be arranged with the first edges 1610 of microelectronic elements 1601, 1603 adjacent and parallel to one another. The first edges 1610 of microelectronic elements 1605, 1607 can be adjacent and parallel to one another, as well. The microelectronic elements are also arranged such that one second edge 1612 of microelectronic element 1601 is adjacent and parallel to the second edge 1612 of the other microelectronic element 1607, and one second edge 1612 of microelectronic element 1603 is adjacent and parallel to one second edge 1612 of the other microelectronic element 1605. Each of the first edges 1610 of microelectronic element 1601 can in some cases be collinear with the first edges 1610 of microelectronic element 1607. Likewise, each of the first edges 1610 of microelectronic element 1603 can in some cases be collinear with the first edges 1610 of microelectronic element 1605.

Grids 1651, 1653, 1655, 1657 of second terminals, which may overlie portions of respective microelectronic elements 1601, 1603, 1605, 1607 and are electrically connected therewith, can have terminals disposed in any suitable arrangement, there being no requirement to place these second terminals in grids in which the signal assignments in any one of the grids 1651, 1653, 1655, or 1657 are a mirror image of the signal assignments of the terminals in any one of the other grids 1651, 1653, 1655, or 1657.

In a particular example, the signal assignments of the second terminals in any one of the grids 1651, 1653, 1655, or 1657 can be a mirror image of the signal assignments of the second terminals in one or two other ones of the grids 1651, 1653, 1655, or 1657, in that the signal assignments of any one of the grids can be symmetric about a vertical axis 1680 in a vertical layout direction parallel to the substrate surface 1602 with respect to the signal assignments of another grid. Alternatively, or in addition thereto, the signal assignments of any one of the grids can be symmetric about a horizontal axis 1682 with respect to the signal assignments of another grid.

For example, as shown in FIG. 26, the signal assignments of grid 1651 are symmetric about the vertical axis 1680 with respect to the signal assignments of the grid 1653, where the vertical axis 1680 extends in a vertical layout direction 1620 which in the example shown is between the grids 1651 and 1653. Also, the signal assignments of the grid 1651 are symmetric about the horizontal axis 1682 with respect to the signal assignments of the grid 1657, where the horizontal axis 1682 can extend in a horizontal layout direction 1622, which in the example shown is between the grids 1651 and 1657. In an alternative arrangement, each of the grids 1651 and 1657 may extend to portions of the substrate surface on both sides of the horizontal axis 1682, and the relationships described above can otherwise be present. Similarly, such arrangement may exist for grids 1653 and 1655.

In the particular example shown in FIG. 26, the signal assignments of the grids 1651 and 1657 are symmetric about the vertical axis 1680 with respect to the signal assignments of the respective grids 1653 and 1655. Also, the signal assignments of the grids 1651 and 1653 are symmetric about the horizontal axis with respect to the signal assignments of the respective grids 1657 and 1655.

Figure 27:
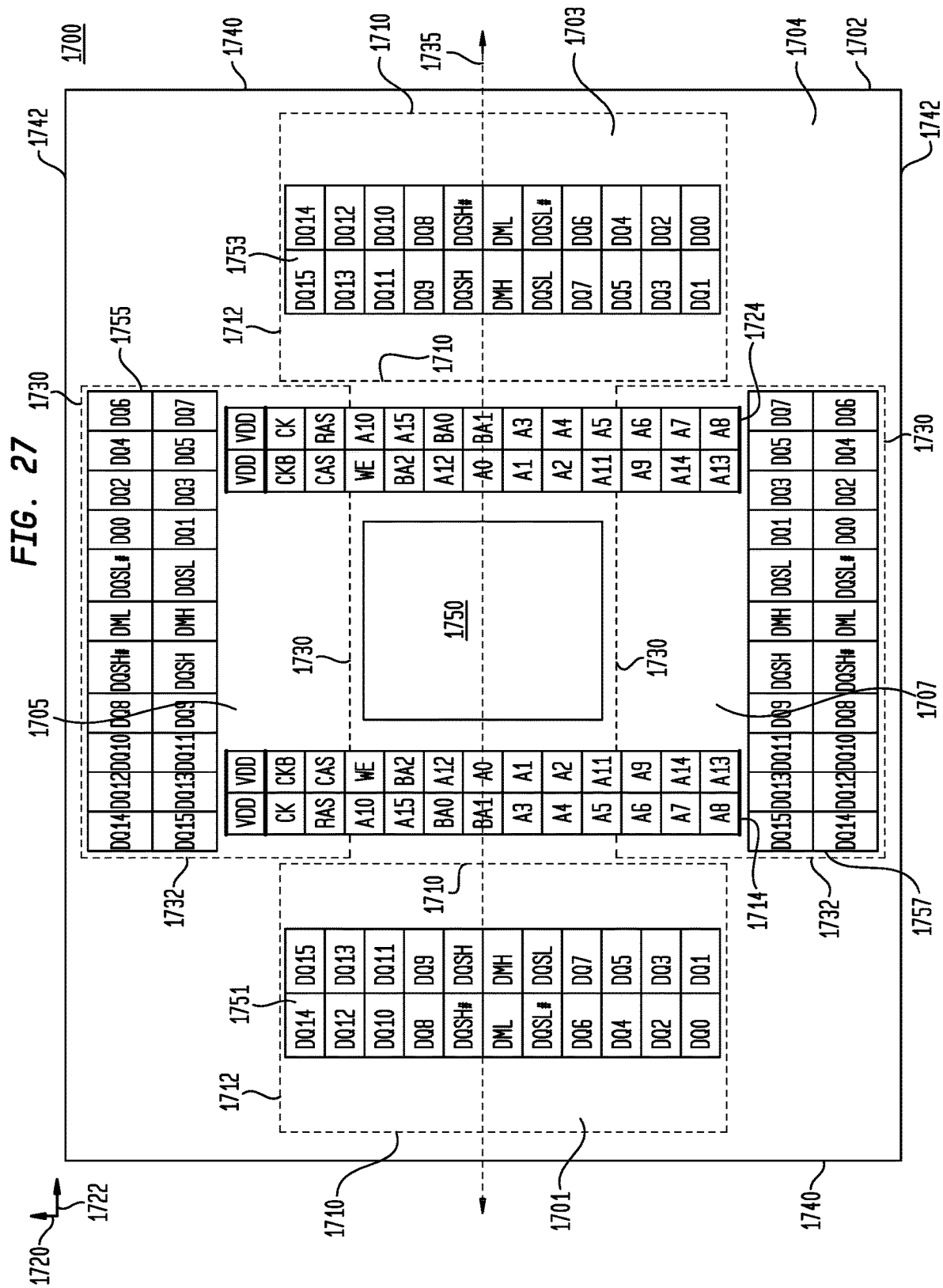
FIG. 27 is a plan view illustrating a microelectronic package according to an embodiment of the invention.

FIG. 27 is a plan view illustrating a microelectronic package 1700 according to another variation of the above-described embodiment (FIG. 23), in which the first edges 1710 of first and second microelectronic elements 1701, 1703 extend in a first direction 1720 parallel to the first peripheral edges 1740 of the terminal-bearing substrate surface 1704, and where the second edges 1712 of microelectronic elements 1701, 1703 extend in a second direction 1722 parallel to the terminal-bearing surface 1704 of the substrate. The package 1700 further includes third and fourth microelectronic elements 1705, 1707. However, the first edges 1730 of the third and fourth microelectronic elements 1705, 1707 extend in the second direction 1722, and the second edges 1732 of the third and fourth microelectronic elements 1705, 1707 extend in the first direction 1720. As further seen in FIG. 27, first and second grids 1714, 1724 of first terminals configured to carry the above-noted command-address bus signals, can be provided in a central region of the substrate surface, away from the substrate's first and second peripheral edges 1740, 1742 where the signal assignments in the second grid 1724 are a mirror image of the signal assignments in the first grid 1714, as described above. In one example as shown in FIG. 27, the first and second grids 1714, 1724 of first terminals may be disposed between adjacent first edges 1710 of the first and second microelectronic elements 1701, 1703 and may overlie portions of the third and fourth microelectronic elements 1705, 1707. Grids of second terminals 1751, 1753, 1755, 1757 may at least partially overlie respective microelectronic elements 1701, 1703, 1705, 1707 to which the second terminals therein electrically connect. As seen in FIG. 27, the signal assignments of the second terminals in grid 1753 can be a mirror image of the signal assignments of the second terminals in the grid 1751. The mirror image signal assignments of terminals in grids 1714, 1724, and grids 1751, 1753 may permit the above-described reduction in stub lengths in a circuit panel to be achieved when two packages 1700 of like configurations are mounted opposite one another on opposite surfaces of the circuit panel.

Grids 1755, 1757 of second terminals, which may overlie portions of microelectronic elements 1705, 1707 and are electrically connected therewith, can have terminals disposed in any suitable arrangement, there being no requirement to place these second terminals in grids in which the signal assignments in one of the grids 1755 are a mirror image of the signal assignments of the terminals in the other grid 1757. However, in a particular example, the signal assignments of the second terminals in a grid 1755 can be a mirror image of the signal assignments of the second terminals in another grid 1757, in that the signal assignments can be symmetric about an axis 1735 extending in a direction 1722 between grids 1755 and 1758. In this case, there can be symmetry about an axis 1735 extending in the horizontal direction of FIG. 27 for these second terminals in the grids 1755, 1757.

Moreover, such configuration can be provided in a microelectronic package in which symmetries in the signal assignments between the grids of first terminals or between the other grids 1751, 1753 of second terminals may optionally be provided. As further illustrated in FIG. 17, the terminals in grids 1755, 1757 may have one or more of the signal class symmetry or modulo-X symmetry as described above with reference to FIG. 5A.

FIG. 27 further illustrates that one or more buffer elements 1750 can be provided as a microelectronic element disposed in a central region of the package 1700 between adjacent edges 1730, 1710 of the first, second, third and fourth microelectronic elements 1701, 1703, 1705, and 1707. Each such buffer element can be used to provide signal isolation between terminals of the package, particularly for the above-noted command address bus signals received at the first terminals of the package, and one or more of the microelectronic elements in the package. The one or more buffer elements regenerate signals received at the first terminals, or received at the second terminals, and transfers the regenerated signals to one or more of the microelectronic elements in the package.

Alternatively or in addition thereto, the area of the substrate 1702 between the adjacent edges 1710, 1730 of the microelectronic elements may permit one or more decoupling capacitors to be provided on or in the package which are connected to internal power supply or ground buses of the package.

Figure 28:
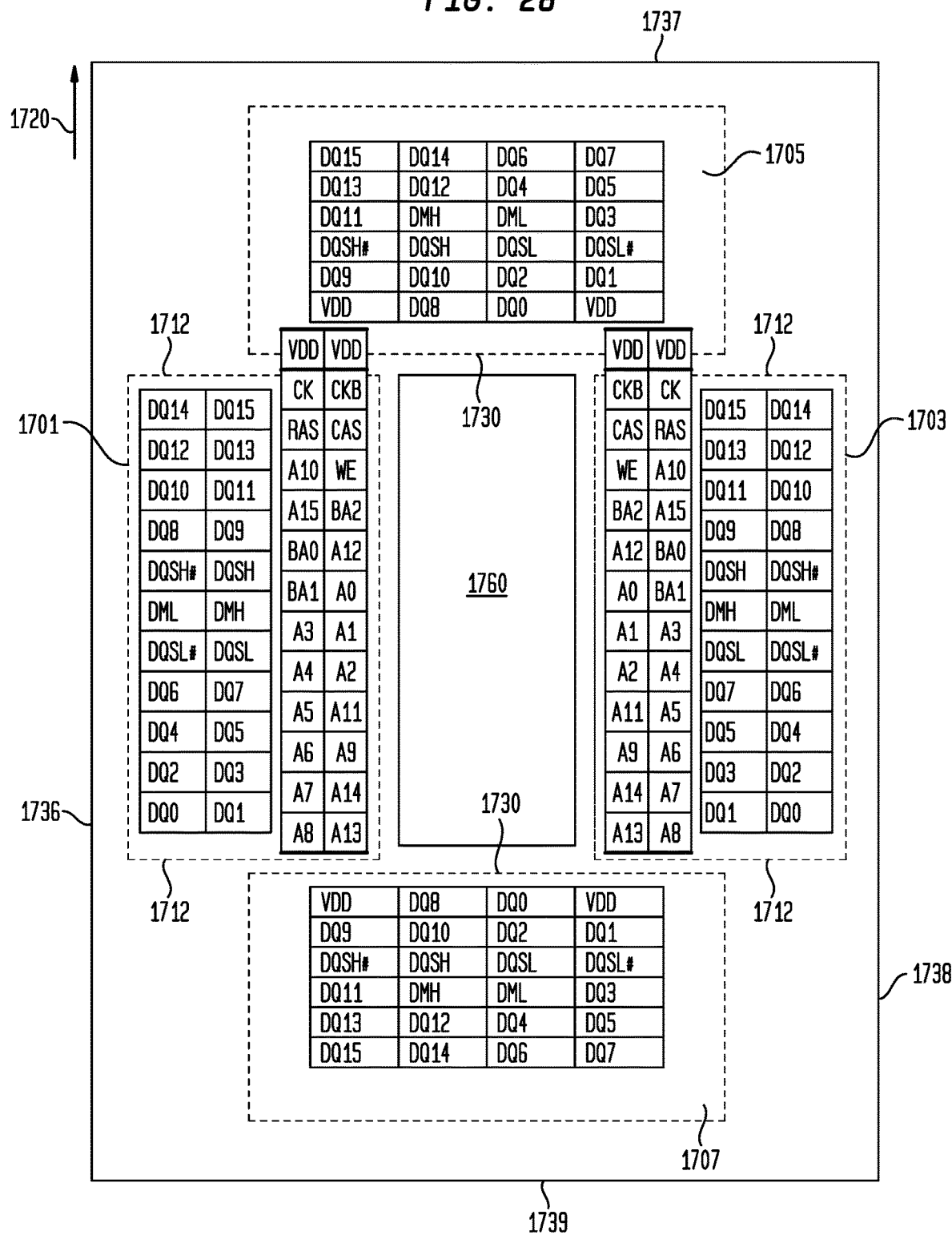
FIG. 28 is a plan view illustrating a microelectronic package according to an embodiment of the invention.

FIG. 28 illustrates a variation of the embodiment seen in FIG. 27, in which the positions of the first and second grids 1714, 1724 can be varied so as to overlie at least portions of the first and second microelectronic elements 1701, 1703. In such case, the positions of the third and fourth microelectronic elements 1705, 1707 may also change such that portions of first edges 1730 of the third and fourth microelectronic elements 1705, 1707 may be moved away from the center of the package. In this case, the first edges 1730 of the third and fourth microelectronic elements are parallel to and are spaced apart from portions of the second edges 1712 of the first and second microelectronic elements in direction 1720. As a result, an amount of area 1760 at the center of the package that is available for connection of one or more buffer elements or decoupling capacitors, or other device may be greater than that shown in FIG. 27. FIG. 28 also illustrates an arrangement in which the signal assignments of second terminals disposed within grids adjacent first and second edges 1736, 1738 of the substrate can exhibit symmetry about an axis (not shown) extending in a first direction 1720 parallel to edges 1736, 1738. Alternatively, or in addition thereto, the signal assignments of second terminals disposed within grids adjacent third and fourth edges 1737, 1739 of the substrate can exhibit symmetry about an axis (not shown) extending in a second direction transverse to the first direction 1720, e.g., which can be parallel to the third and fourth edges 1737, 1739.

Figure 29:
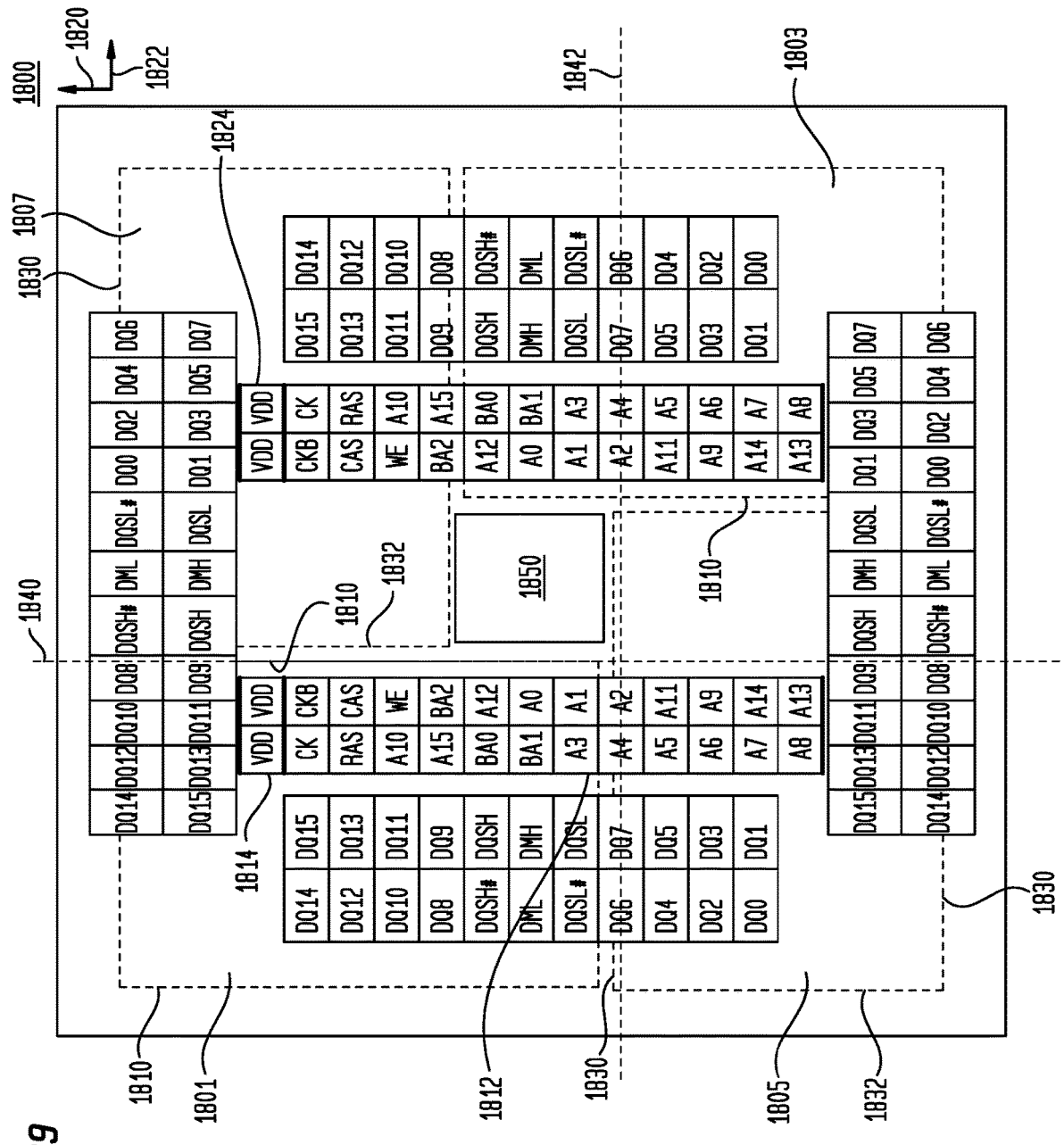
FIG. 29 is a plan view illustrating a microelectronic package according to an embodiment of the invention.

FIG. 29 illustrates a microelectronic package 1800 according to a variation of the above-described embodiment (FIG. 28). In this variation, the microelectronic elements 1801, 1803, 1805, 1807 are arranged in a pinwheel-like configuration in which the first edges 1810 of microelectronic elements 1801, 1803 extend in the same direction 1820 as the second edges 1830 of microelectronic elements 1805, 1807. In addition, the first edges 1830 of microelectronic elements 1805, 1808 extend in the same direction 1822 as the second edges 1812 of the microelectronic elements 1801, 1803. A portion of one of the first edges of microelectronic element 1801 is spaced apart from and parallel to a portion of one of the second edges 1830 of microelectronic element 1807. Similarly, a portion of the one of the first edges of microelectronic element 1805 is spaced apart from and parallel to one of the second edges of microelectronic element 1801. These relationships can be repeated within the package for a portion of one of the first edges 1810 of microelectronic element 1803 and a portion of one of the second edges 1830 of microelectronic element 1805, as well as for a portion of one of the first edges of microelectronic element 1807 and a portion of one of the second edges of microelectronic element 1803.

In addition, it is further seen that there is a plane 1840 normal to the substrate which contains one of the first edges 1810 of microelectronic element 1801, and which intersects the first edge 1830 of another microelectronic element 1805. Similarly, there is a plane 1842 normal to the substrate which contains one of the first edges 1830 of microelectronic element 1805, and which intersects the first edge 1810 of another microelectronic element 1803. From an inspection of FIG. 29, it can be seen that a similar plane which contains one of the first edges of microelectronic element 1807 will intersect the first edge of microelectronic element 1801 and a similar plane which contains one of the first edges of microelectronic element 1803 will intersect the first edge of microelectronic element 1807. The package can be constructed so that the planes containing a first edge of one microelectronic element intersect a first edge of at most one other microelectronic element within the package.

FIG. 29 further illustrates that the grids 1814, 1824 of first terminals having mirror image signal assignments may each partially or fully overlie one or more of the microelectronic elements in the package 1800. The signal assignments within the grids containing first terminals and the grids containing second terminals can be as described above relative to FIG. 27 or 28. In addition, a central area 1850 of the substrate which is disposed between adjacent edges 1810, 1832 of the microelectronic elements, and over which none of the faces of the microelectronic elements is disposed, may accommodate one or more buffer elements or decoupling capacitors or both as described above relative to FIGS. 27-28.

Figure 30:
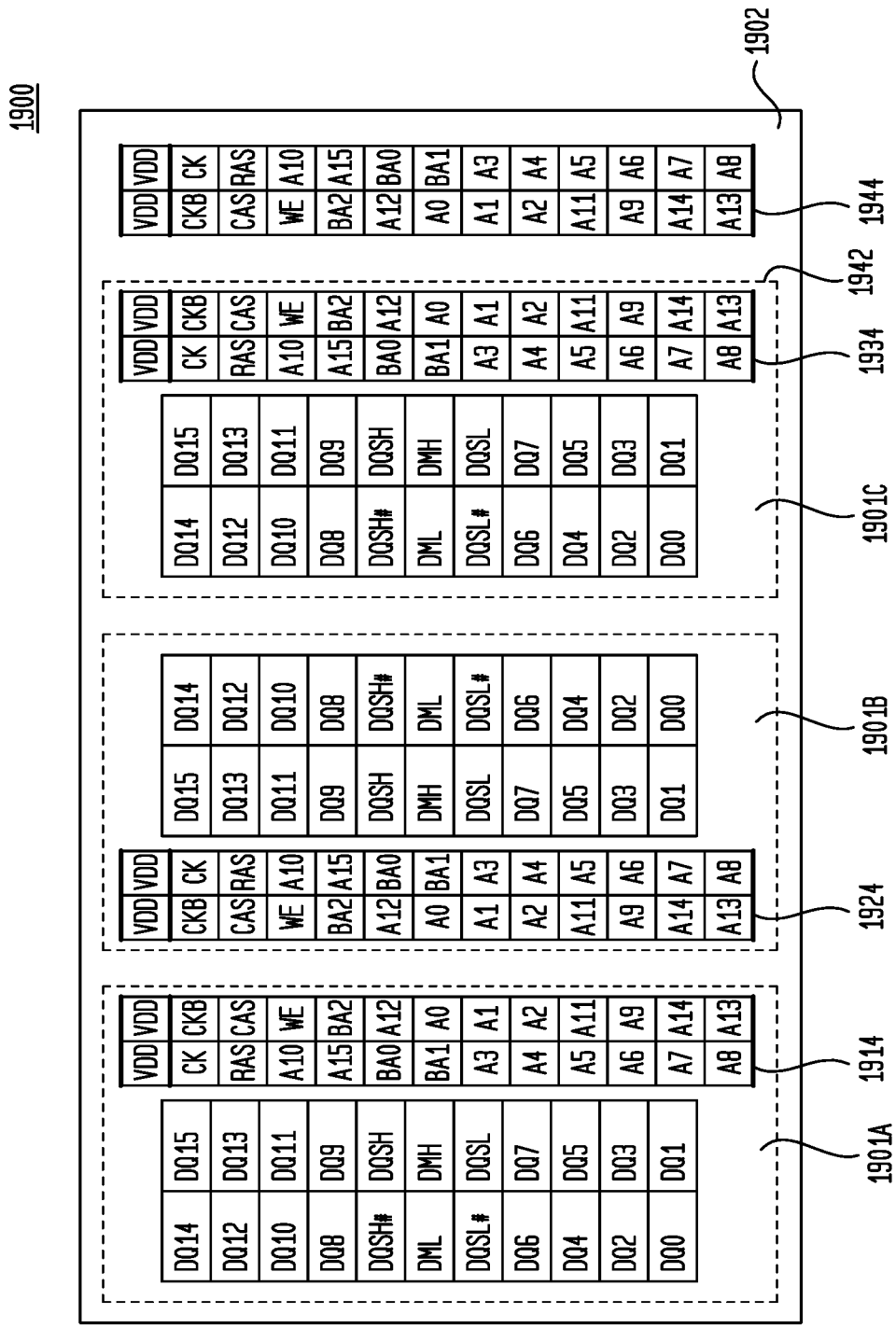
FIG. 30 is a plan view illustrating a microelectronic package according to an embodiment of the invention.

FIG. 30 illustrates a microelectronic package according to a variation of the microelectronic package 1570 described above with respect to FIG. 25 which includes three microelectronic elements 1901A, 1902B, and 1902C spaced apart from one another on the substrate 1902 instead of four microelectronic elements. As the case with the first and second grids 1514, 1524, and the third and fourth grids 1534, 1544 in the embodiment seen in FIG. 25, the signal assignments of the first terminals in the first grid 1914 of the package 1900 can be a mirror image of the signal assignments of the first terminals in the second grid 1924. Moreover, the same can also be true of the signal assignments of the first terminals in a third grid 1934 of the package 1900, which can be a mirror image of the signal assignments of the first terminals in a fourth grid 1944. In addition, as seen in FIG. 30, in a particular example, the first grid 1914 may overlie the first microelectronic element 1901A, while the second grid 1924 may overlie the second microelectronic element 1901B. As further seen in FIG. 30, the third grid 1934 may overlie the third microelectronic element 1901C. The fourth grid 1944 may overlie a portion of a surface of the substrate 1902 beyond an edge 1942 of the third microelectronic element 1901C, as seen in FIG. 30. Alternatively, although not shown, the fourth grid 1944 may also overlie the third microelectronic element 1901C.

Figure 31:
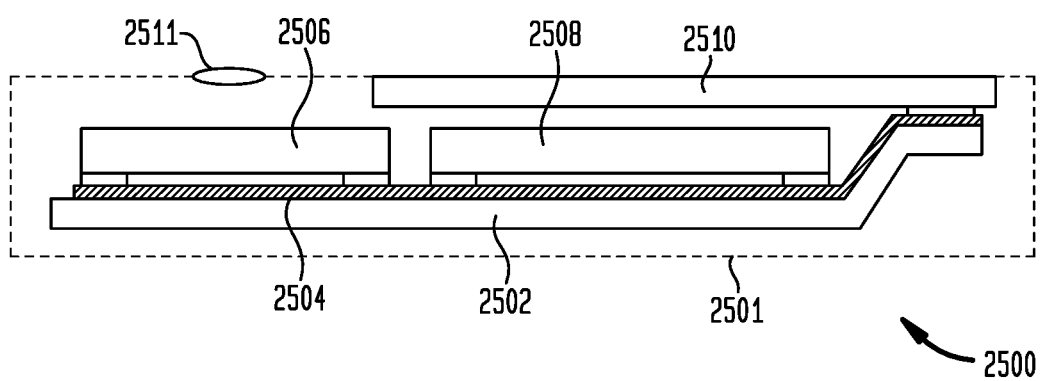
FIG. 31 is a schematic sectional view illustrating a system according to an embodiment of the invention.

The microelectronic packages and microelectronic assemblies described above with reference to FIGS. 5 through 30 above can be utilized in construction of diverse electronic systems, such as the system 2500 shown in FIG. 31. For example, the system 2500 in accordance with a further embodiment of the invention includes a plurality of modules or components 2506 such as the microelectronic packages and/or microelectronic assemblies as described above in conjunction with other electronic components 2508, 2510 and 2511.

In the exemplary system 2500 shown, the system can include a circuit panel, motherboard, or riser panel 2502 such as a flexible printed circuit board, and the circuit panel can include numerous conductors 2504, of which only one is depicted in FIG. 31, interconnecting the modules or components 2506, 2508, 2510 with one another. Such a circuit panel 2502 can transport signals to and from each of the microelectronic packages and/or microelectronic assemblies included in the system 2500. However, this is merely exemplary; any suitable structure for making electrical connections between the modules or components 2506 can be used. Thus, in a particular embodiment, a riser panel 2502 can provide electrical interconnection with a plurality of modules or microelectronic assemblies each of which includes at least one microelectronic package and a circuit panel.

In a particular embodiment, the system 2500 can also include a processor such as the semiconductor chip 2508, such that each module or component 2506 can be configured to transfer a number N of data bits in parallel in a clock cycle, and the processor can be configured to transfer a number M of data bits in parallel in a clock cycle, M being greater than or equal to N.

In one example, the system 2500 can include a processor chip 2508 that is configured to transfer thirty-two data bits in parallel in a clock cycle, and the system can also include four modules 2506 such as the microelectronic package 100 described with reference to FIGS. 5A-5C, each module 2506 configured to transfer eight data bits in parallel in a clock cycle (i.e., each module 2506 can include first and second microelectronic elements, each of the two microelectronic elements being configured to transfer four data bits in parallel in a clock cycle).

In another example, the system 2500 can include a processor chip 2508 that is configured to transfer sixty-four data bits in parallel in a clock cycle, and the system can also include four modules 2506 such as the microelectronic package described with reference to any one of FIGS. 23-29, each module 2506 configured to transfer sixteen data bits in parallel in a clock cycle (i.e., each module 2506 can include four microelectronic elements, each of the four microelectronic elements being configured to transfer four data bits in parallel in a clock cycle).

In the example depicted in FIG. 31, the component 2508 is a semiconductor chip and component 2510 is a display screen, but any other components can be used in the system 2500. Of course, although only two additional components 2508 and 2511 are depicted in FIG. 31 for clarity of illustration, the system 2500 can include any number of such components.

Modules or components 2506 and components 2508 and 2511 can be mounted in a common housing 2501, schematically depicted in broken lines, and can be electrically interconnected with one another as necessary to form the desired circuit. The housing 2501 is depicted as a portable housing of the type usable, for example, in a cellular telephone or personal digital assistant, and screen 2510 can be exposed at the surface of the housing. In embodiments where a structure 2506 includes a light-sensitive element such as an imaging chip, a lens 2511 or other optical device also can be provided for routing light to the structure. Again, the simplified system shown in FIG. 31 is merely exemplary; other systems, including systems commonly regarded as fixed structures, such as desktop computers, routers and the like can be made using the structures discussed above.

Various features of the above-described embodiments of the invention can be combined in ways other than as specifically described above without departing from the scope or spirit of the invention. It is intended for the present disclosure to cover all such combinations and variations of embodiments of the invention described above.

The invention claimed is:

1. A microelectronic package, comprising:
a substrate having first and second opposed surfaces, first and second opposed edges extending between the first and second surfaces, and a plurality of substrate contacts exposed at the first surface, the second surface having a central region containing a central axis of the microelectronic package located equidistant from the first and second edges, and first and second peripheral regions located between the central region and the respective first and second edges;
first and second microelectronic elements each having memory storage array function, each microelectronic element having a rear face facing the first surface, a front face opposite the rear face, and contacts on the front face electrically connected with the substrate contacts through conductive structure extending above the front face; and
a plurality of terminals exposed at the second surface and configured for connecting the microelectronic package with at least one component external to the microelectronic package, the terminals electrically connected with the substrate contacts and including a plurality of first terminals including a first set of the first terminals disposed in the first peripheral region and configured to carry address information and a second set of the first terminals disposed in the second peripheral region and configured to carry address information, the first set of the first terminals being symmetrically situated about the central axis with respect to the second set of the first terminals,
wherein the first set of the first terminals is electrically connected with the first microelectronic element and not electrically connected with the second microelectronic element, and the second set of the first terminals is electrically connected with the second microelectronic element and not electrically connected with the first microelectronic element.

2. The microelectronic package of claim 1, wherein the terminals further include second terminals disposed in the central region and configured to carry second information, the second information being other than the information carried by the first terminals, the second information including data signals.

3. The microelectronic package of claim 2, wherein the second terminals include a first set thereof disposed on a first side of the central axis and a second set thereof disposed on a second side of the central axis opposite from the first side, each of the first and second sets configured to carry the same data signals.

4. The microelectronic package of claim 3, wherein the signal assignments of corresponding ones of the second terminals in the first and second sets are symmetric about the central axis.

5. The microelectronic package of claim 3, wherein the second terminals of the first and second sets are disposed at positions within respective first and second grids, and columns of the second terminals in the first and second grids extend in a direction parallel to the first and second opposed edges of the substrate.

6. The microelectronic package of claim 1, wherein the first terminals are configured to carry all of the address information usable by circuitry within the microelectronic package.

7. The microelectronic package of claim 1, wherein the first set of first terminals and the second set of first terminals are each configured to carry all of the same signals.

8. The microelectronic package of claim 1, wherein the signal assignments of corresponding ones of the first terminals in the first and second sets are symmetric about the central axis.

9. The microelectronic package of claim 1, wherein the first terminals of the first and second sets are disposed at positions within respective first and second grids, and columns of the first terminals in the first and second grids extend in a direction parallel to the first and second opposed edges of the substrate.

10. The microelectronic package of claim 1, wherein each of the microelectronic elements embodies a greater number of active devices to provide memory storage array function than any other function.

11. A microelectronic assembly, comprising:
a circuit panel having first and second opposed surfaces and first and second panel contacts exposed at the first and second surfaces, respectively; and
first and second microelectronic packages each having terminals mounted to the respective first and second panel contacts,
each of the first and second microelectronic packages including:
a substrate having first and second opposed surfaces, first and second opposed edges extending between the first and second surfaces, and a plurality of substrate contacts exposed at the first surface, the second surface having a central region containing a central axis located equidistant from the first and second edges, and first and second peripheral regions located between the central region and the respective first and second edges;
first and second microelectronic elements each having memory storage array function, each microelectronic element having a rear face facing the first surface, a front face opposite the rear face, and contacts on the front face electrically connected with the substrate contacts through conductive structure extending above the front face; and
the terminals exposed at the second surface and connected with the circuit panel, the terminals electrically connected with the substrate contacts and including a plurality of first terminals including a first set of the first terminals disposed in the first peripheral region and configured to carry address information and a second set of the first terminals disposed in the second peripheral region and configured to carry address information, the first set of the first terminals being symmetrically situated about the central axis with respect to the second set of the first terminals,
wherein the first set of the first terminals is electrically connected with the first microelectronic element and not electrically connected with the second microelectronic element within the respective microelectronic package, and the second set of the first terminals is electrically connected with the second microelectronic element and not electrically connected with the first microelectronic element within the respective microelectronic package.

12. The microelectronic assembly of claim 11, wherein the terminals of each microelectronic package further include second terminals disposed in the respective central region and configured to carry second information, the second information being other than the information carried by the first terminals, the second information including data signals.

13. The microelectronic assembly of claim 12, wherein the second terminals of each microelectronic package include a first set thereof disposed on a first side of the respective central axis and a second set thereof disposed on a second side of the respective central axis opposite from the first side, each of the first and second sets configured to carry the same data signals.

14. The microelectronic assembly of claim 13, wherein the signal assignments of corresponding ones of the second terminals in the first and second sets of each microelectronic package are symmetric about the respective central axis.

15. The microelectronic assembly of claim 13, wherein the second terminals of the first and second sets of each microelectronic package are disposed at positions within respective first and second grids, and columns of the second terminals in the first and second grids extend in a direction parallel to the first and second opposed edges of the respective substrate.

16. The microelectronic assembly of claim 11, wherein the first terminals of each microelectronic package are configured to carry all of the address information usable by circuitry within the respective microelectronic package.

17. The microelectronic assembly of claim 11, wherein the first set of first terminals and the second set of first terminals of each microelectronic package are each configured to carry all of the same signals.

18. The microelectronic assembly of claim 11, wherein the signal assignments of corresponding ones of the first terminals in the first and second sets of each microelectronic package are symmetric about the respective central axis.

19. The microelectronic assembly of claim 11, wherein the first terminals of the first and second sets of each microelectronic package are disposed at positions within respective first and second grids, and columns of the first terminals in the first and second grids extend in a direction parallel to the first and second opposed edges of the substrate.

20. The microelectronic assembly of claim 11, wherein each of the microelectronic elements embodies a greater number of active devices to provide memory storage array function than any other function.

* * * * *